United States Patent
Chida

(10) Patent No.: US 9,941,475 B2
(45) Date of Patent: Apr. 10, 2018

(54) METHOD FOR MANUFACTURING DISPLAY DEVICE AND METHOD FOR MANUFACTURING ELECTRONIC DEVICE

(71) Applicant: Semiconductor Energy Laboratory Co., Ltd., Atsugi-shi, Kanagawa-ken (JP)

(72) Inventor: Akihiro Chida, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/213,767

(22) Filed: Jul. 19, 2016

(65) Prior Publication Data

US 2017/0033287 A1 Feb. 2, 2017

(30) Foreign Application Priority Data

Jul. 29, 2015 (JP) .................................. 2015-149188
Jun. 16, 2016 (JP) .................................. 2016-120176

(51) Int. Cl.
*H01L 51/00* (2006.01)
*H01L 51/56* (2006.01)
(Continued)

(52) U.S. Cl.
CPC ........ *H01L 51/003* (2013.01); *H01L 27/3276* (2013.01); *H01L 51/0097* (2013.01);
(Continued)

(58) Field of Classification Search
CPC ................................ H01L 51/00; H01L 51/56
(Continued)

(56) References Cited

U.S. PATENT DOCUMENTS 8,367,440 B2 2/2013 Takayama et al.
8,415,208 B2 4/2013 Takayama et al.
(Continued)

FOREIGN PATENT DOCUMENTS

JP 2003-174153 6/2003

*Primary Examiner* — Sheng Zhu
(74) *Attorney, Agent, or Firm* — Robinson Intellectual Property Law Office; Eric J. Robinson

(57) ABSTRACT

Provided is a method for manufacturing a highly reliable display device. The method includes steps of providing a first layer, a first insulating layer, an electrode, and a second insulating layer over a first surface of a first substrate; removing a part of the second insulating layer to provide a first opening; providing a display element and a second layer over the second insulating layer; providing a third layer and a third insulating layer over a second surface of a second substrate; removing part of the third layer and part of the third insulating layer to provide a second opening; overlapping the first substrate and the second substrate with a bonding layer positioned therebetween such that the first surface and the second surface face each other and the first opening and the second opening have an overlap region; separating the first substrate and the first layer from the first insulating layer; providing a third substrate such that the first insulating layer and the third substrate overlap with each other; separating the second substrate, part of the bonding layer, part of the second layer, and the third layer from the third insulating layer; and providing a fourth substrate such that the third insulating layer and the fourth substrate overlap with each other.

8 Claims, 40 Drawing Sheets

(51) Int. Cl.
*H01L 27/32* (2006.01)
*G02F 1/1368* (2006.01)
*G02F 1/1362* (2006.01)
*G02F 1/1343* (2006.01)

(52) U.S. Cl.
CPC ............ H01L 51/56 (2013.01); *G02F 1/1368* (2013.01); *G02F 1/134309* (2013.01); *G02F 1/136213* (2013.01); *H01L 2227/323* (2013.01); *H01L 2227/326* (2013.01); *H01L 2251/5338* (2013.01)

(58) Field of Classification Search
USPC ................. 257/40, E33.061; 438/23, 30
See application file for complete search history.

(56) References Cited

U.S. PATENT DOCUMENTS

| | | |
|---|---|---|
| 8,956,891 B2 | 2/2015 | Chida |
| 9,065,034 B2 | 6/2015 | Chida |
| 9,202,987 B2 | 12/2015 | Takayama et al. |
| 2009/0242981 A1* | 10/2009 | Fujita .................. H01L 29/0696 257/335 |
| 2010/0045919 A1* | 2/2010 | Chida .................. H01L 27/1225 349/149 |
| 2015/0263314 A1 | 9/2015 | Sakuishi et al. |
| 2016/0079283 A1 | 3/2016 | Takayama et al. |

\* cited by examiner

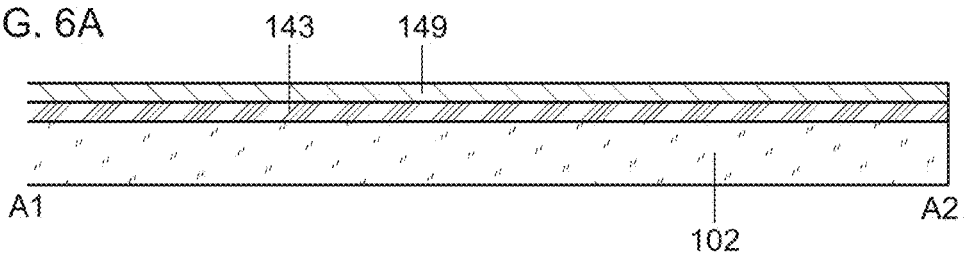
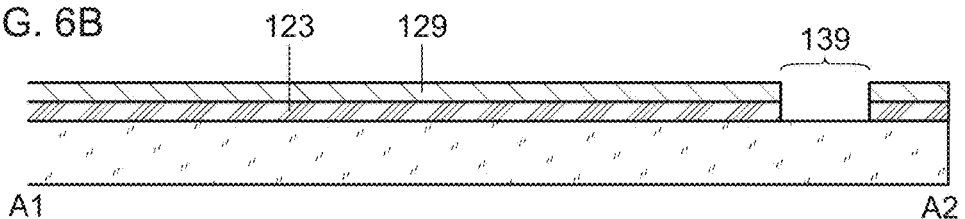
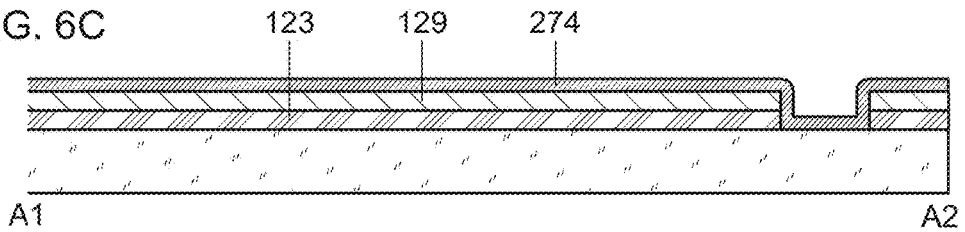
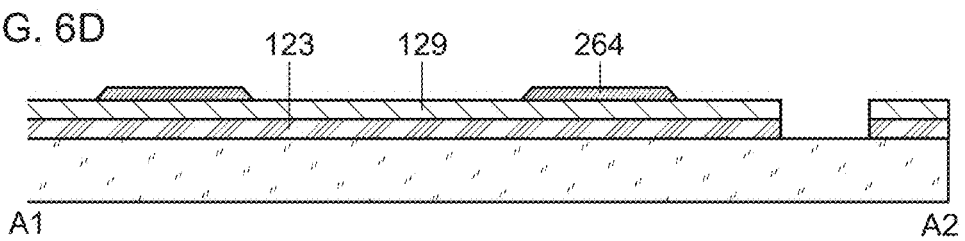
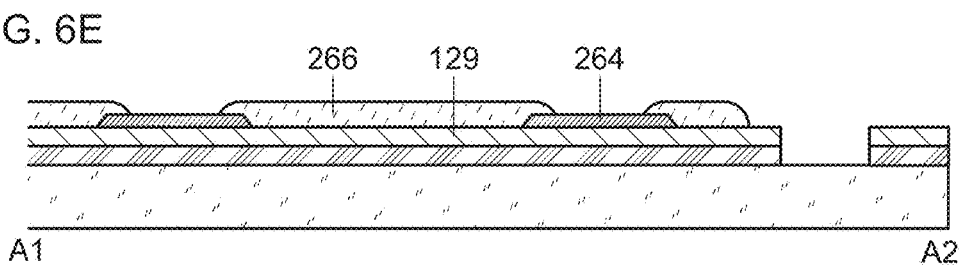
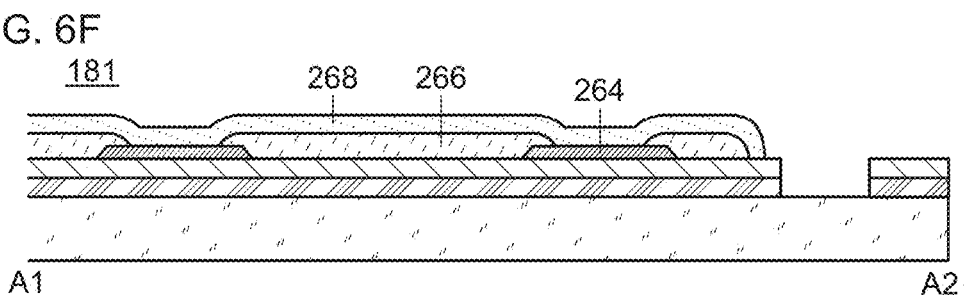

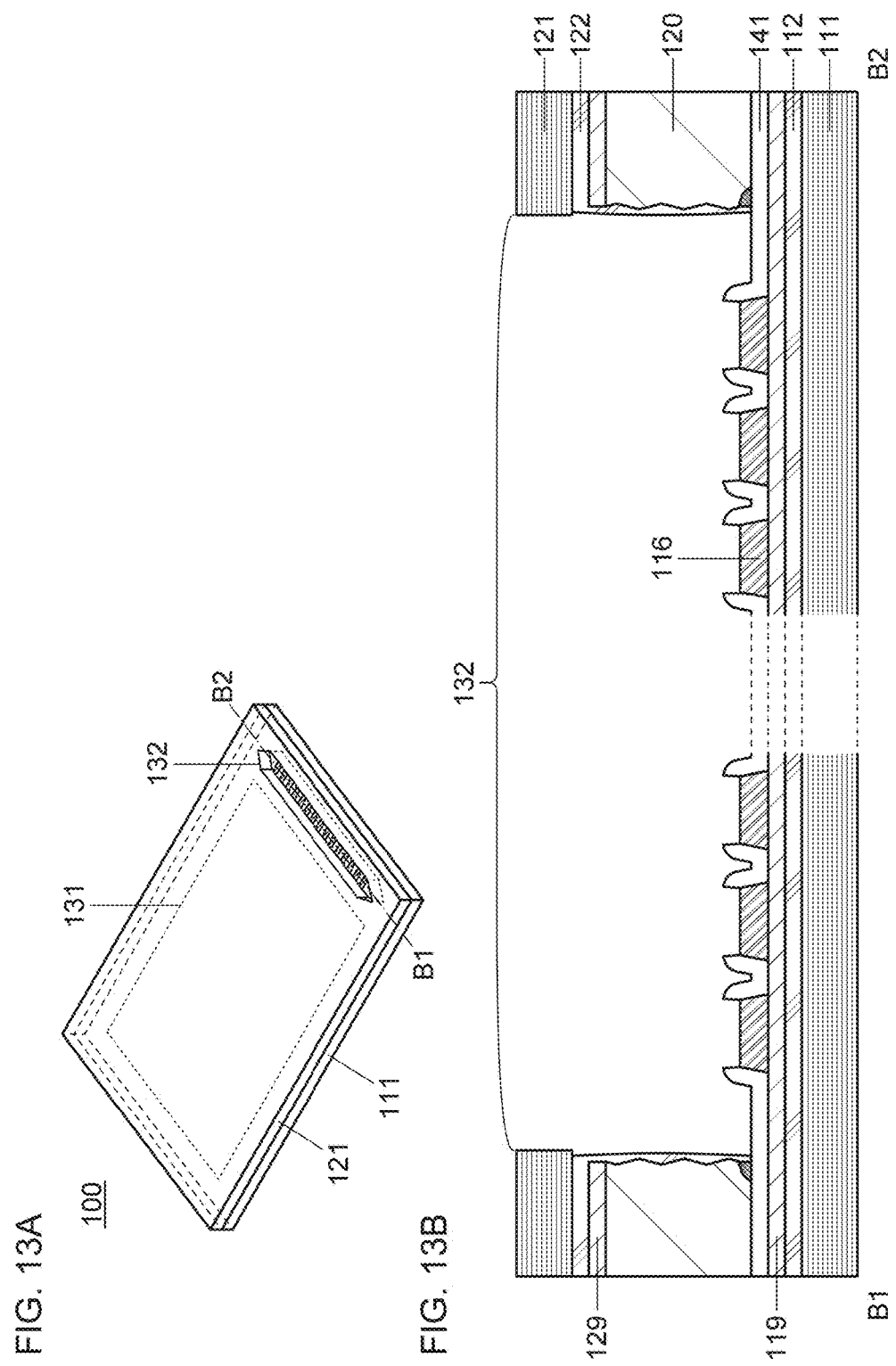

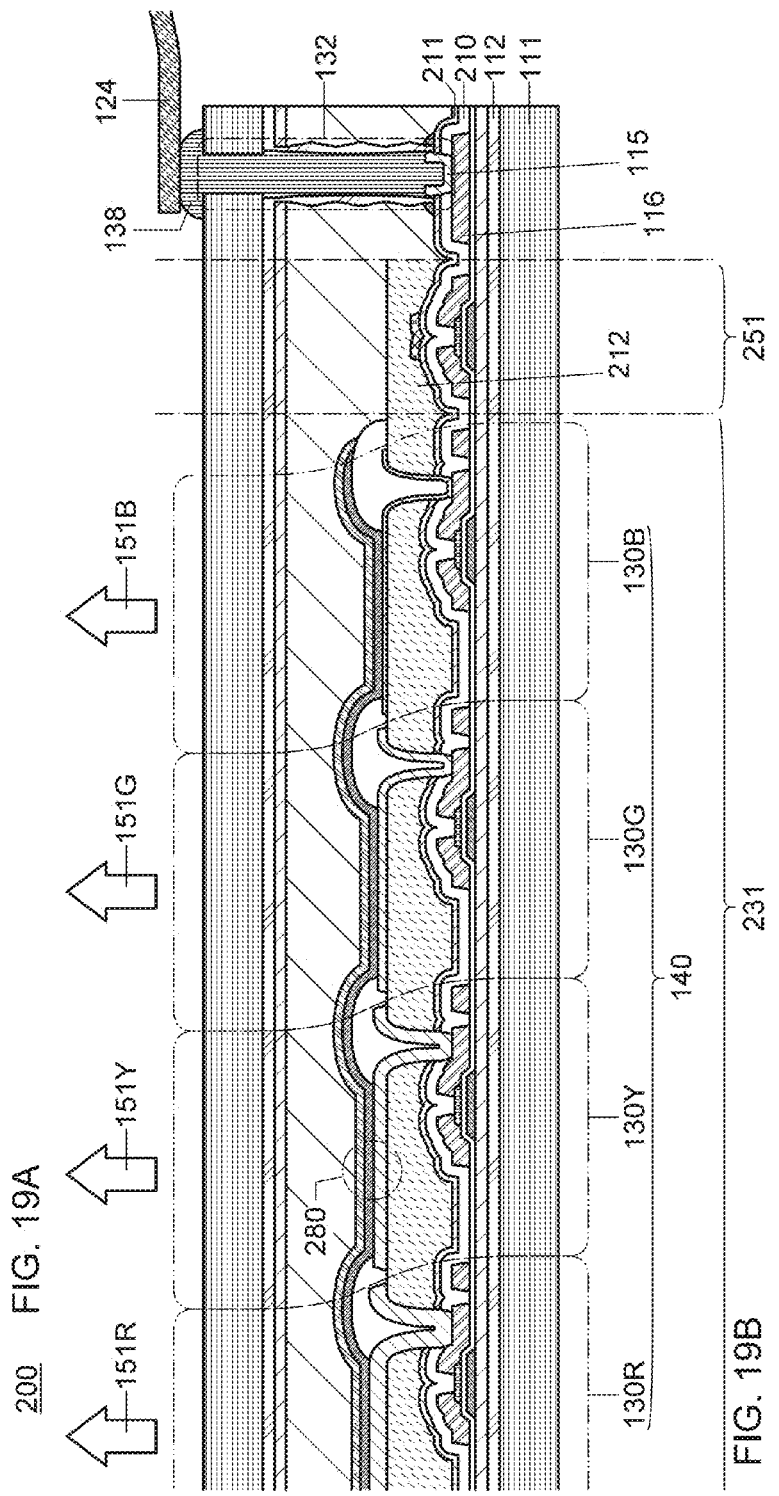

FIG. 22A1
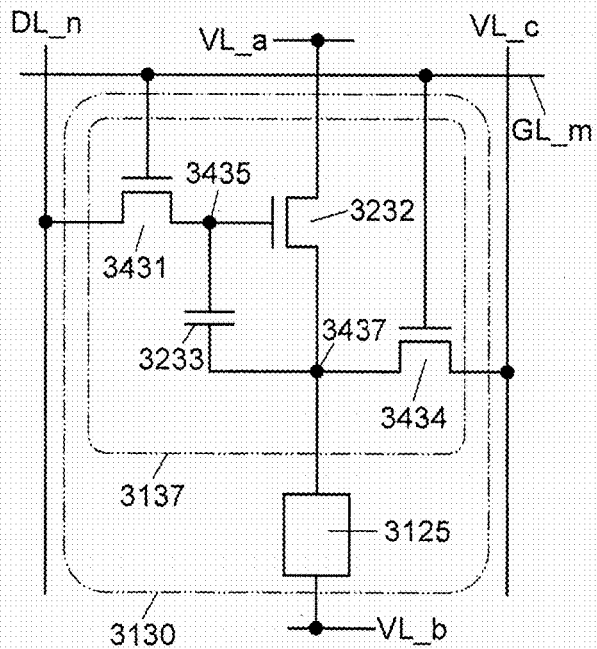
FIG. 22B1
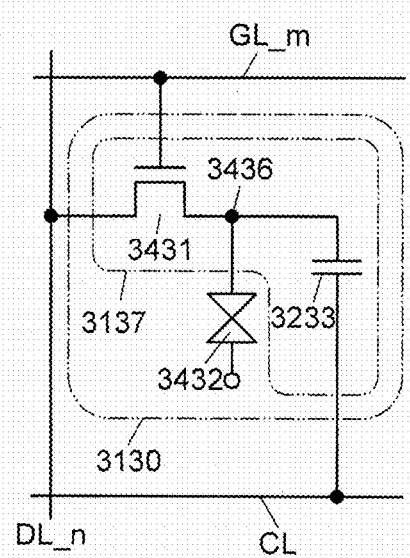
FIG. 22A2
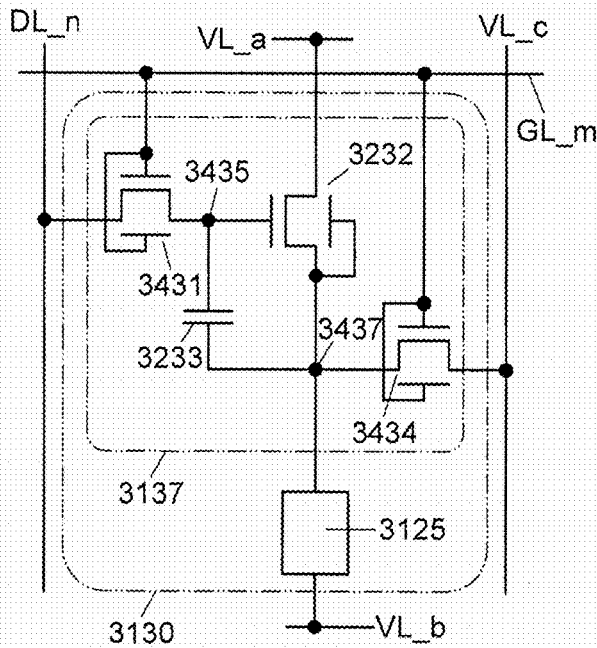
FIG. 22B2
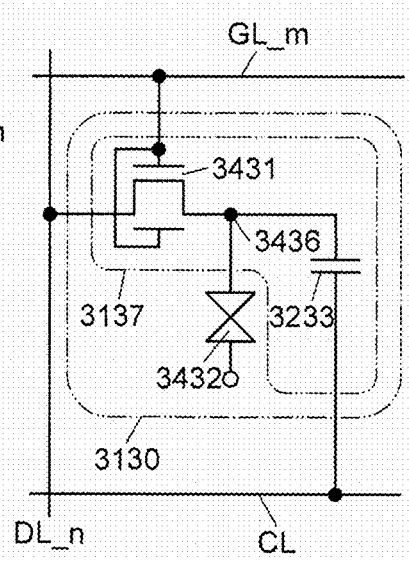

FIG. 23A1
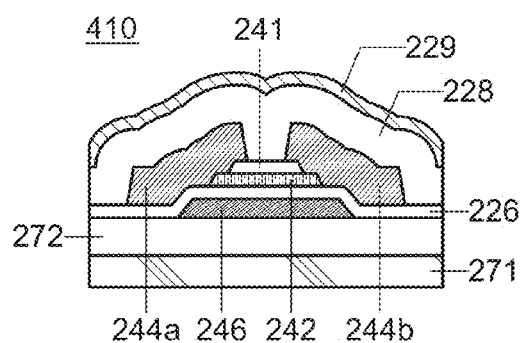
FIG. 23A2
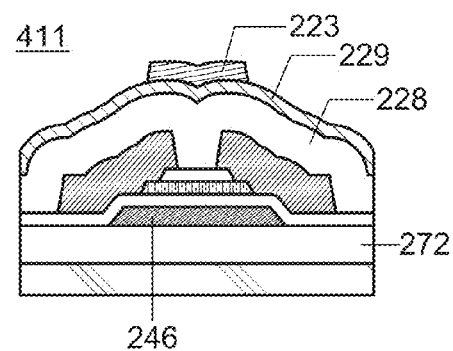
FIG. 23B1
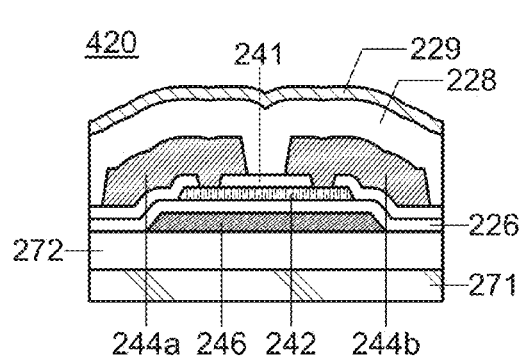
FIG. 23B2
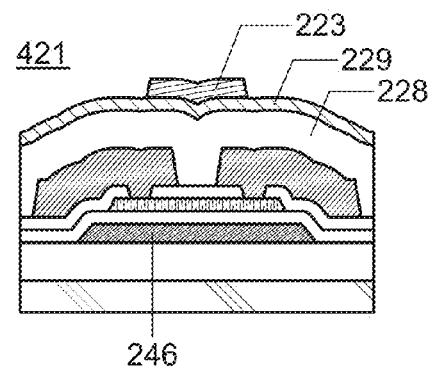
FIG. 23C1
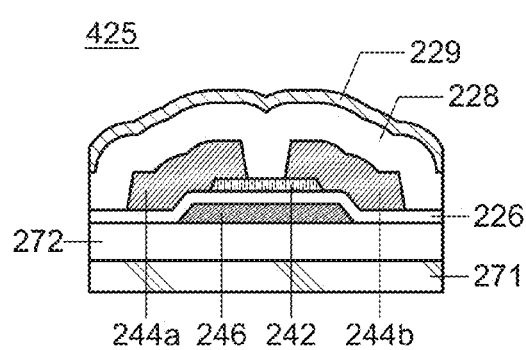
FIG. 23C2
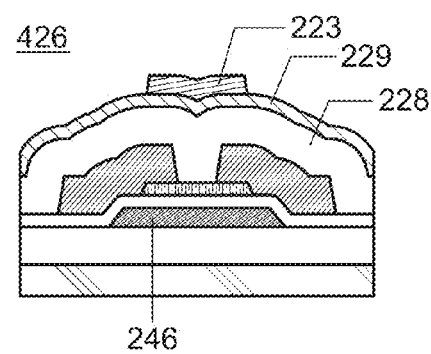

FIG. 24A1
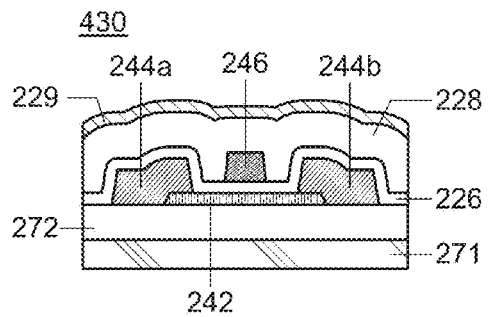
FIG. 24A2
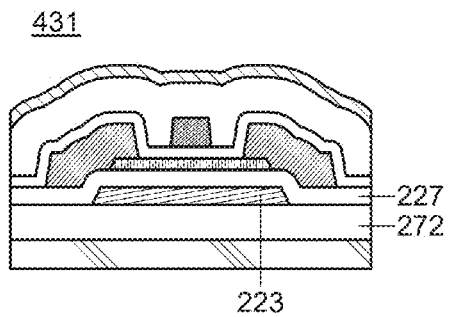
FIG. 24A3
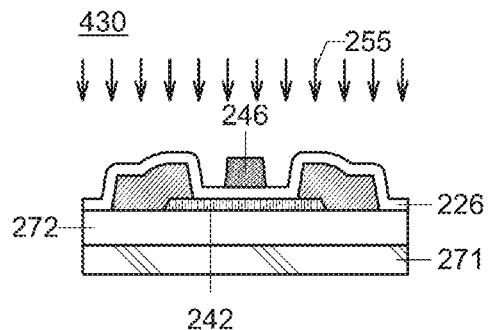
FIG. 24B1
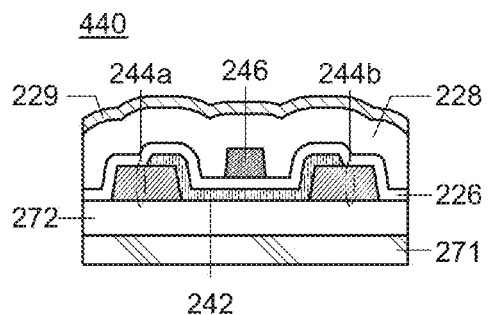
FIG. 24B2
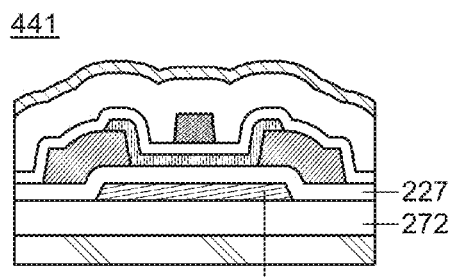

FIG. 25A1
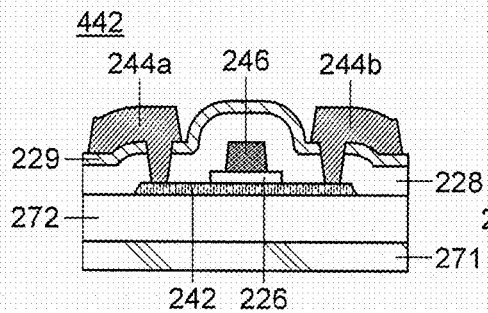
FIG. 25A2
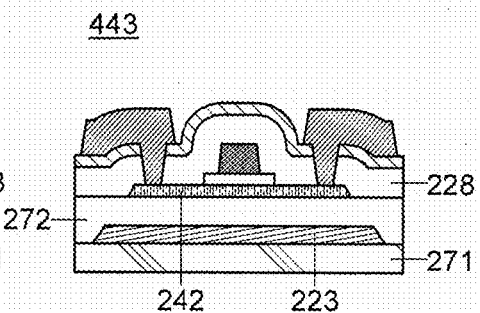
FIG. 25A3
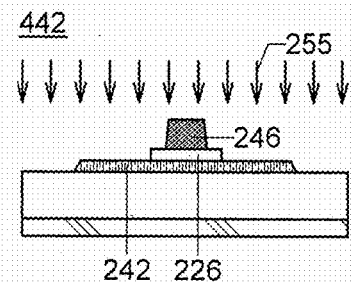
FIG. 25B1
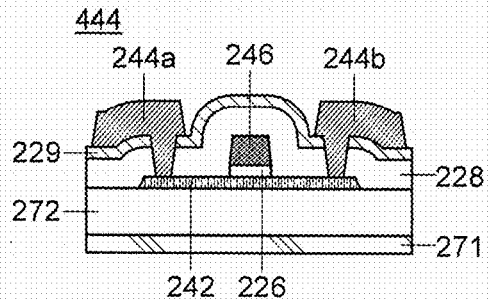
FIG. 25B2
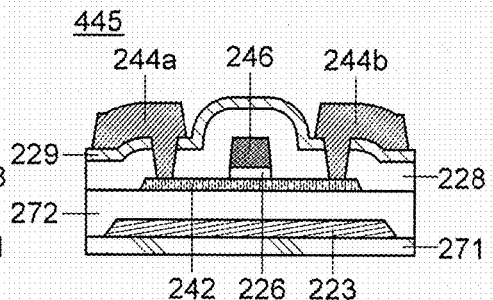
FIG. 25C1
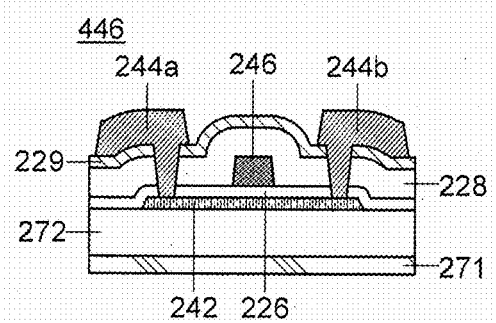
FIG. 25C2
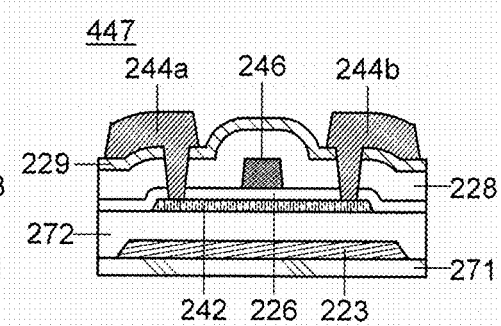

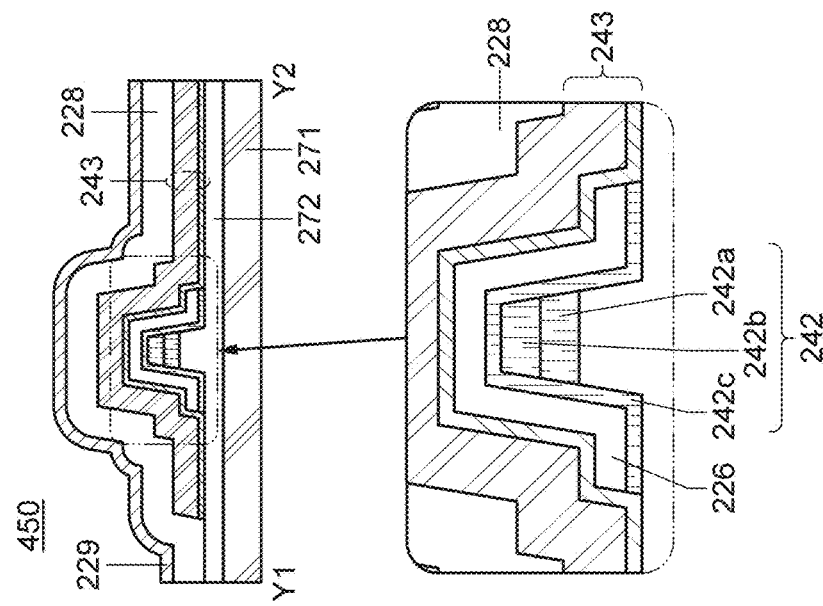
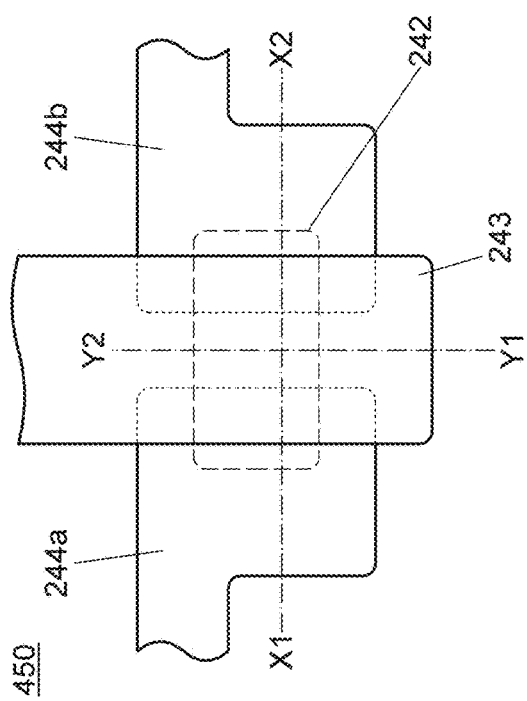
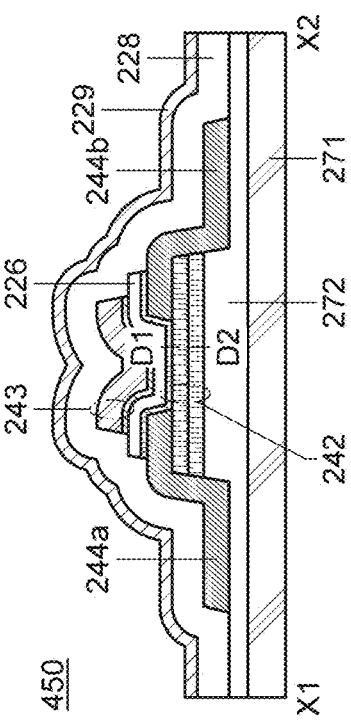

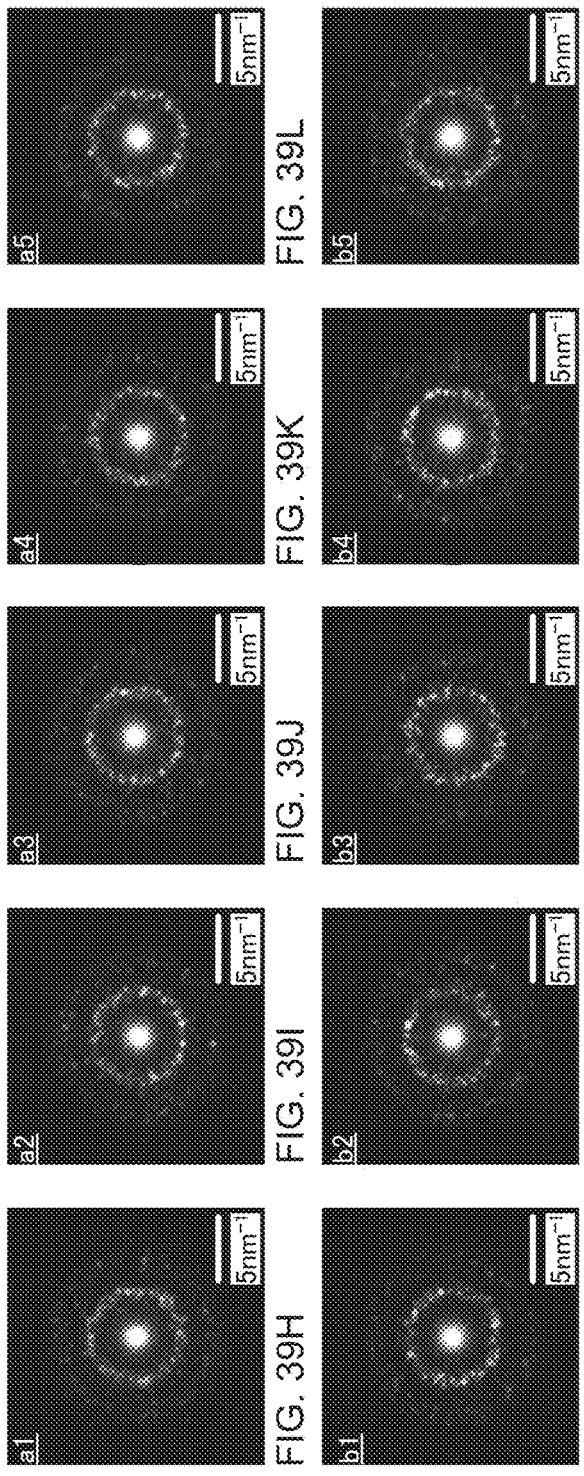

METHOD FOR MANUFACTURING DISPLAY DEVICE AND METHOD FOR MANUFACTURING ELECTRONIC DEVICE

BACKGROUND OF THE INVENTION

1. Field of the Invention

The present invention relates to a display device. The present invention also relates to a method for manufacturing the display device.

Note that one embodiment of the present invention is not limited to the above technical field.

Note that in this specification and the like, a semiconductor device generally means a device that can function by utilizing semiconductor characteristics. Thus, a semiconductor element such as a transistor or a diode and a semiconductor circuit are semiconductor devices. A display device, a light-emitting device, a lighting device, an electro-optical device, an electronic device, and the like may include a semiconductor element or a semiconductor circuit. Therefore, a display device, a light-emitting device, a lighting device, an electro-optical device, an electronic device, and the like include a semiconductor device in some cases.

2. Description of the Related Art

In recent years, research and development have been extensively conducted on liquid crystal elements as a display element used in a display region of a display device. In addition, research and development have been extensively conducted on light-emitting elements utilizing electroluminescence (EL). As a basic structure of these light-emitting elements, a layer containing a light-emitting substance is provided between a pair of electrodes. Voltage is applied to this light-emitting element to obtain light emission from the light-emitting substance.

Light-emitting elements are a self-luminous element; thus, a display device using the light-emitting elements has, in particular, advantages such as high visibility, no necessity of a backlight, and low power consumption. The display device using the light-emitting elements also has advantages in that it can be manufactured to be thin and lightweight and has high response speed.

A display device including the display elements can have flexibility; therefore, the use of a flexible substrate for the display device has been proposed.

As a method for manufacturing a display device using a flexible substrate, a technique has been developed in which an oxide layer and a metal layer are formed between a substrate and a semiconductor element, the substrate is separated by utilizing weak adhesion of an interface between the oxide layer and the metal layer, and then the semiconductor element is transferred to another substrate (e.g., a flexible substrate) (Patent Document 1).

In some cases, over a light-emitting element that has been formed over a flexible substrate, another flexible substrate is provided in order to protect a surface of the light-emitting element or prevent entry of moisture or impurities from the outside.

REFERENCE

Patent Document

[Patent Document 1] Japanese Published Patent Application No. 2003-174153

SUMMARY OF THE INVENTION

In order to supply a signal or electric power to a display device using a flexible substrate, it is necessary that part of the flexible substrate be removed by a laser beam or an edged tool to expose an electrode so that an external electrode such as a flexible printed circuit (FPC) is connected to the electrode.

However, a method in which part of a flexible substrate is removed by a laser beam or with an edged tool has a problem in that an electrode included in a display device is damaged easily and the reliability and manufacturing yield of the display device are reduced easily. In addition, a display region and an electrode need to be provided with a sufficient space therebetween in order to prevent damage to the display region due to the above-described method; for this reason, signal attenuation, electric power attenuation, or the like due to an increase in wiring resistance is caused easily.

An object of one embodiment of the present invention is to provide a method for manufacturing a display device, which does not easily damage an electrode. Another object of one embodiment of the present invention is to provide a method for manufacturing a display device with a high yield. Another object of one embodiment of the present invention is to provide a highly reliable display device and a method for manufacturing the display device.

Another object of one embodiment of the present invention is to provide a display device, electronic device, or the like having high visibility. Another object of one embodiment of the present invention is to provide a display device, electronic device, or the like having high display quality. Another object of one embodiment of the present invention is to provide a display device, electronic device, or the like having high reliability. Another object of one embodiment of the present invention is to provide a display device, electronic device, or the like that is unlikely to be broken. Another object of one embodiment of the present invention is to provide a display device, electronic device, or the like with low power consumption.

Note that the descriptions of these objects do not disturb the existence of other objects. In one embodiment of the present invention, there is no need to achieve all of these objects. Other objects will be apparent from and can be derived from the description of the specification, the drawings, the claims, and the like.

One embodiment of the present invention is a method for manufacturing a display device including a display region. The method includes first to seventh processes. The first process includes a step of providing a first layer over a first surface of a first substrate, a step of providing a first insulating layer over the first layer, a step of providing an electrode over the first insulating layer, a step of providing a second insulating layer over the electrode, a step of removing a part of the second insulating layer to provide a first opening, and a step of providing a display element and a second layer over the second insulating layer. The second process includes a step of providing a third layer over a second surface of a second substrate, a step of providing a third insulating layer over the third layer, and a step of removing a part of the third layer and a part of the third insulating layer to provide a second opening. The third process includes a step of overlapping the first substrate and the second substrate with a bonding layer positioned therebetween such that the first surface and the second surface face each other and the first opening and the second opening have an overlap region. The fourth process includes a step of separating the first substrate and the first layer from the first insulating layer. The fifth process includes a step of providing the third substrate such that the first insulating layer and the third substrate overlap with each other. The sixth process includes a step of separating the second substrate and the third layer from the third insulating layer. The seventh process includes a step of providing the fourth substrate such that the third insulating layer and the fourth substrate overlap with each other. In the first process, the electrode and the second layer are provided at least partly in contact with each other. In the second process, a top surface shape of the second opening is a polygon having a first corner portion and a second corner portion, the second opening is positioned on an inner side than the second layer when seen from the above, and the angle of each of the first corner portion and the second corner portion is larger than or equal to 30° and smaller than or equal to 150°. In the third process, the bonding layer comprises a first region overlapping with the second opening, and the second layer comprises a second region overlapping with the second opening. In the sixth process, at least a part of the first region of the bonding layer, at least a part of the second region of the second layer, and the second substrate are separated from the first substrate. In the sixth process, separation of the second substrate proceeds in the same direction as separation of at least the part of the first region of the bonding layer and at least the part of the second region of the second layer which starts at an end portion of the first corner portion and terminates at an end portion of the second corner portion. In the sixth process, at least a part of the electrode is exposed.

Another embodiment of the present invention is the above-described method for manufacturing a display device, in which in the second process, a top surface shape of the second opening is a parallelogram or hexagon having the first corner portion and the second corner portion, and in the sixth process, separation of the second substrate proceeds in a direction substantially parallel to a long side of the top surface shape of the second opening.

In any of the above-described methods for manufacturing a display device, the second layer is preferably a stacked layer of an EL layer and a conductive layer.

Another embodiment of the present invention is the above-described method for manufacturing a display device, in which each of the first substrate and the second substrate is a glass substrate, a quartz substrate, a sapphire substrate, a ceramic substrate, a metal substrate, a semiconductor substrate, or a plastic substrate Another embodiment of the present invention is the above-described method for manufacturing a display device, in which the third substrate and the fourth substrate have flexibility.

Another embodiment of the present invention is the above-described method for manufacturing a display device, in which each of the first layer and the third layer comprises tungsten, molybdenum, titanium, tantalum, niobium, nickel, cobalt, zirconium, ruthenium, rhodium, palladium, osmium, iridium, or silicon.

Another embodiment of the present invention is the above-described method for manufacturing a display device, in which the display element is a light-emitting element.

Another embodiment of the present invention is a method for manufacturing an electronic device including a display device and a battery, a touch sensor, or a housing, in which the display device is manufactured by any of the methods for manufacturing a display device.

Another embodiment of the present invention is a display device including a third substrate, a fourth substrate, an electrode, a display element, and a bonding layer. The electrode and the display element are over a first surface of the third substrate. The electrode and the display element are electrically connected to each other. The bonding layer is over the first surface. The fourth substrate is over the bonding layer. The fourth substrate and the bonding layer have a third opening. A top surface shape of the third opening is a parallelogram or hexagon having a first corner portion and a second corner portion. The angle of each of the first corner portion and the second corner portion is larger than or equal to 30° and smaller than or equal to 150°.

One embodiment of the present invention provides a method for manufacturing a display device, which does not easily damage an electrode. One embodiment of the present invention provides a high-yield method for manufacturing a display device. One embodiment of the present invention provides a highly reliable display device and a method for manufacturing the display device.

One embodiment of the present invention provides a display device, electronic device, or the like having high visibility. One embodiment of the present invention provides a display device, electronic device, or the like having high display quality. One embodiment of the present invention provides a display device, electronic device, or the like having high reliability. One embodiment of the present invention provides a display device, electronic device, or the like that is unlikely to be broken. One embodiment of the present invention provides a display device, electronic device, or the like with low power consumption.

Note that the description of these effects does not disturb the existence of other effects. One embodiment of the present invention does not necessarily have all of these effects. Other effects will be apparent from and can be derived from the description of the specification, the drawings, the claims, and the like.

BRIEF DESCRIPTION OF THE DRAWINGS

FIGS. 6A to 6F illustrate a manufacturing process of one embodiment of a display device.

FIGS. 13A and 13B are a perspective view and a cross-sectional view illustrating one embodiment of a display device.

FIGS. 19A and 19B are cross-sectional views illustrating one embodiment of a display device.

FIGS. 22A1, 22A2, 22B1, and 22B2 illustrate examples of pixel circuits.

FIGS. 23A1, 23A2, 23B1, 23B2, 23C1, and 23C2 are cross-sectional views each illustrating one embodiment of a transistor.

FIGS. 24A1, 24A2, 24A3, 24B1, and 24B2 are cross-sectional views illustrating embodiments of transistors.

FIGS. 25A1, 25A2, 25A3, 25B1, 25B2, 25C1, and 25C2 are cross-sectional views illustrating embodiments of transistors.

FIGS. 26A to 26C are a plan view and cross-sectional views illustrating one embodiment of a transistor.

FIGS. 39A and 39B are TEM images of samples and FIGS. 39C to 39L are electron diffraction patterns thereof.

DETAILED DESCRIPTION OF THE INVENTION

Figure 1A:
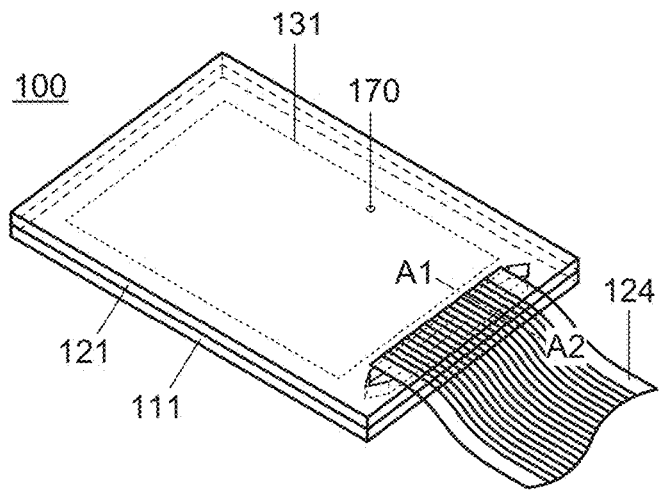
FIGS. 1A and 1B are a perspective view and a cross-sectional view illustrating one embodiment of a display device.

Embodiments will be described in detail with reference to the accompanying drawings. Note that the present invention is not limited to the description below, and it is understood easily by those skilled in the art that various changes and modifications can be made without departing from the spirit and scope of the present invention. Therefore, the present invention should not be construed as being limited to the description in the following embodiments. In the structures of the present invention to be described below, the same portions or portions having similar functions are denoted by the same reference numerals in different drawings, and explanation thereof will not be repeated.

The position, size, range, and the like of each component illustrated in the drawings and the like are not accurately represented in some cases to facilitate understanding of the invention. Therefore, the disclosed invention is not necessarily limited to the position, the size, range, and the like disclosed in the drawings and the like. For example, in the actual manufacturing process, a resist mask or the like might be unintentionally reduced in size by treatment such as etching, which might not be illustrated for easy understanding.

Especially in a top view (also referred to as a plan view), some components might not be illustrated for easy understanding.

In this specification and the like, the term such as an "electrode" or a "wiring" does not limit a function of a component. For example, an "electrode" is used as part of a "wiring" in some cases, and vice versa. Furthermore, the term "electrode" or "wiring" can also mean a combination of a plurality of "electrodes" and "wirings" formed in an integrated manner.

Note that the term "over" or "under" in this specification and the like does not necessarily mean that a component is placed "directly on" or "directly below" and "directly in contact with" another component. For example, the expression "electrode B over insulating layer A" does not necessarily mean that the electrode B is on and in direct contact with the insulating layer A and can mean the case where another component is provided between the insulating layer A and the electrode B.

Functions of a source and a drain might be switched depending on operation conditions, for example, when a transistor having opposite polarity is employed or the direction of current flow is changed in circuit operation. Thus, it is difficult to define which is a source or a drain. Accordingly, the terms "source" and "drain" can be switched in this specification.

Note that in this specification and the like, the expression "electrically connected" includes the case where components are connected through an "object having any electric function". There is no particular limitation on an "object having any electric function" as long as electric signals can be transmitted and received between components that are connected through the object. Accordingly, even when the expression "electrically connected" is used in this specification, there is a case in which no physical connection is made and a wiring is just extended in an actual circuit.

In this specification, a term "parallel" indicates that the angle formed between two straight lines is greater than or equal to −10° and less than or equal to 10°, and accordingly also includes the case where the angle is greater than or equal to −5° and less than or equal to 5°. A term "perpendicular" indicates that the angle formed between two straight lines is greater than or equal to 80° and less than or equal to 100°, and accordingly also includes the case where the angle is greater than or equal to 85° and less than or equal to 95°.

In this specification, in the case where an etching step is performed after a lithography process, a resist mask formed in the lithography process is removed after the etching step, unless otherwise specified.

A voltage usually refers to a potential difference between a given potential and a reference potential (e.g., a ground potential (a GND potential) or a source potential). A voltage can be referred to as a potential and vice versa.

Note that an impurity in a semiconductor refers to, for example, elements other than the main components of the semiconductor. For example, an element with a concentration lower than 0.1 atomic % can be regarded as an impurity. When an impurity is contained, the density of states (DOS) in a semiconductor may be increased, the carrier mobility may be decreased, or the crystallinity may be decreased, for example. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is silicon, examples of an impurity which changes characteristics of the semiconductor include oxygen, Group 1 elements except hydrogen, Group 2 elements, Group 13 elements, and Group 15 elements.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A term with an ordinal number in this specification and the like might be provided with a different ordinal number in a claim. Moreover, a term with an ordinal number in this specification and the like might not be provided with any ordinal number in a claim.

Note that in this specification, the channel length refers to, for example, a distance, observed in a top view of a transistor, between a source (a source region or a source electrode) and a drain (a drain region or a drain electrode) in a region where a semiconductor (or a portion where a current flows in a semiconductor when the transistor is on) and a gate electrode overlap with each other or a region where a channel is formed. In one transistor, channel lengths are not necessarily the same in all regions. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths are not necessarily the same in all regions. In other words, the channel width of one transistor is not limited to one value in some cases. Therefore, in this specification, a channel width is any one of values, the maximum value, the minimum value, or the average value in a region where a channel is formed.

Embodiment 1

A structure example of a display device 100 of one embodiment of the present invention will be described with reference to FIGS. 1A and 1B, FIGS. 2A and 2B, FIGS. 3A and 3B, FIGS. 4A to 4E, FIGS. 5A to 5D, FIGS. 6A to 6F, FIGS. 7A to 7C, FIGS. 8A and 8B, FIGS. 9A and 9B, FIGS. 10A and 10B, FIGS. 11A and 11B, and FIGS. 12A and 12B.

Figure 1B:
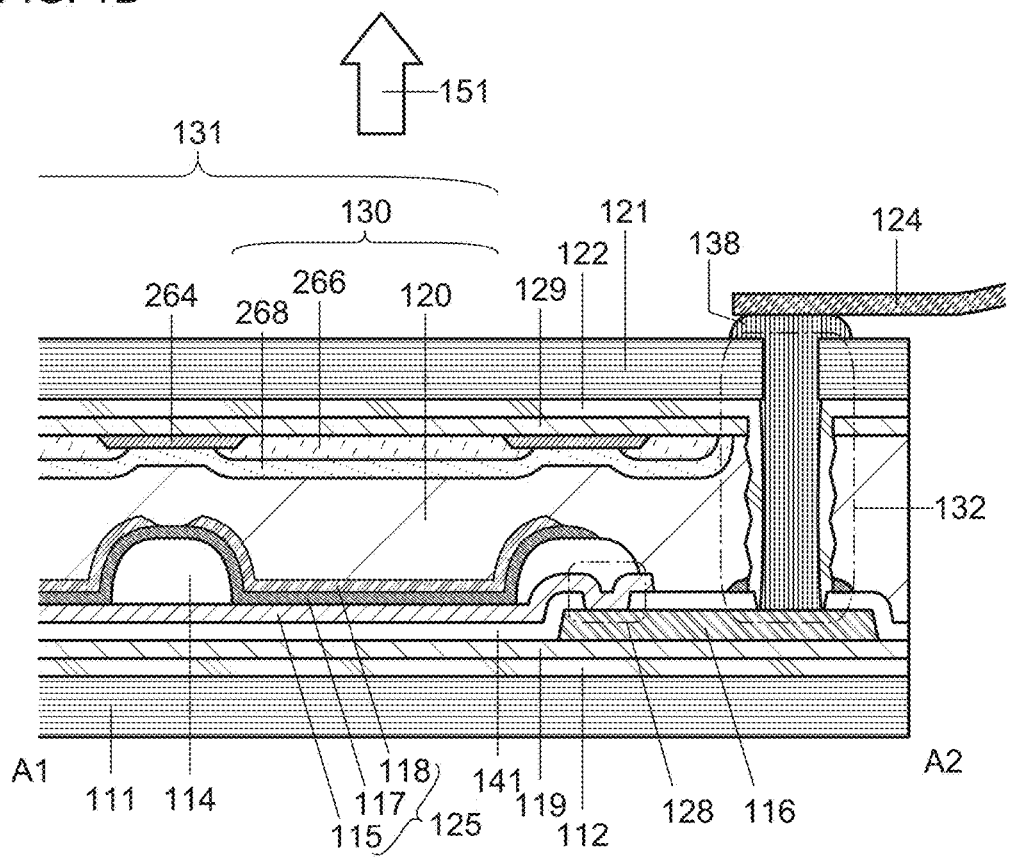

FIG. 1A is a perspective view of the display device 100 to which an external electrode 124 is connected, and FIG. 1B is a cross-sectional view taken along the dashed-dotted line A1-A2 in FIG. 1A. Note that the display device 100 disclosed in this specification is a display device in which a light-emitting element is used as a display element. As the display device 100 of one embodiment of the present invention, a display device having a top-emission structure is described as an example. Note that the display device 100 can be a display device having a bottom-emission structure or a dual-emission structure.

<Structure of Display Device>

The display device 100 described in this embodiment includes a display region 131. The display region 131 includes a plurality of pixels 130. One pixel 130 includes at least one light-emitting element 125.

The display device 100 described in this embodiment includes an electrode 115, an EL layer 117, an electrode 118, a partition 114, and an electrode 116. The display device 100 further includes an insulating layer 141 over the electrode 116, and the electrode 115 and the electrode 116 are electrically connected to each other in an opening 128 provided in the insulating layer 141. The partition 114 is provided over the electrode 115, the EL layer 117 is provided over the electrode 115 and the partition 114, and the electrode 118 is provided over the EL layer 117.

The light-emitting element 125 is provided over a substrate 111 with a bonding layer 112, an insulating layer 119, and the insulating layer 141 provided therebetween. The light-emitting element 125 includes the electrode 115, the EL layer 117, and the electrode 118.

The display device 100 described in this embodiment includes a substrate 121 provided over the electrode 118 with a bonding layer 120 provided therebetween. In addition, the substrate 121 is provided with a light-blocking layer 264, a coloring layer (also referred to as a color filter) 266, and an overcoat layer 268 with a bonding layer 122 and an insulating layer 129 provided therebetween.

Since the display device 100 described in this embodiment has a top-emission structure, light 151 emitted from the EL layer 117 is extracted from the substrate 121 side. The light 151 (e.g., white light) emitted from the EL layer 117 is partly absorbed when transmitted through the coloring layer 266 and converted into light with a specific color. In other words, the coloring layer 266 transmits light with a specific wavelength range. The coloring layer 266 can function as an optical filter layer for converting the light 151 into light of a different color.

Although the electrode 116 has a single-layer structure in this embodiment, the electrode 116 may have a stacked-layer structure of two or more layers.

Each of the substrate 121, the bonding layer 122, the insulating layer 129, the bonding layer 120, and the insulating layer 141 has an opening. The openings occupy regions which overlap with one another and each overlap with the electrode 116. In this specification and the like, these openings are collectively referred to as an opening 132. In the opening 132, the external electrode 124 and the electrode 116 are electrically connected to each other through an anisotropic conductive connection layer 138.

Figure 2A:
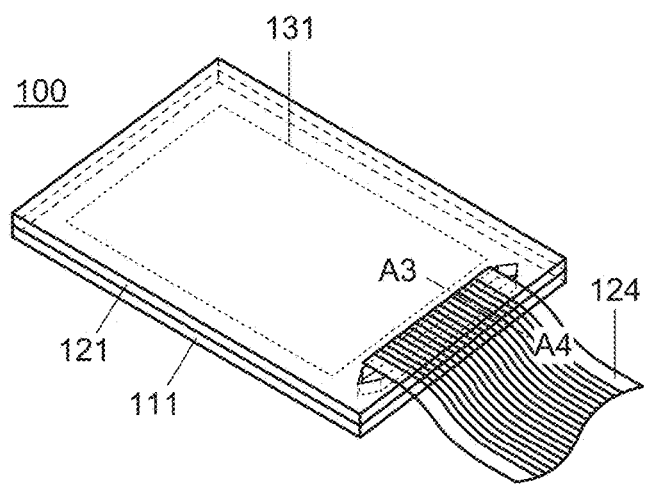
FIGS. 2A and 2B are a perspective view and a cross-sectional view illustrating one embodiment of a display device.
Figure 2B:
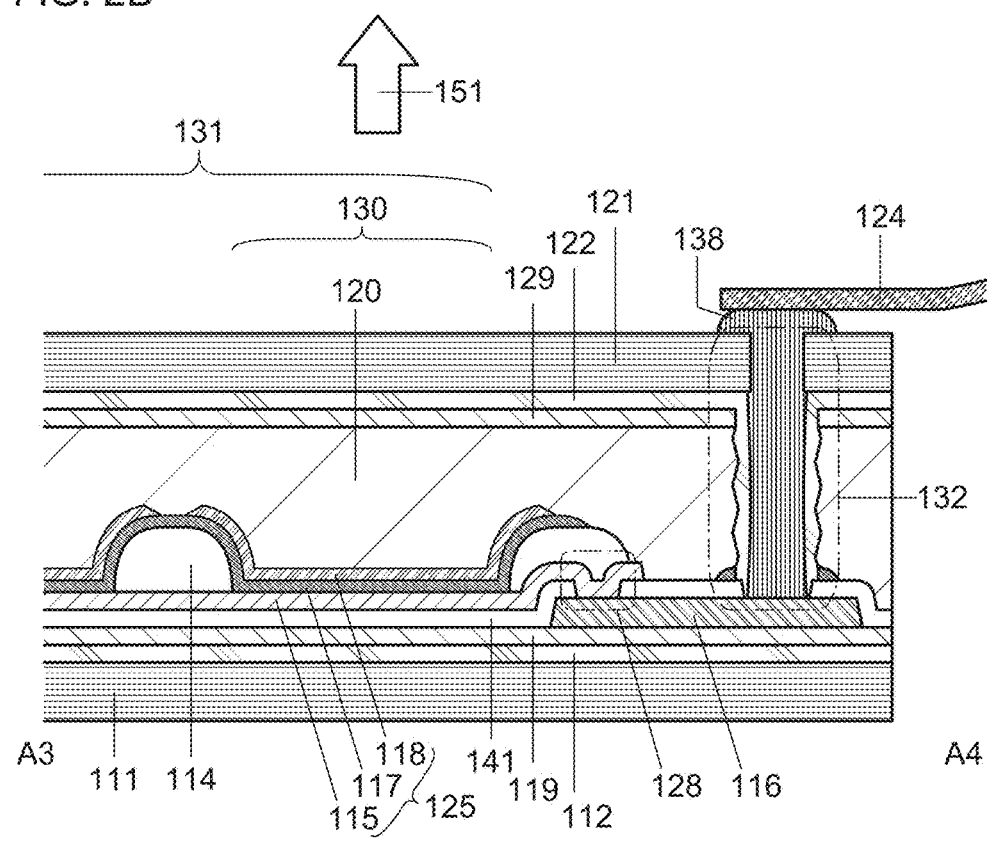

Note that as illustrated in FIGS. 2A and 2B, it is possible not to provide the light-blocking layer 264, the coloring layer 266, and the overcoat layer 268 in the display device 100. FIG. 2A is a perspective view of the display device 100 in which the light-blocking layer 264, the coloring layer 266, and the overcoat layer 268 are not provided, and FIG. 2B is a cross-sectional view taken along the dashed-dotted line A3-A4 in FIG. 2A.

In particular, in the case where the EL layer 117 is provided by what is called side-by-side patterning in which the colors of the lights 151 emitted from different pixels are different, the coloring layer 266 may be provided or is not necessarily provided.

When at least one or all of the light-blocking layer 264, the coloring layer 266, and the overcoat layer 268 are not provided, the display device 100 can achieve a reduction in manufacturing cost, yield improvement, or the like. Moreover, the light 151 can be emitted efficiently when the coloring layer 266 is not provided; therefore, luminance can be improved or power consumption can be reduced, for example.

On the other hand, when the light-blocking layer 264, the coloring layer 266, and the overcoat layer 268 are provided, reflection of external light is suppressed and thus a contrast ratio, color reproducibility, or the like can be improved.

Figure 3A:
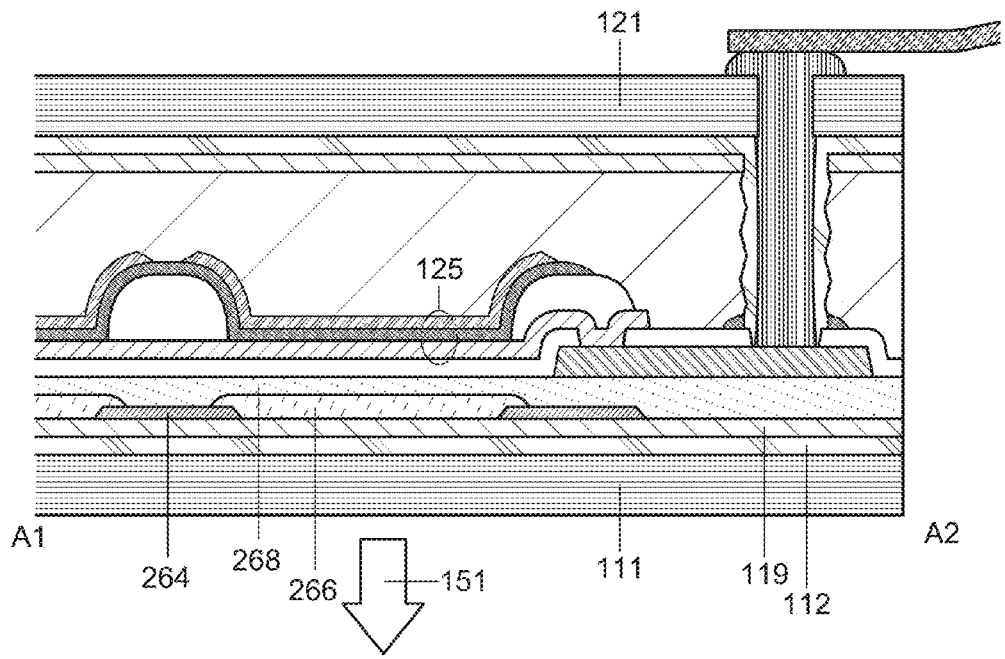
FIGS. 3A and 3B are cross-sectional views each illustrating one embodiment of a display device.
Figure 3B:
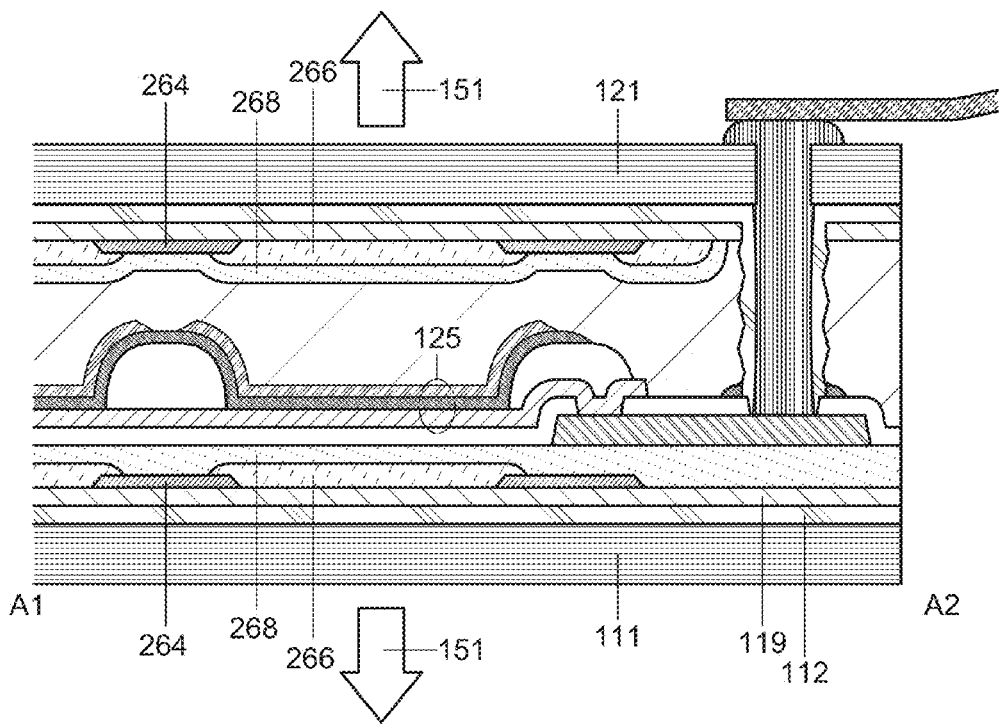

Note that in the case where the display device 100 has a bottom-emission structure, the light-blocking layer 264, the coloring layer 266, and the overcoat layer 268 may be provided on the substrate 111 side (see FIG. 3A). In the case where the display device 100 has a dual-emission structure, the light-blocking layer 264, the coloring layer 266, and the overcoat layer 268 may be provided on either or both of the substrate 111 side and the substrate 121 side (see FIG. 3B).

A switching element having a function of supplying a signal to the light-emitting element 125 may be provided between the light-emitting element 125 and the electrode 116. For example, a transistor may be provided between the light-emitting element 125 and the electrode 116.

A transistor is a kind of semiconductor element and enables amplification of current and/or voltage, switching operation for controlling conduction or non-conduction, or the like. By providing a transistor between the light-emitting element 125 and the electrode 116, an increase in the area of the display region 131 and a higher-resolution display can be achieved easily. Note that a resistor, an inductor, a capacitor, a rectifier element, or the like, without limitation to a switching element such as a transistor, can be provided in the display region 131.

[Substrates 111 and 121]

An organic resin material, a glass material that is thin enough to have flexibility, or the like can be used for the substrate 111 and the substrate 121. In the case where the display device 100 has a bottom-emission structure or a dual-emission structure, a material having a light-transmitting property with respect to light emitted from the EL layer 117 is used for the substrate 111. In the case where the display device 100 has a top-emission structure or a dual-emission structure, a material having a light-transmitting property with respect to light emitted from the EL layer 117 is used for the substrate 121.

As a material that has flexibility and transmits visible light, which can be used for the substrate 111 and the substrate 121, the following can be used: a poly(ethylene terephthalate) resin (PET), a poly(ethylene naphthalate) resin (PEN), a poly(ether sulfone) resin (PES), a polyacrylonitrile resin, an acrylic resin, a polyimide resin, a poly(methyl methacrylate) resin, a polycarbonate resin, a polyamide resin, a polycycloolefin resin, a polystyrene resin, a poly(amide imide) resin, a polypropylene resin, a polyester resin, a poly(vinyl halide) resin, an aramid resin, an epoxy resin, or the like. Alternatively, a mixture or a stack including any of these materials may be used. Note that the same material or different materials may be used for the substrate 111 and the substrate 121.

The thermal expansion coefficients of the substrate 121 and the substrate 111 are preferably less than or equal to 30 ppm/K, or further preferably less than or equal to 10 ppm/K. On surfaces of the substrate 121 and the substrate 111, a protective film having low water permeability may be formed; examples of the protective film include a film containing nitrogen and silicon such as a silicon nitride film or a silicon oxynitride film and a film containing nitrogen and aluminum such as an aluminum nitride film. Note that a structure in which a fibrous body is impregnated with an organic resin (also called prepreg) may be used as the substrate 121 and the substrate 111.

[Insulating Layer 119]

The insulating layer 119 can be formed to have a single-layer structure or a multi-layer structure using an oxide material such as aluminum oxide, magnesium oxide, silicon oxide, silicon oxynitride, gallium oxide, germanium oxide, yttrium oxide, zirconium oxide, lanthanum oxide, neodymium oxide, hafnium oxide, or tantalum oxide; a nitride material such as silicon nitride, silicon nitride oxide, aluminum nitride, or aluminum nitride oxide; or the like. The insulating layer 119 may have, for example, a two-layer structure of silicon oxide and silicon nitride or a five-layer structure in which materials selected from the above are combined. The insulating layer 119 can be formed by a sputtering method, a CVD method, a thermal oxidation method, a coating method, a printing method, or the like.

The insulating layer 119 can prevent or reduce diffusion of an impurity element from the substrate 111, the bonding layer 112, or the like to the light-emitting element 125.

Note that in this specification, a nitride oxide refers to a compound that contains more nitrogen than oxygen. An oxynitride refers to a compound that contains more oxygen than nitrogen. The content of each element can be measured by Rutherford backscattering spectrometry (RBS), for example.

[Electrode 116]

The electrode 116 can be formed using a conductive material. For example, a metal element selected from aluminum, chromium, copper, silver, gold, platinum, tantalum, nickel, titanium, molybdenum, tungsten, hafnium, vanadium, niobium, manganese, magnesium, zirconium, beryllium, and the like; an alloy containing any of the above metal elements; an alloy containing a combination of the above metal elements; or the like can be used. A semiconductor typified by polycrystalline silicon containing an impurity element such as phosphorus, or silicide such as nickel silicide may also be used. There is no particular limitation on the formation method of the conductive material, and a variety of formation methods such as an evaporation method, a CVD method, a sputtering method, and a spin coating method can be employed.

The electrode 116 can also be formed using a conductive material containing oxygen, such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Moreover, a conductive material containing nitrogen, such as titanium nitride, tantalum nitride, or tungsten nitride, can be used. It is also possible to use a stacked-layer structure formed using the above conductive material containing oxygen and a material containing the above metal element.

The electrode 116 may have a single-layer structure or a stacked-layer structure of two or more layers. For example, a single-layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, and a three-layer structure in which a titanium layer, an aluminum layer, and a titanium layer are stacked in this order are given. Alternatively, an aluminum alloy containing one or more elements selected from titanium, tantalum, tungsten, molybdenum, chromium, neodymium, and scandium may be used as the electrode 116.

[Insulating Layer 127]

The insulating layer 127 can be formed using a material and a method that are similar to those of the insulating layer 119. For the insulating layer 127, a material containing oxygen is preferably used.

[Electrode 115]

The electrode 115 is preferably formed using a conductive material that efficiently reflects light emitted from the EL layer 117 formed later. Note that the electrode 115 may have a stacked-layer structure of a plurality of layers without limitation to a single-layer structure. For example, in the case where the electrode 115 is used as an anode, a layer in contact with the EL layer 117 may be a light-transmitting layer, such as an indium tin oxide layer, and a layer having high reflectance (e.g., aluminum, an alloy containing aluminum, or silver) may be provided in contact with the layer.

The display device having a top-emission structure is described as an example in this embodiment. In the case of a display device having a bottom-emission structure or a dual-emission structure, the electrode 115 may be formed using a light-transmitting conductive material.

[Partition 114]

The partition 114 is provided in order to prevent an electrical short circuit between the adjacent electrodes 118. In the case of using a metal mask for formation of the EL layer 117 described later, the partition 114 has a function of preventing the contact of metal mask with a region where the light-emitting element 125 is formed. The partition 114 can be formed of an organic resin material such as an epoxy resin, an acrylic resin, or an imide resin or an inorganic material such as silicon oxide. The partition 114 is preferably formed so that its sidewall has a tapered shape or a tilted surface with a continuous curvature. The sidewall of the partition 114 having the above-described shape enables favorable coverage with the EL layer 117 and the electrode 118 formed later.

[EL Layer 117]

A structure of the EL layer 117 is described in Embodiment 5.

[Electrode 118]

The electrode 118 is used as a cathode in this embodiment, and thus the electrode 118 is preferably formed using a material that has a low work function and can inject electrons into the EL layer 117 described later. As well as a single-layer of a metal having a low work function, a stack in which a metal material such as aluminum, a conductive oxide material such as indium tin oxide, or a semiconductor material is formed over a several-nanometer-thick buffer layer formed of an alkali metal or an alkaline earth metal having a low work function may be used as the electrode 118. As the buffer layer, an oxide of an alkaline earth metal, a halide, a magnesium-silver, or the like can also be used.

In the case where light emitted from the EL layer 117 is extracted through the electrode 118, the electrode 118 preferably has a property of transmitting visible light.

[Bonding Layers 120, 112, and 122]

A light curable adhesive, a reaction curable adhesive, a thermosetting adhesive, or an anaerobic adhesive can be used as the bonding layer 120, the bonding layer 112, and the bonding layer 122. For example, an epoxy resin, an acrylic resin, or an imide resin can be used. A drying agent (e.g., zeolite) having a size less than or equal to the wavelength of light emitted from the EL layer 117 or a filler (e.g., titanium oxide or zirconium) with a high refractive index is preferably mixed into the bonding layer 120 in the case of a top-emission structure or into the bonding layer 112 in the case of a bottom-emission structure, in which case the light-coupling efficiency of extracting light emitted from the EL layer 117 negligibly decrease and the reliability of the display device is improved.

[Anisotropic Conductive Connection Layer 138]

The anisotropic conductive connection layer 138 can be formed using any of various kinds of anisotropic conductive films (ACF), anisotropic conductive pastes (ACP), and the like.

The anisotropic conductive connection layer 138 is formed by curing a paste-form or sheet-form material that is obtained by mixing conductive particles to a thermosetting resin or a thermosetting and light curable resin. The anisotropic conductive connection layer 138 exhibits an anisotropic conductive property by light irradiation or thermocompression bonding. As the conductive particles used for the anisotropic conductive connection layer 138, for example, particles of a spherical organic resin coated with a thin-film metal such as Au, Ni, or Co can be used.

<Method for Manufacturing Display Device>

Figure 7A:
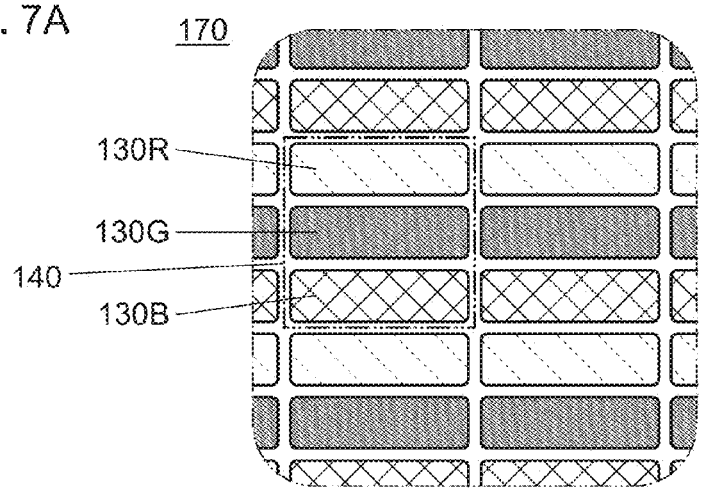
FIGS. 7A to 7C each illustrate an example of a pixel configuration of one embodiment of a display device.
Figure 7B:
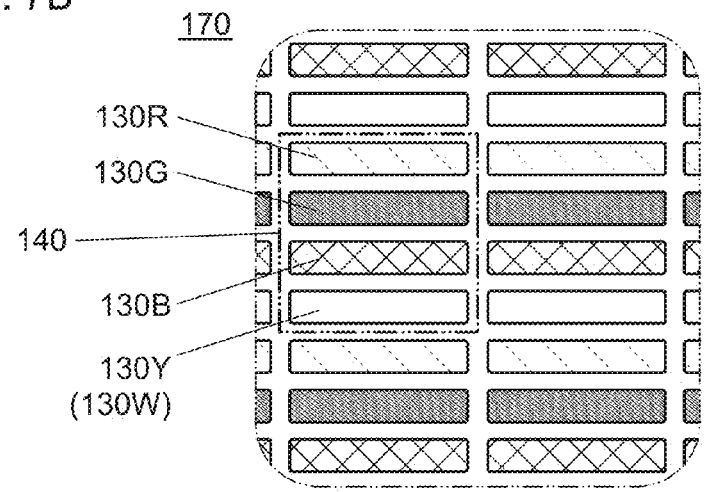
Figure 7C:
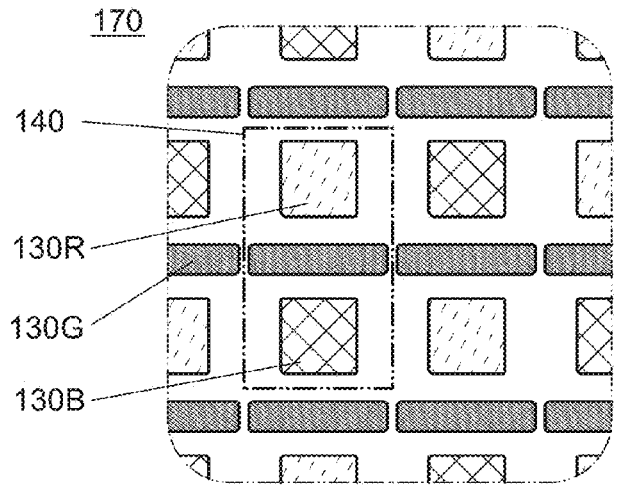

Next, a method for manufacturing the display device 100 is described with reference to FIGS. 4A to 4E, FIGS. 5A to 5D, FIGS. 6A to 6F, FIGS. 7A to 7C, FIGS. 8A and 8B, FIG. 9, FIGS. 10A and 10B, FIGS. 11A to 11D, and FIGS. 12A and 12B. FIGS. 4A to 12B other than FIGS. 7A to 7C are cross-sectional views taken along the dashed-dotted line A1-A2 in FIGS. 1A and 1B. Hereinafter, the display device 100 being manufactured is referred to as a processed member 150 in some cases.

[Formation of Separation Layer 113]

Figure 4A:
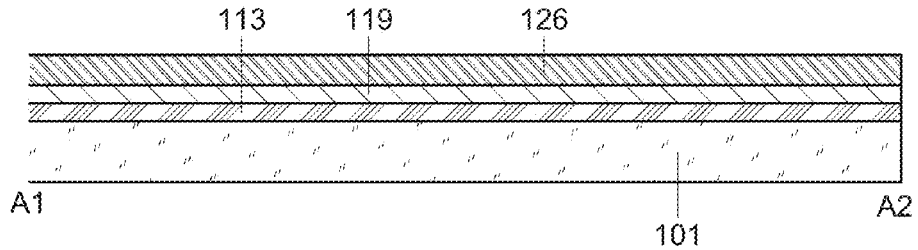
FIGS. 4A to 4E illustrate a manufacturing process of one embodiment of a display device.

First, a separation layer 113 is formed over a substrate 101 (see FIG. 4A). The substrate 101 may be exemplified by a semiconductor substrate (e.g., a single crystal substrate or a silicon substrate), an SOI substrate, a glass substrate, a quartz substrate, a sapphire substrate, a ceramic substrate, a plastic substrate which has heat resistance to the processing temperature in this embodiment, a metal substrate, a stainless steel substrate, a substrate including stainless steel foil, a tungsten substrate, and a substrate including tungsten foil. As an example of a glass substrate, a barium borosilicate glass substrate, an aluminoborosilicate glass substrate, and soda lime glass substrate can be given.

The separation layer 113 can be formed using an element selected from tungsten, molybdenum, titanium, tantalum, niobium, nickel, cobalt, zirconium, ruthenium, rhodium, palladium, osmium, iridium, and silicon; an alloy material containing any of the elements; or a compound material containing any of the elements. The separation layer 113 can also be formed to have a single-layer structure or a stacked-layer structure using any of the materials. Note that the crystalline structure of the separation layer 113 may be amorphous, microcrystalline, or polycrystalline. The separation layer 113 can also be formed using a metal oxide such as aluminum oxide, gallium oxide, zinc oxide, titanium dioxide, indium oxide, indium tin oxide, indium zinc oxide, or an oxide including indium, gallium, and zinc (In—Ga—Zn—O, IGZO).

The separation layer 113 can be formed by a sputtering method, a CVD method, a coating method, a printing method, or the like. Note that the coating method includes a spin coating method, a droplet discharge method, and a dispensing method.

In the case where the separation layer 113 has a single-layer structure, the separation layer 113 is preferably formed using tungsten, molybdenum, or a material containing tungsten and molybdenum. Alternatively, the separation layer 113 is preferably formed using an oxide or oxynitride of tungsten, an oxide or oxynitride of molybdenum, or an oxide or oxynitride of a material containing tungsten and molybdenum.

In the case where the separation layer 113 has a stacked-layer structure including, for example, a layer containing tungsten and a layer containing an oxide of tungsten, the layer containing an oxide of tungsten may be formed as follows: the layer containing tungsten is formed first and then an insulating oxide layer is formed in contact therewith, so that the layer containing an oxide of tungsten is formed at the interface between the layer containing tungsten and the insulating oxide layer. Alternatively, the layer containing an oxide of tungsten may be formed by performing thermal oxidation treatment, oxygen plasma treatment, treatment with an oxidizing solution such as ozone water, or the like on the surface of the layer containing tungsten. Moreover, an insulating layer may be provided between the substrate 101 and the separation layer 113.

In this embodiment, aluminoborosilicate glass is used for the substrate 101. As the separation layer 113, a tungsten film is formed over the substrate 101 by a sputtering method.

[Formation of Insulating Layer 119]

Next, the insulating layer 119 is formed over the separation layer 113 (see FIG. 4A). The insulating layer 119 can prevent or reduce diffusion of an impurity element from the substrate 101 or the like. After the substrate 101 is replaced with the substrate 111, the insulating layer 119 can prevent or reduce diffusion of an impurity element from the substrate 111, the bonding layer 112, or the like to the light-emitting element 125. The thickness of the insulating layer 119 is preferably greater than or equal to 30 nm and less than or equal to 2 µm, further preferably greater than or equal to 50 nm and less than or equal to 1 µm, or still further preferably greater than or equal to 50 nm and less than or equal to 500 nm. In this embodiment, the insulating layer 119 is formed by stacking a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film by a plasma CVD method from the substrate 101 side.

Note that it is preferable to expose the surface of the separation layer 113 to an atmosphere containing oxygen before the formation of the insulating layer 119.

As the gas used in the atmosphere containing oxygen, oxygen, dinitrogen monoxide, nitrogen dioxide, carbon dioxide, carbon monoxide, or the like can be used. A mixed gas of a gas containing oxygen and another gas may be used. For example, a mixed gas of a gas containing oxygen and a rare gas, for example, a mixed gas of carbon dioxide and argon may be used. Oxidizing the surface of the separation layer 113 can facilitate separation of the substrate 101 performed later.

[Formation of Electrode 116]

Next, a conductive layer 126 for forming the electrode 116 is formed over the insulating layer 119. As the conductive layer 126, a three-layer metal film in which a layer of aluminum is provided between two layers of molybdenum is formed over the insulating layer 119 by a sputtering method, for example (see FIG. 4A).

After that, a resist mask is formed over the conductive layer 126, and the conductive layer 126 is etched into a desired shape using the resist mask. In the above-described manner, the electrode 116 is formed. The resist mask can be formed by a lithography method, a printing method, an inkjet method, or the like as appropriate. Formation of the resist mask by an inkjet method needs no photomask; thus, manufacturing cost can be reduced.

The etching of the conductive layer 126 may be performed by a dry etching method, a wet etching method, or both of them. In the case where the conductive layer 126 is etched by a wet etching method, a solution obtained by mixing phosphoric acid, acetic acid, and nitric acid, a solution containing oxalic acid, a solution containing phosphoric acid, or the like can be used as an etchant. After the etching treatment, the resist mask is removed (see FIG. 4B).

Figure 4B:
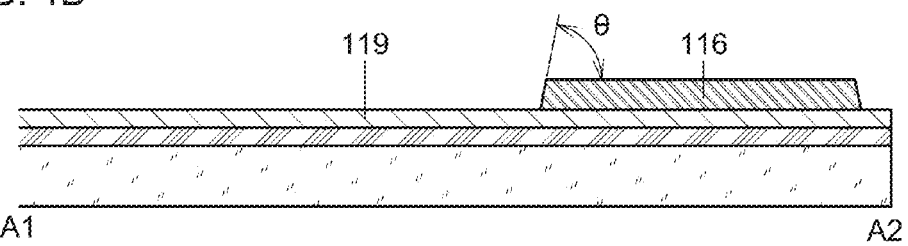

When the electrode 116 (including other electrodes and wirings formed using the same layer) has a taper-shaped end portion, the coverage with a layer that covers the side surfaces of the electrode 116 can be improved. Specifically, the end portion has a taper angle θ of 80° or less, preferably 60° or less, or further preferably 45° or less. Note that the "taper angle" refers to an inclination angle formed by a side surface and a bottom surface. The shape of an end portion having a taper angle smaller than 90° is called a forward tapered shape, and the shape of an end portion having a taper angle larger than or equal to 90° is called an inverse tapered shape. FIG. 4B illustrates the case where the end portion of the electrode 116 has a forward tapered shape.

Alternatively, the cross-sectional shape of the end portion of the electrode 116 has a plurality of steps, so that the coverage with the layer formed thereon can be improved. The above description is not limited to the electrode 116 and, when the end portion of each layer has a forward taper shape or a step-like shape in a cross section, a phenomenon that a layer formed to cover the end portion is cut (disconnection) at the end portion can be prevented, so that the coverage becomes favorable.

[Formation of Insulating Layer 127]

Figure 4C:
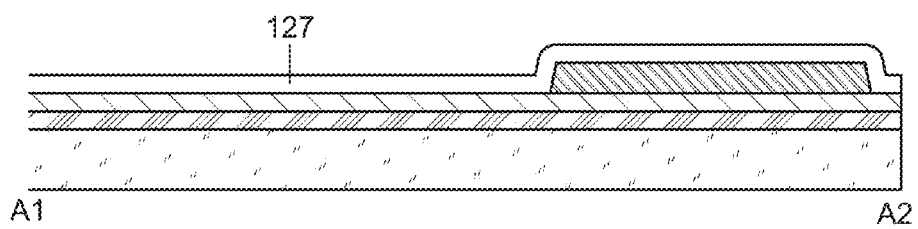

Next, an insulating layer 127 is formed over the electrode 116 (see FIG. 4C). In this embodiment, a silicon oxynitride film is formed by a plasma CVD method as the insulating layer 127.

Figure 4D:
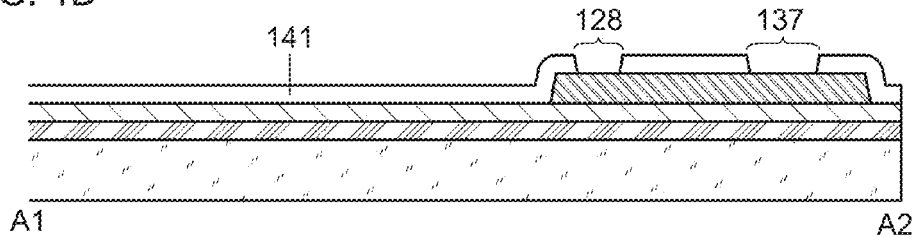

Next, a resist mask is formed over the insulating layer 127, and part of the insulating layer 127 overlapping with the electrode 116 is selectively removed using the resist mask, so that the insulating layer 141 having the opening 128 and an opening 137 is formed (see FIG. 4D). The etching of the insulating layer 127 may be performed by a dry etching method, a wet etching method, or both of them.

[Formation of Electrode 115]

Figure 4E:
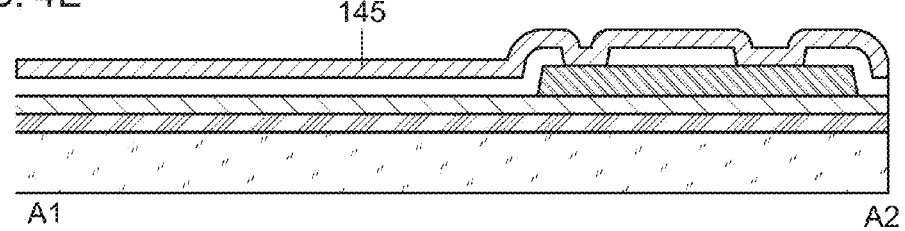

Next, a conductive layer 145 for forming the electrode 115 is formed over the insulating layer 141 (see FIG. 4E). The conductive layer 145 can be formed using a material and a method that are the same as those of the conductive layer 126 (electrode 116).

Figure 5A:
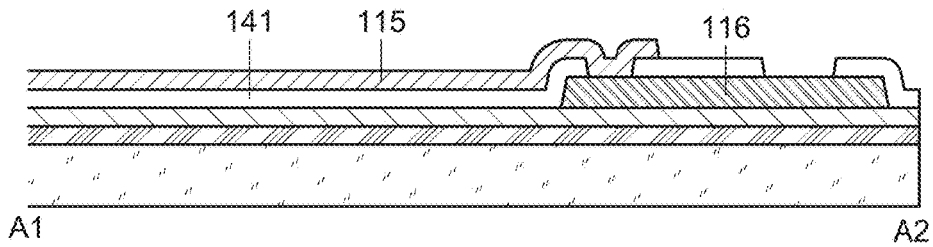
FIGS. 5A to 5D illustrate a manufacturing process of one embodiment of a display device.

Next, a resist mask is formed over the conductive layer 145, and part of the conductive layer 145 is selectively removed using the resist mask, so that the electrode 115 is formed (see FIG. 5A). The etching of the conductive layer 145 may be performed by a dry etching method, a wet etching method, or both of them. In this embodiment, the conductive layer 145 (electrode 115) is formed using a material in which indium tin oxide is stacked over silver. The electrode 115 and the electrode 116 are electrically connected to each other through the opening 128.
[Formation of Partition 114]

Figure 5B:
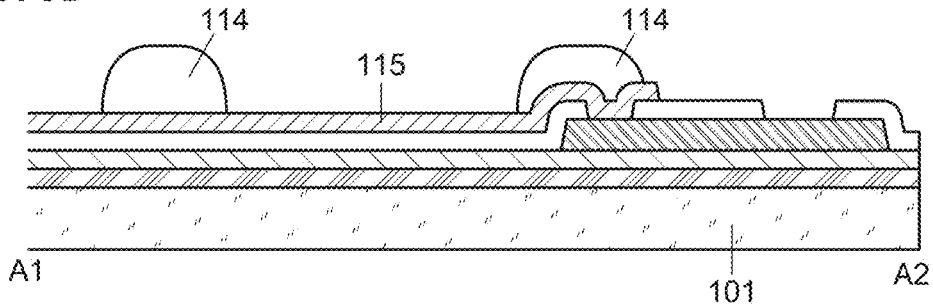

Next, the partition 114 is formed (see FIG. 5B). In this embodiment, the partition 114 is formed in such a manner that a photosensitive organic resin material is applied by a coating method and processed into a desired shape. In this embodiment, the partition 114 is formed using a photosensitive polyimide resin.
[Formation of EL Layer 117, Electrode 118, and Separation Layer 110]

In this embodiment, a separation layer 110 having a two-layer structure of a separation layer 110a formed using the same material as the EL layer 117 and a separation layer 110b formed using the same material as the electrode 118 is formed. Such a structure is preferable because the separation layer 110 can be formed without an increase in the number of manufacturing steps.

Figure 5C:
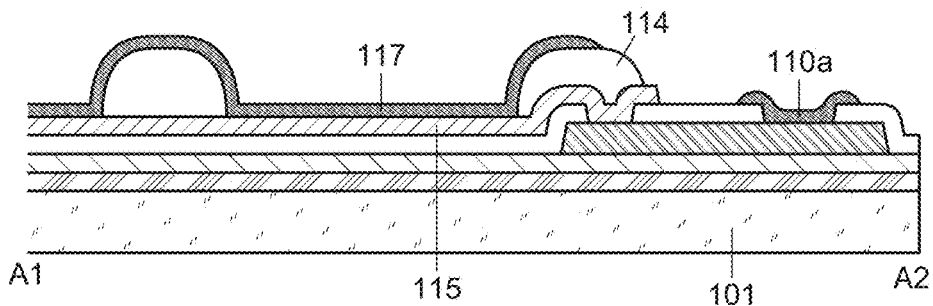
Figure 5D:
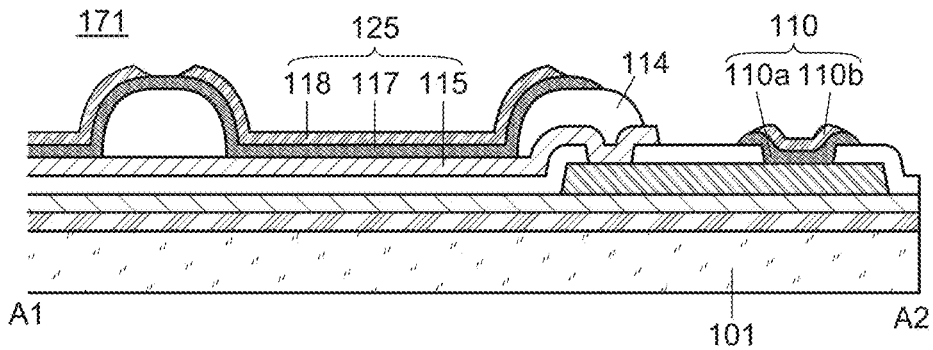

After the formation of the partition 114, the EL layer 117 is formed over the electrode 115 and the partition 114 and, at the same time, the separation layer 110a is formed in a region over the electrode 116 which overlaps with the opening 137 (see FIG. 5C).

Next, the electrode 118 is formed over the EL layer 117 and, at the same time, the separation layer 110b is formed over the separation layer 110a. In this embodiment, an alloy of magnesium and silver is used for the electrode 118 and the separation layer 110b. The electrode 118 and the separation layer 110b can be formed by an evaporation method, a sputtering method, or the like (see FIG. 5D).

Note that the separation layer 110 formed in and on the opening 137 over the electrode 116 may be formed to have a single-layer structure or a stacked-layer structure of two or more layers. In the case where the separation layer 110 has a single-layer structure, the separation layer 110 can be formed using a material having low adhesion to the electrode 116. In the case where the separation layer 110 has a stacked-layer structure, a plurality of materials can be used so that adhesion between layers in the stack is decreased.

In this embodiment, a substrate 101 over which the light-emitting element 125 is formed is referred to as an element substrate 171.

Next, a method for manufacturing a counter substrate 181 is described.
[Formation of Separation Layer 143]

First, a separation layer 143 is formed over a substrate 102 (see FIG. 6A). The substrate 102 can be formed using a material similar to that of the substrate 101. Note that the same material or different materials may be used for the substrate 101 and the substrate 102. The separation layer 143 can be formed in a manner similar to that of the separation layer 113. Moreover, an insulating layer may be provided between the substrate 102 and the separation layer 143. In this embodiment, aluminoborosilicate glass is used for the substrate 102. As the separation layer 143, a tungsten film is formed over the substrate 102 by a sputtering method.

After the formation of the separation layer 143, it is preferable to expose the surface of the separation layer 143 to an atmosphere containing oxygen or a plasma atmosphere containing oxygen, that is, it is preferable to perform plasma treatment. Oxidizing the surface of the separation layer 143 can facilitate separation of the substrate 102 performed later. The plasma treatment may be performed on the substrate 102 after the formation of the separation layer 143 instead of the plasma treatment performed on the substrate 101 after the formation of the separation layer 113.
[Formation of Insulating Layer 149]

Next, an insulating layer 149 is formed over the separation layer 143 (see FIG. 6A). The insulating layer 149 can be formed using a material and a method that are similar to those of the insulating layer 119. In this embodiment, the insulating layer 149 is formed by stacking a 200-nm-thick silicon oxynitride film, a 140-nm-thick silicon nitride oxide film, and a 100-nm-thick silicon oxynitride film by a plasma CVD method from the substrate 102 side.
[Formation of Separation Layer 123 and Insulating Layer 129]

Subsequently, a resist mask is formed over the insulating layer 149, and part of the insulating layer 149 and part of the separation layer 143 are selectively removed using the resist mask, so that a separation layer 123 and the insulating layer 129 having an opening 139 are formed. The resist mask can be formed by a lithography method, a printing method, an inkjet method, or the like as appropriate. Formation of the resist mask by an inkjet method needs no photomask; thus, manufacturing cost can be reduced.

The etching of the insulating layer 149 and the separation layer 143 may be performed by a dry etching method, a wet etching method, or both of them. After the etching treatment, the resist mask is removed (see FIG. 6B).

Note that the top surface shape of the opening 139 is preferably a polygon having a first corner portion and a second corner portion. Specifically, a parallelogram or hexagon having the first corner portion and the second corner portion is preferred (see FIGS. 11A and 11B). The angle of each of the first corner portion and the second corner portion is preferably larger than or equal to 30° and smaller than or equal to 150°.
[Formation of Light-Blocking Layer 264]

Next, a layer 274 for forming the light-blocking layer 264 is formed over the insulating layer 129 (see FIG. 6C). The layer 274 may have a single-layer structure or a stacked-layer structure including two or more layers. Examples of a material for the layer 274 are a metal material including chromium, titanium, nickel, or the like; or an oxide material including chromium, titanium, nickel, or the like.

In the case where the layer 274 is formed using the metal material or the oxide material, a resist mask is formed over the layer 274, and the layer 274 is etched into a desired shape using the resist mask, so that the light-blocking layer 264 is formed (see FIG. 6D). With a macromolecular material in which carbon black is dispersed, direct writing of the light-blocking layer 264 can be performed over the insulating layer 129 by an inkjet method.
[Formation of Coloring Layer 266]

Next, the coloring layer 266 is formed over the insulating layer 129 (see FIG. 6E). Each coloring layer 266 is formed in a desired position with any of various materials by a printing method, an inkjet method, or a photolithography method. At this time, the coloring layer 266 is preferably provided so as to partly overlap with the light-blocking layer 264. Color display can be performed by providing the coloring layers 266 of different colors in different pixels.

Here, examples of a pixel configuration for achieving color display are described with reference to FIGS. 7A to 7C. FIGS. 7A to 7C are enlarged plan views of a region 170 in the display region 131 of FIG. 1A. For example, as illustrated in FIG. 7A, three pixels 130 arranged in a stripe pattern function as subpixels and can be collectively used as one pixel 140. Full color display can be achieved in such a manner that the red, green, and blue coloring layers 266 are used so as to correspond to three pixels 130. In FIG. 7A, the pixel 130 emitting red light, the pixel 130 emitting green light, and the pixel 130 emitting blue light are illustrated as a pixel 130R, a pixel 130G, and a pixel 130B, respectively. Note that the colors of the coloring layers 266 may be a color other than red, green, and blue; for example, the coloring layer 266 may be yellow, cyan, magenta, or the like.

As illustrated in FIG. 7B, four pixels 130 may function as a subpixel and may be collectively used as one pixel 140. For example, the coloring layers 266 corresponding to the four pixels 130 may be red, green, blue, and yellow. In FIG. 7B, the pixel 130 emitting red light, the pixel 130 emitting green light, the pixel 130 emitting blue light, and the pixel 130 emitting yellow light are illustrated as a pixel 130R, a pixel 130G, a pixel 130B, and a pixel 130Y, respectively. By increasing the number of pixels 130 used as one pixel 140, the range of color reproduction can be particularly widened. Thus, the display quality of the display device can be improved.

Alternatively, in FIG. 7B, the coloring layers 266 corresponding to the four pixels 130 may be red, green, blue, and white. With the pixel 130 emitting white light (a pixel 130W), the luminance of the display region can be increased. Note that in the case of the pixel 130 emitting white light, it is not necessary to provide the coloring layer 266. Without a white coloring layer 266, there is no luminance reduction at the time of transmitting light through the coloring layer 266; thus, power consumption of the display device can be reduced. On the other hand, color temperature of white light can be controlled with the white coloring layer 266. Thus, the display quality of the display device can be improved. Depending on the intended use of the display device, the given two pixels 130 of the four pixels may be used as one pixel 140.

Note that the occupation areas or shapes of the pixels 130 may be the same or different. In addition, arrangement is not limited to stripe arrangement. For example, delta arrangement, Bayer arrangement, pentile arrangement, or the like can be used. FIG. 7C illustrates an example of three pixels 130 arranged in a pentile pattern.

[Formation of Overcoat Layer 268]

Next, the overcoat layer 268 is formed over the light-blocking layer 264 and the coloring layer 266 (see FIG. 6F).

For the overcoat layer 268, an organic insulating layer of an acrylic resin, an epoxy resin, a polyimide resin, or the like can be used. With the overcoat layer 268, an impurity or the like contained in the coloring layer 266 can be inhibited from diffusing into the light-emitting element 125 side, for example. Note that the overcoat layer 268 is not necessarily formed.

A light-transmitting conductive film may be formed as the overcoat layer 268 by which the light 151 emitted from the light-emitting element 125 can pass through the overcoat layer 268 and ionized impurities can be prevented from passing through the overcoat layer 268.

The light-transmitting conductive film can be formed using, for example, indium oxide, indium tin oxide, indium zinc oxide, zinc oxide, zinc oxide to which gallium is added. Graphene or a metal film that is thin enough to have a light-transmitting property can also be used.

In this embodiment, the substrate 102 over which the coloring layer 266 and the like are formed is referred to as the counter substrate 181. Through the above steps, the counter substrate 181 can be formed. Note that the counter substrate 181 may not be provided with the coloring layer 266 or the like.

[Attachment of Element Substrate 171 and Counter Substrate 181]

Next, the element substrate 171 and the counter substrate 181 are attached to each other with the bonding layer 120 provided therebetween. At the attachment, the light-emitting element 125 included in the element substrate 171 and the coloring layer 266 included in the counter substrate 181 are arranged so as to face each other (see FIG. 8A).

[Separation of Substrate 101]

Figure 8A:
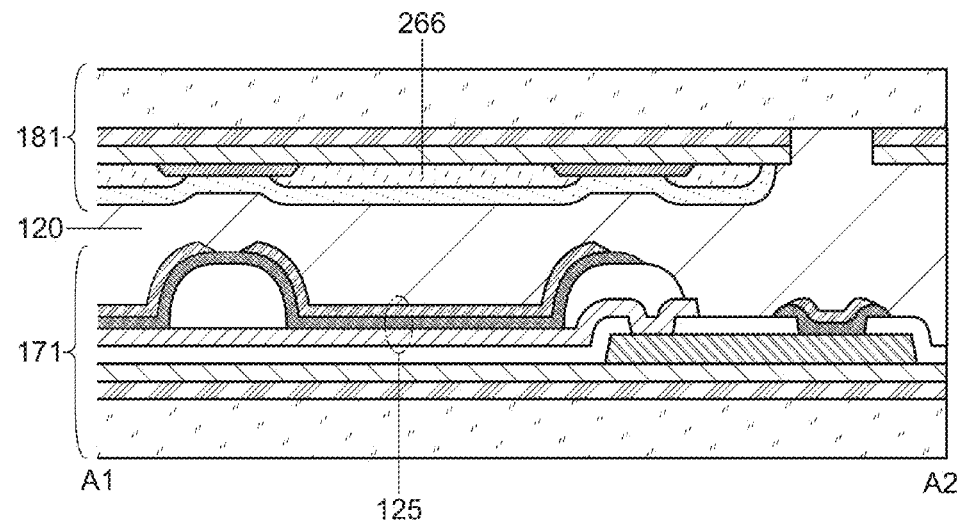
FIGS. 8A and 8B illustrate a manufacturing process of one embodiment of a display device.
Figure 8B:
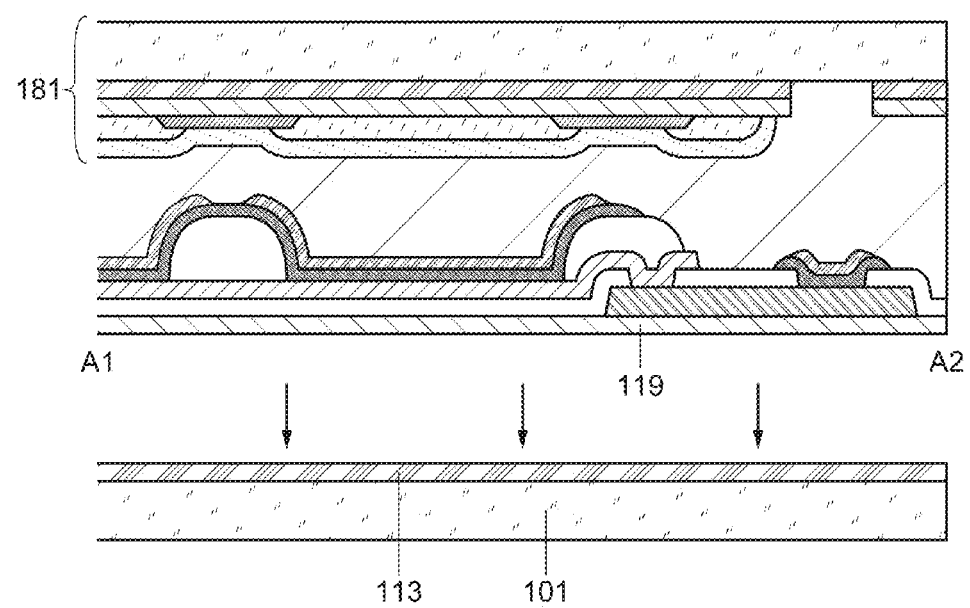

Next, the substrate 101 included in the element substrate 171 and the separation layer 113 are separated from the insulating layer 119 (see FIG. 8B). As a separating method, mechanical force (a peeling process with a human hand or a gripper, a division process by rotation of a roller, ultrasonic waves, or the like) may be used. For example, a cut is made in the interface between the separation layer 113 and the insulating layer 119 from the side surface of the element substrate 171 with a sharp edged tool, by laser beam irradiation, or the like and water is injected into the cut. The interface between the separation layer 113 and the insulating layer 119 absorbs water by capillarity action, so that the substrate 101 and the separation layer 113 can be separated easily from the insulating layer 119.

[Attachment of Substrate 111]

Figure 9:
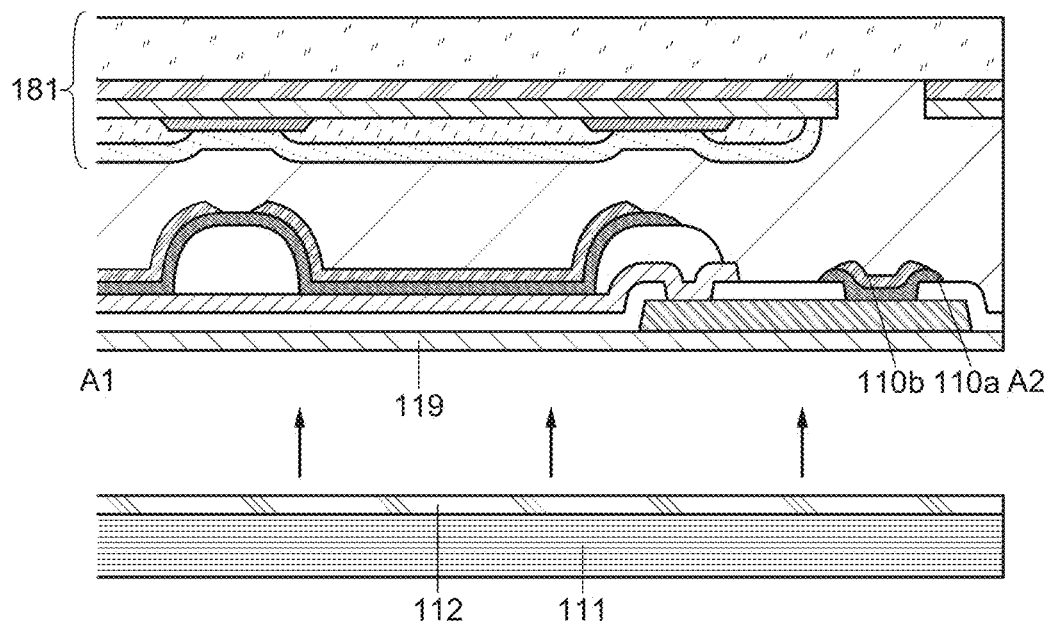
FIG. 9 illustrates a manufacturing process of one embodiment of a display device.

Next, the substrate 111 is attached to the insulating layer 119 with the bonding layer 112 provided therebetween (see FIG. 9).

[Separation of Substrate 102]

Next, the substrate 102 included in the counter substrate 181 and the separation layer 123 are separated from the insulating layer 129 (hereinafter this step is also referred to as substrate separation).

Figure 10A:
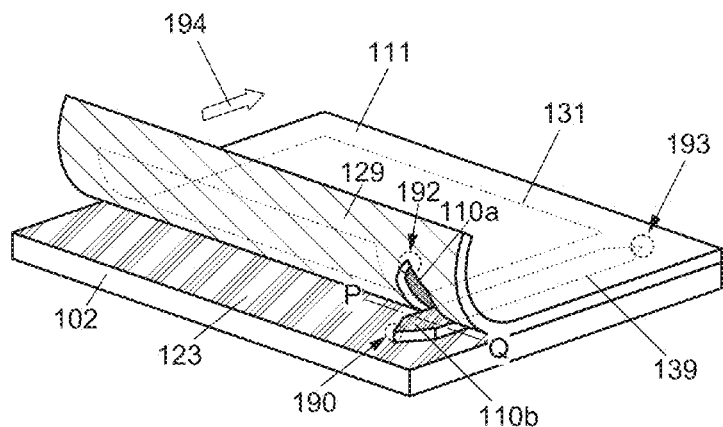
FIGS. 10A and 10B illustrate a manufacturing process of one embodiment of a display device.
Figure 10B:
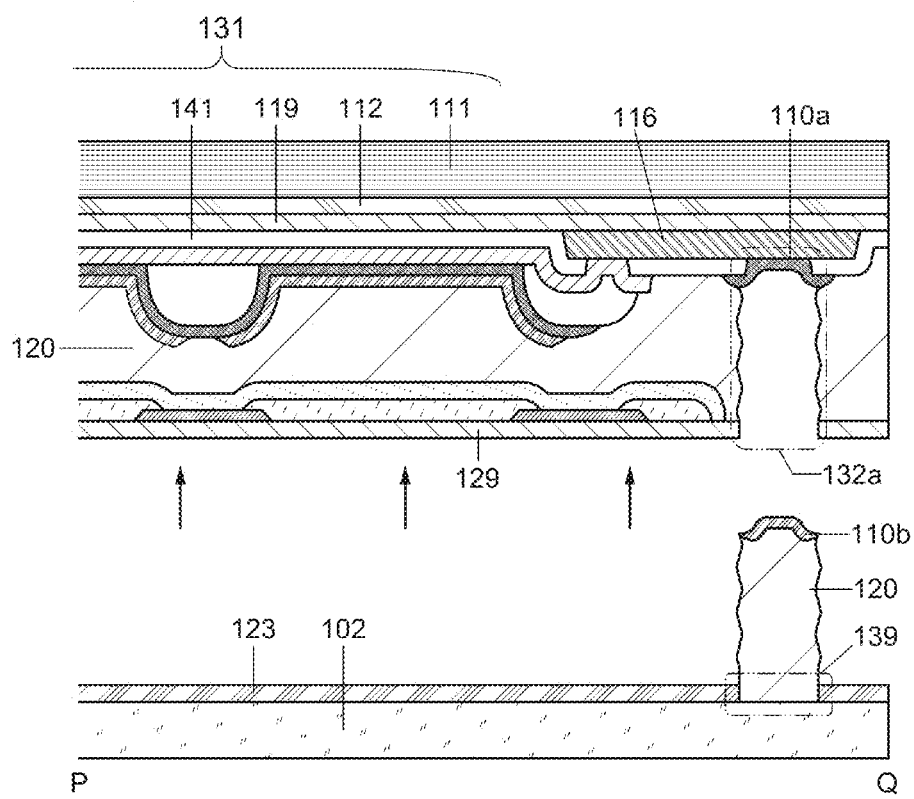

FIG. 10A is a perspective view illustrating the processed member 150 in the process of substrate separation. FIG. 10B is a cross-sectional view taken along a dotted line P-Q in FIG. 10A. In this case, a region of the bonding layer 120 which substantially overlaps with the opening 139 and a region of the separation layer 110b which substantially overlaps with the opening 139 are also removed, whereby an opening 132a is formed (see FIG. 10B). Hereinafter a step of separating the bonding layer 120 and the separation layer 110b from the separation layer 110a is also referred to as terminal portion separation. The terminal portion separation occurs during the substrate separation, and the direction in which the substrate separation proceeds and the direction in which the terminal portion separation proceeds are the same. Note that when seen from the above, the outline of the opening 139 is preferably positioned on the inner side than the outline of a region where the separation layer 110a and the separation layer 110b are in contact with each other, in which case the separation layer 110b can be easily separated from the separation layer 110a.

FIG. 10A illustrates the case where the top surface shape of the opening 139 is a hexagon having a first corner portion 192 and a second corner portion 193. An arrow 194 in FIG. 10A denotes the direction in which separation of the substrate 102 and the separation layer 123 proceeds. The direction is substantially parallel to the long sides of the top surface shape of the opening 139.

The substrate separation in a region where the separation layer 123 exists over the substrate 102 occurs at an interface between the separation layer 123 and the insulating layer 129 (hereinafter also referred to as a first interface). The terminal portion separation in a region overlapping with the opening 139 occurs at an interface between the separation layer 110a and the separation layer 110b (hereinafter also referred to as a second interface). Since the first interface and the second interface are not on the same plane, the substrate separation is not smoothly performed from the first interface to the second interface or from the second interface to the first interface in some cases. Specifically, the substrate separation is interrupted near the opening 139, and from the point, separation occurs at an interface other than the intended interface in some cases.

In the top surface shape of the opening 139, the first corner portion 192 projects in the direction opposite to the direction in which separation proceeds (hereinafter referred to as separation direction); thus, the substrate separation can be prevented from being interrupted at a starting point 190 for the terminal portion separation. In the top surface shape of the opening 139, the second corner portion 193 projects in the separation direction; thus, the substrate separation can be prevented from being interrupted at a terminal point for the terminal portion separation. Accordingly, in one embodiment of the present invention, a display device can be manufactured in a high yield.

When the angles of the first corner portion 192 and the second corner portion 193 are too small, the width of the second interface near the starting point or the terminal point for the terminal portion separation is narrow, leading to unstable terminal portion separation. When the angles of the first corner portion 192 and the second corner portion 193 are too large, the effect of preventing the interruption of the separation is reduced. Therefore, the angle of each of the first corner portion 192 and the second corner portion 193 is preferably larger than or equal to 30° and smaller than or equal to 150°.

Figure 11A:
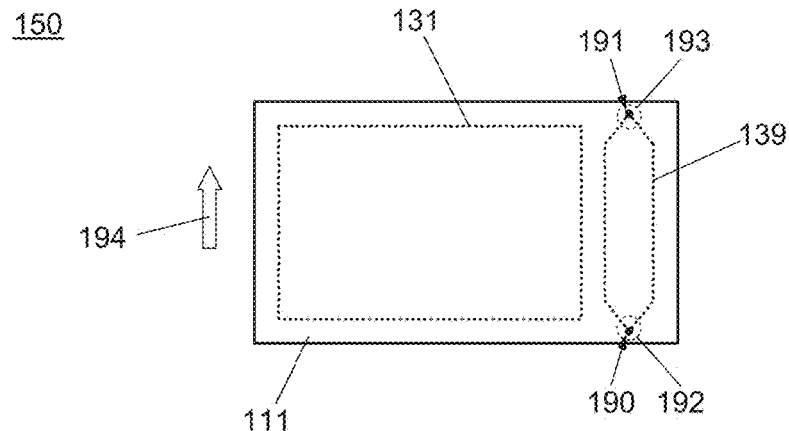
FIGS. 11A to 11D illustrate a manufacturing process of one embodiment of a display device.
Figure 11B:
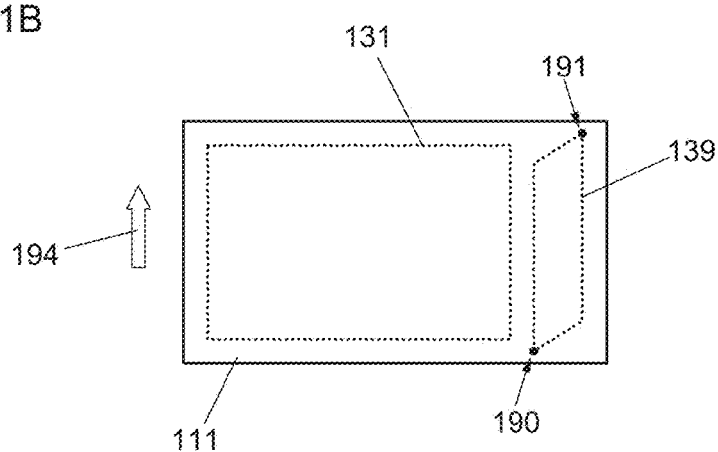
Figure 11C:
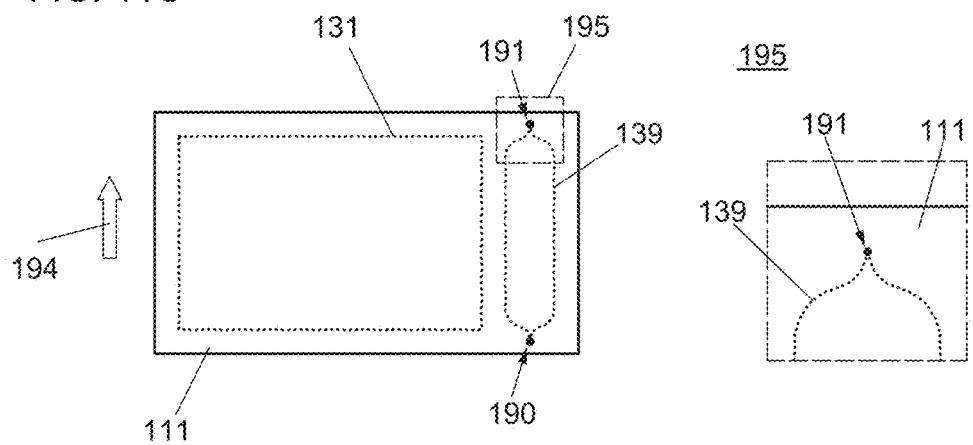
Figure 11D:
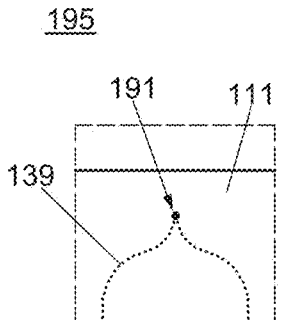

FIG. 11A is a schematic top view illustrating the processed member 150 before being subjected to the substrate separation. The outermost surface of the processed member 150 is the substrate 111. FIGS. 11A to 11D show the outlines of the display region 131 and the opening 139. An end portion of the first corner portion 192 of the opening 139 which projects in the direction opposite to the direction in which the substrate separation proceeds (the arrow 194 in FIG. 11A) corresponds to the starting point 190 for the terminal portion separation. An end portion of the second corner portion 193 of the opening 139 which projects in the direction in which the substrate separation proceeds corresponds to the terminal point 191 for the terminal portion separation. In other words, the substrate separation proceeds in the same direction as the terminal portion separation that proceeds from the starting point 190 which is the end portion of the first corner portion 192 of the opening 139 to the terminal point 191 which is the end portion of the second corner portion 193 of the opening 139. Note that the top surface shape of the opening 139 may be a parallelogram (see FIG. 11B). Alternatively, the top surface shape of the opening 139 may be a closed curve in which the starting point 190 and the terminal point 191 project and gradually expand toward the inner part (see FIG. 11C). FIG. 11D is an enlarged schematic top view of a region 195 near the terminal point 191 in FIG. 11C.

Note that after the substrate 102 is separated from the insulating layer 129, the separation layer 110a might remain on the electrode 116. When the separation layer 110a remains on the electrode 116, contact failure might be caused between the electrode 116 and the anisotropic conductive connection layer 138. Therefore, after the substrate 102 is separated, the remaining separation layer 110a which is attached to the electrode 116 is preferably removed with, for example, an organic solvent such as acetone. In this embodiment, the separation layer 110a on the electrode 116 is removed with acetone. Note that the separation layer 110a remaining on the electrode 116 is not necessarily removed in the case where it does not cause a problem in electrical connection between the electrode 116 and the anisotropic conductive connection layer 138 in the presence of the separation layer 110a.

[Attachment of Substrate 121]

Figure 12A:
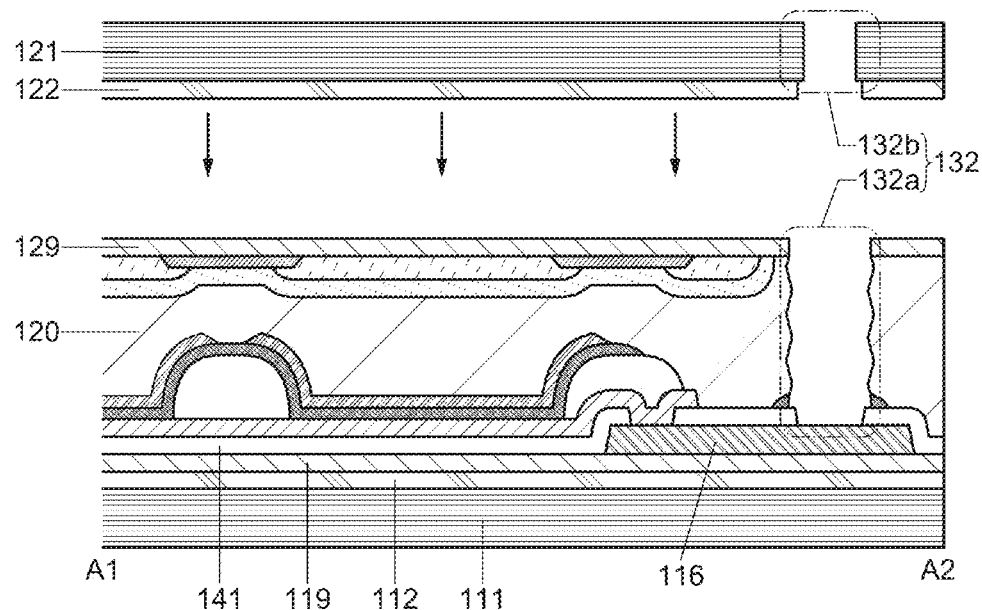
FIGS. 12A and 12B illustrate a manufacturing process of one embodiment of a display device.

Next, the substrate 121 having an opening 132b is attached to the insulating layer 129 with the bonding layer 122 provided therebetween (see FIG. 12A). The substrate 121 and the insulating layer 129 are attached to each other so that the opening 132a overlaps with the opening 132b. In this embodiment, the openings 132a and 132b are collectively referred to as an opening 132. The surface of the electrode 116 is exposed from the opening 132.

Figure 12B:
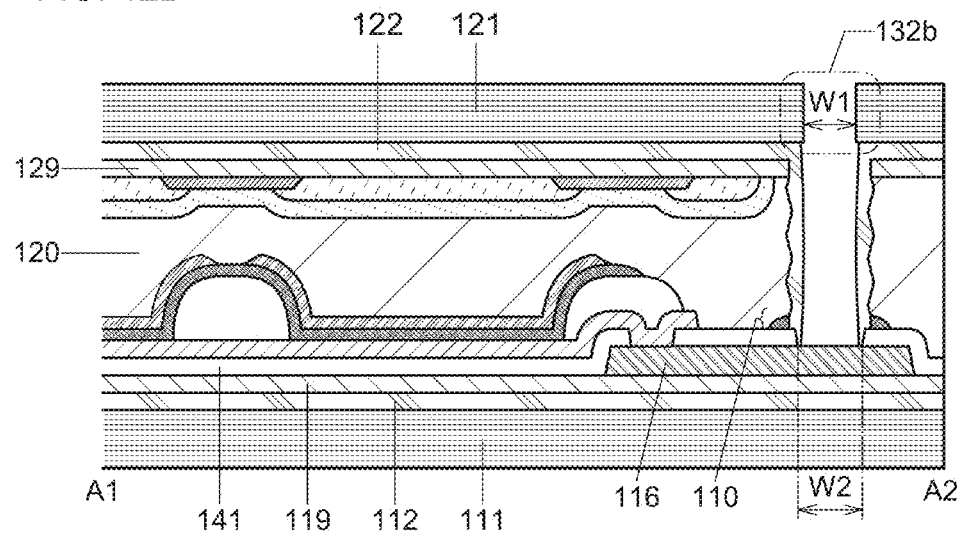

At the attachment of the substrate 121 to the insulating layer 129, the width of the opening 132b, the amount of an adhesive used for the bonding layer 122, or the like is preferably adjusted so that the bonding layer 122 covers side surfaces of the layers in the opening 132a as illustrated in FIG. 12B. With such a structure, a break or a crack of the insulating layer 129 and the like which are exposed in the side surfaces of the opening 132a can be suppressed. Moreover, after the removal of the separation layer 110b, the separation layer 110 remaining on the insulating layer 141 in the vicinity of the opening 132a is covered with the bonding layer 122, so that diffusion of the material for forming the separation layer 110 into the anisotropic conductive connection layer 138 can be suppressed. For example, the width W1 of the opening 132b is preferably smaller than the width W2 of the opening 132 (see FIG. 12B). FIG. 12B is a cross-sectional view of the display device 100 after the attachment of the substrate 121 to the insulating layer 129.

Note that the display device 100 of one embodiment of the present invention preferably includes a plurality of electrodes 116 in one opening 132. FIG. 13A is a perspective view of the display device 100 in which the plurality of electrodes 116 are provided in one opening 132, and FIG. 13B is a cross-sectional view taken along the dashed-dotted line B1-B2 in FIG. 13A.

The opening 132 is provided such that the outline of the opening 132 is positioned on the inner side than the outline of the substrate 121 in a plan view, so that the outline of the opening 132 can be supported by the substrate 121 and the substrate 111. Thus, the mechanical strength of a region where the external electrode 124 and the electrode 116 are connected to each other is unlikely to decrease, and unintentional deformation of the connected region can be reduced. According to one embodiment of the present invention, breakage of the display device 100 can be prevented, and the reliability of the display device 100 can be improved.

Alternatively, one or more of layers each formed using a material having a specific function, such as an anti-reflection layer, a light diffusion layer, a microlens array, a prism sheet, a retardation plate, or a polarizing plate, (hereinafter referred to as "functional layers") may be provided on an outer side than the substrate 111 or the substrate 121 from which the light 151 is emitted. As the anti-reflection layer, for example, a circularly polarizing plate can be used. With the functional layer, a display device having a higher display quality can be achieved. Moreover, power consumption of the display device can be reduced.

Figure 14A:
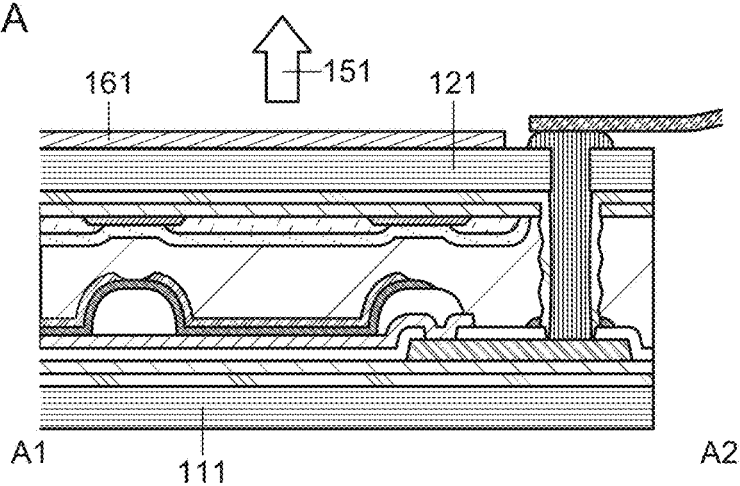
FIGS. 14A to 14C are cross-sectional views each illustrating one embodiment of a display device.
Figure 14B:
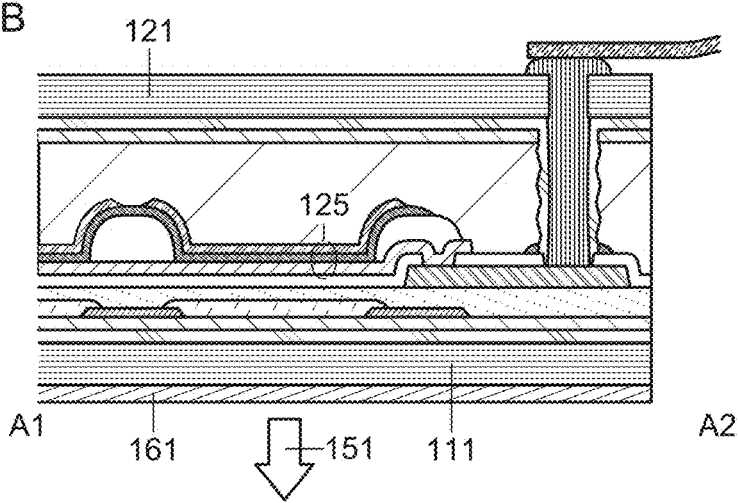
Figure 14C:
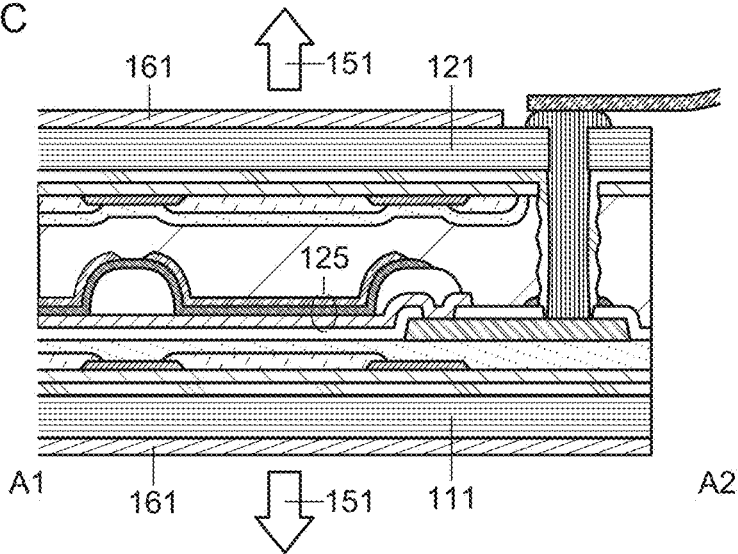

FIG. 14A is a cross-sectional view of the display device 100 having a top-emission structure including a functional layer 161. FIG. 14B is a cross-sectional view of the display device 100 having a bottom-emission structure including the functional layer 161. FIG. 14C is a cross-sectional view of the display device 100 having a dual-emission structure including the functional layer 161.

For the substrate 111 or the substrate 121, a material having a specific function may be used. For example, a circularly polarizing plate may be used as the substrate 111 or the substrate 121. Alternatively, for example, the substrate 111 or the substrate 121 may be formed using a retardation plate, and a polarizing plate may be provided so as to overlap with the substrate. As another example, the substrate 111 or the substrate 121 may be formed using a prism sheet, and a circularly polarizing plate may be provided so as to overlap with the substrate. With the use of the material having a specific function for the substrate 111 or the substrate 121, improvement of display quality and reduction of the manufacturing cost can be achieved.

[Formation of External Electrode 124]

Next, the anisotropic conductive connection layer 138 is formed in and on the opening 132, and the external electrode 124 for inputting electric power or a signal to the display device 100 is formed over the anisotropic conductive connection layer 138 (see FIGS. 1A and 1B). The electrode 116 is electrically connected to the external electrode 124 through the anisotropic conductive connection layer 138. Thus, electric power or a signal can be input to the display device 100. Note that an FPC can be used as the external electrode 124. A metal wire can also be used as the external electrode 124. Although the anisotropic conductive connection layer 138 may be used to connect the metal wire and the electrode 116 to each other, the connection may be performed by a wire bonding method without using the anisotropic conductive connection layer 138. Alternatively, the metal wire and the electrode 116 may be connected to each other by a soldering method.

A top surface shape of the opening 132 is substantially the same as that of the opening 139 illustrated in FIGS. 11A to 11D. It is preferable that the top surface shape of the opening 132 be a hexagon having the first corner portion 192 and the second corner portion 193 and the angle of each of the first corner portion 192 and the second corner portion 193 be larger than or equal to 30° and smaller than or equal to 150°. Alternatively, the top surface shape of the opening 132 may be a parallelogram having the first corner portion 192 and the second corner portion 193.

Figure 15A:
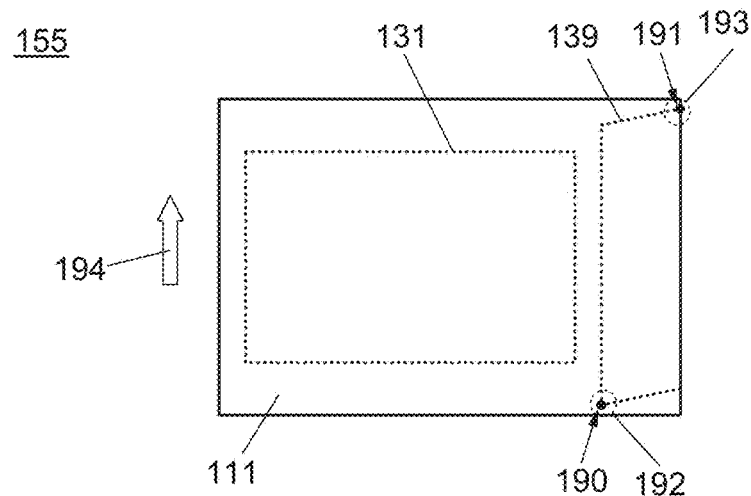
FIGS. 15A to 15C illustrate a manufacturing process of one embodiment of a display device.
Figure 15B:
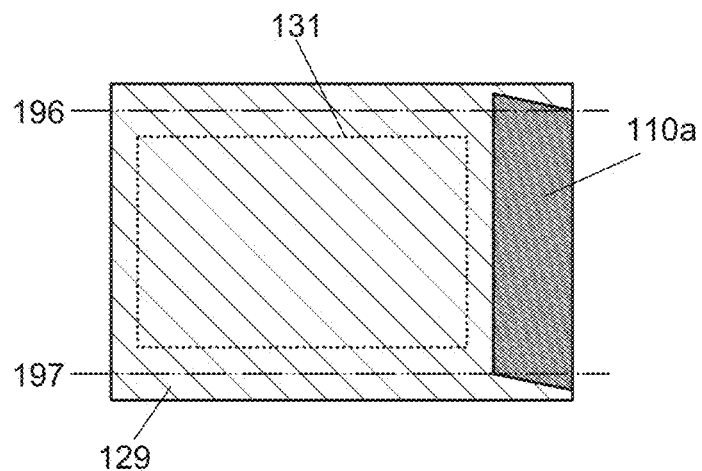
Figure 15C:
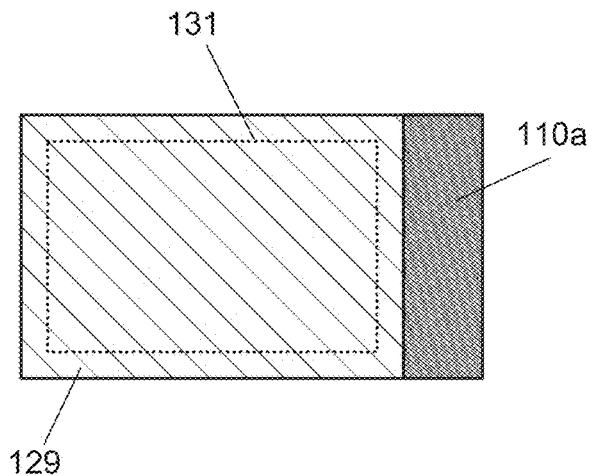
Figure 16A:
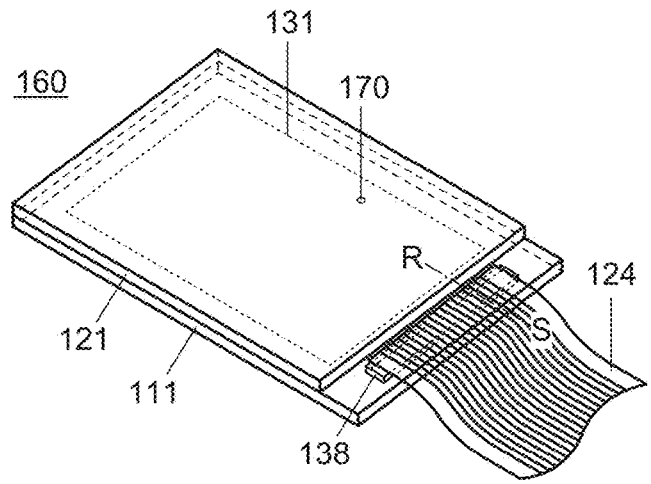
FIGS. 16A and 16B are a perspective view and a cross-sectional view illustrating one embodiment of a display device.
Figure 16B:
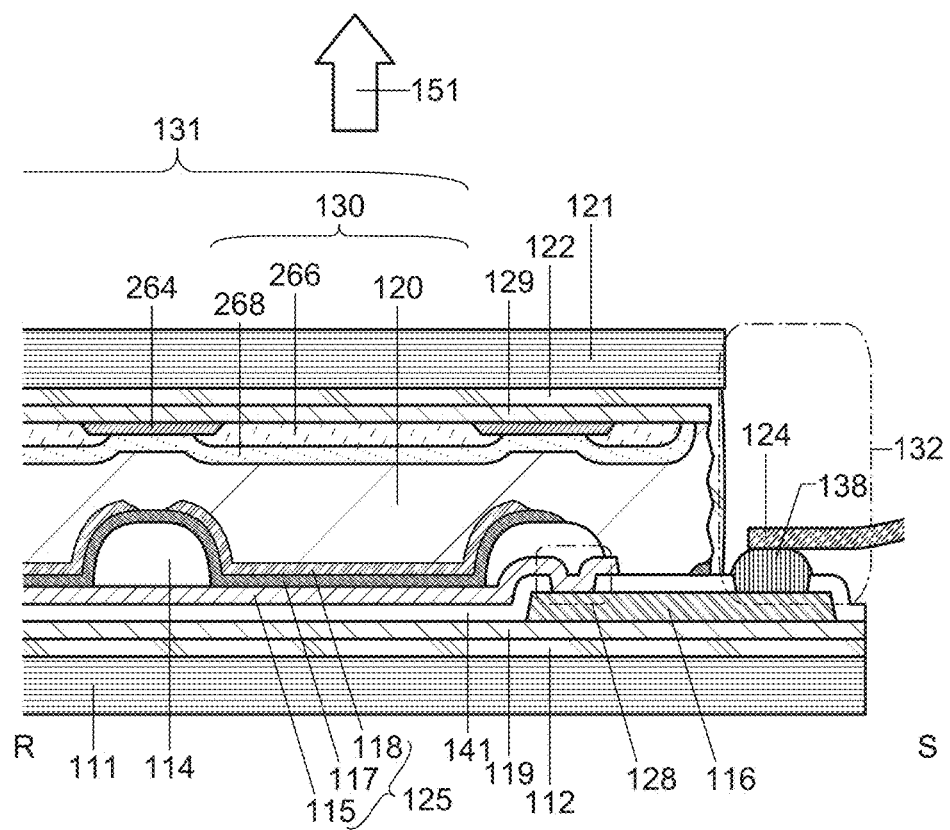

Note that the above-described method for manufacturing the display device 100 shows an example in which the outline of the opening 139 in the separation layer 123 is positioned on the inner side than the outline of the separation layer 123 when seen from the above, but one embodiment of the present invention is not limited to this example. Part of the outline of the opening 139 may be aligned with the outline of the separation layer 123 as illustrated in FIG. 15A. FIG. 15A is a schematic top view of the processed member 155 before being subjected to the substrate separation, and the arrow 194 in FIG. 15A denotes the direction in which the substrate separation proceeds. FIG. 15B is a schematic top view of the processed member 155 after being subjected to the substrate separation, which includes the substrate 111. The processed member 155 in FIG. 15B is divided along dashed-two dotted lines 196 and 197, whereby three sides of a region where the separation layer 110a is exposed can be aligned with the outline of the substrate 111 (see FIG. 15C). FIG. 16A is a perspective view illustrating a display device 160 that is manufactured through the substrate separation illustrated in FIGS. 15A and 15B and the division in FIG. 15C. FIG. 16B is a cross-sectional view taken along a dashed-dotted line S-T in FIG. 16A. Note that for the method for manufacturing the display device 160 in FIGS. 16A and 16B except the substrate separation and the division, the method for manufacturing the display device 100 can be referred to.

<Example of Layout of Display Device>

Figure 17:
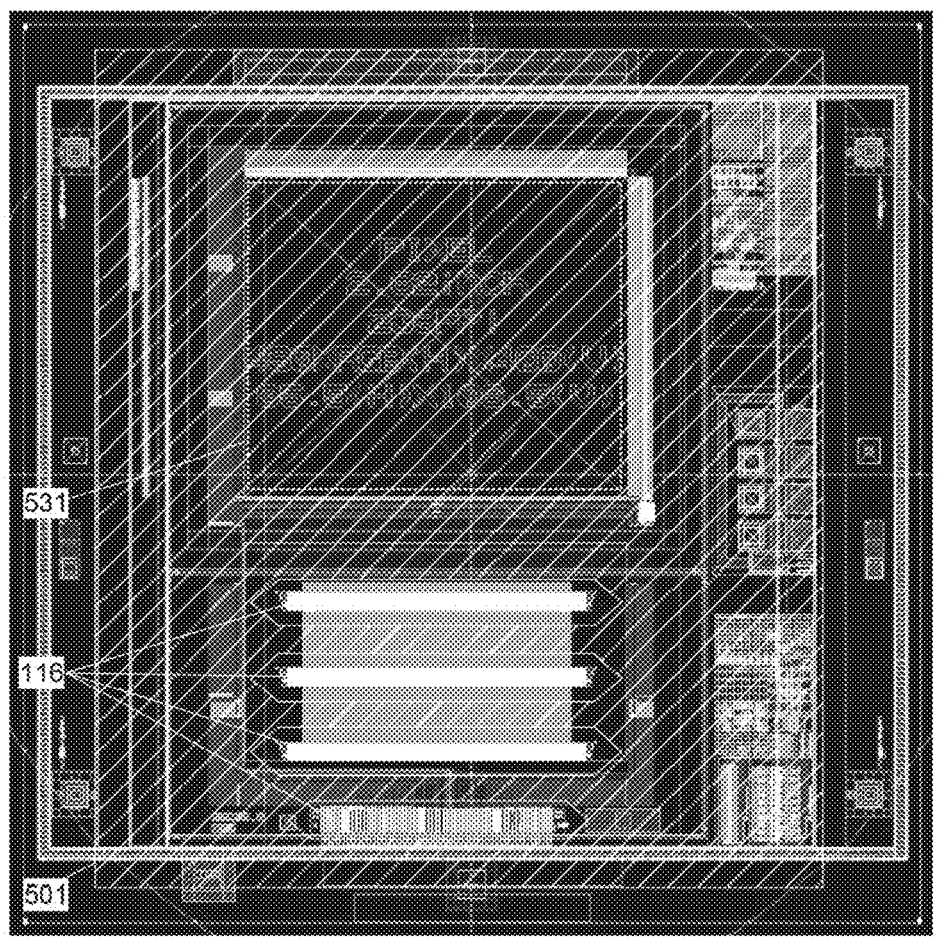
FIG. 17 illustrates an example of a layout of a mask used in a manufacturing process of one embodiment of a display device.

FIG. 17 illustrates a mask pattern (a layout) of a display device of one embodiment of the present invention. FIG. 17 illustrates a display region 531 and the electrode 116 included in the display device. FIG. 17 also illustrates a mask pattern 501 used for forming the separation layer 123 and the insulating layer 129 in the above manufacturing method. When seen from the above, the mask pattern 501 has four openings which surround the electrodes 116. The top surface shape of each opening is a hexagon having two acute angles. Since the mask pattern 501 has the openings, the opening 139 can be formed in the separation layer 123 and the insulating layer 129 as illustrated in FIG. 6B.

This embodiment can be implemented in an appropriate combination with any of the structures described in the other embodiments.

Embodiment 2

Figure 18A:
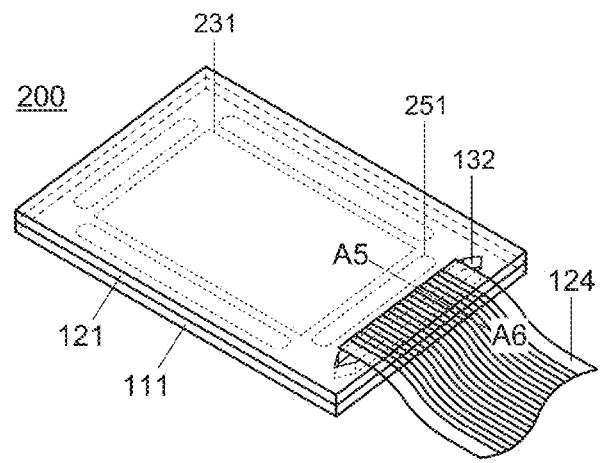
FIGS. 18A and 18B are a perspective view and a cross-sectional view illustrating one embodiment of a display device.
Figure 18B:
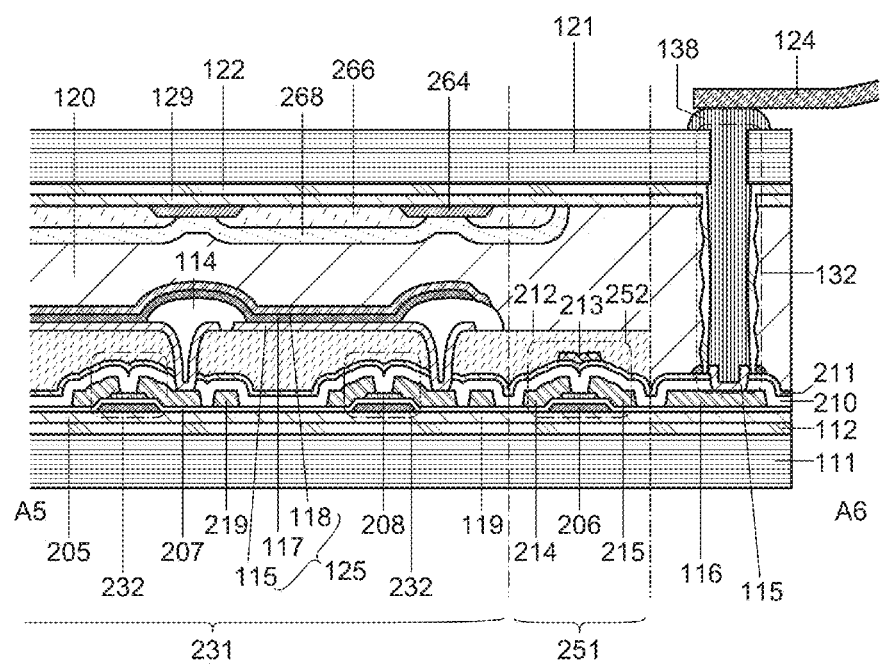

In this embodiment, a display device 200 having a structure different from the structure of the display device 100 described in the above embodiment will be described with reference to FIGS. 18A and 18B. FIG. 18A is a perspective view of the display device 200, and FIG. 18B is a cross-sectional view taken along the dashed-dotted line A5-A6 in FIG. 18A.

<Structure of Display Device>

The display device 200 described in this embodiment includes a display region 231 and a peripheral circuit 251. The display device 200 further includes the electrode 116 and the light-emitting element 125 including the electrode 115, the EL layer 117, and the electrode 118. A plurality of light-emitting elements 125 are formed in the display region 231. A transistor 232 for controlling the amount of light emitted from the light-emitting element 125 is connected to each light-emitting element 125.

The electrode 116 is electrically connected to the external electrode 124 through the anisotropic conductive connection layer 138 formed in the opening 132. Although not illustrated, the electrode 116 is electrically connected to the peripheral circuit 251.

The peripheral circuit 251 includes a plurality of transistors 252. The peripheral circuit 251 has a function of determining which of the light-emitting elements 125 in the display region 231 is supplied with a signal from the external electrode 124.

In the display device 200 illustrated in FIGS. 18A and 18B, the substrate 111 and the substrate 121 are attached to each other with the bonding layer 120 provided therebetween. An insulating layer 205 is formed over the substrate 111 with the bonding layer 112 provided therebetween. The insulating layer 205 is preferably formed as a single layer or a multilayer using any of silicon oxide, silicon nitride, silicon oxynitride, silicon nitride oxide, aluminum oxide, aluminum oxynitride, and aluminum nitride oxide. The insulating layer 205 can be formed by a sputtering method, a CVD method, a thermal oxidation method, a coating method, a printing method, or the like.

The insulating layer 205 functions as a base layer and can prevent or reduce diffusion of impurity elements from the substrate 111, the bonding layer 112, or the like to the transistor or the light-emitting element.

The transistor 232, the transistor 252, the electrode 116, and a wiring 219 are formed over the insulating layer 205.

Although a channel-etched transistor that is a type of bottom-gate transistor is illustrated as the transistor 232 and/or the transistor 252 in this embodiment, a channel-protective transistor, a top-gate transistor, or the like can also be used. Alternatively, an inverted staggered transistor or a forward staggered transistor can also be used. It is also possible to use a dual-gate transistor, in which a semiconductor layer in which a channel is formed is provided between two gate electrodes. Furthermore, the transistor is not limited to a transistor having a single-gate structure; a multi-gate transistor having a plurality of channel formation regions, such as a double-gate transistor, may be used.

As the transistor 232 and the transistor 252, a transistor with any of a variety of structures such as a planar type, a FIN-type, and a Tri-Gate type can be used.

The transistor 232 and the transistor 252 may have the same structure or different structures. The size (e.g., channel length and channel width) or the like of each transistor can be adjusted as appropriate.

The transistor 232 and the transistor 252 each include an electrode 206 that can function as a gate electrode, an insulating layer 207 that can function as a gate insulating layer, a semiconductor layer 208, an electrode 214 that can function as one of a source electrode and a drain electrode, and an electrode 215 that can function as the other of the source electrode and the drain electrode.

The wiring 219, the electrode 214, and the electrode 215 can be formed at the same time as the electrode 116 using part of the conductive layers for forming the electrode 116. The insulating layer 207 can be formed using a material and a method similar to those of the insulating layer 205.

The semiconductor layer 208 can be formed using a single crystal semiconductor, a polycrystalline semiconductor, a microcrystalline semiconductor, a nanocrystal semiconductor, a semi-amorphous semiconductor, an amorphous semiconductor, or the like. For example, amorphous silicon or microcrystalline germanium can be used. Alternatively, a compound semiconductor such as silicon carbide, gallium arsenide, an oxide semiconductor, or a nitride semiconductor, an organic semiconductor, or the like can be used. In the case of using an oxide semiconductor for the semiconductor layer 208, a c-axis aligned crystalline oxide semiconductor (CAAC-OS), a polycrystalline oxide semiconductor, a microcrystalline oxide semiconductor, a nanocrystalline oxide semiconductor (nc-OS), an amorphous oxide semiconductor, or the like can be used.

Note that an oxide semiconductor has an energy gap as wide as 3.0 eV or more and high visible-light transmissivity. In a transistor obtained by processing an oxide semiconductor under appropriate conditions, it is possible to realize an extremely low off-state current (current flowing between a source and drain in an off state of a transistor). For example, the off-state current per 1 μm of a channel width can be less than or equal to 100 zA ($1 \times 10^{-19}$ A), less than or equal to 10 zA ($1 \times 10^{-20}$ A), and further less than or equal to 1 zA ($1 \times 10^{-21}$ A) when the source-drain voltage is 3.5 V at 25° C. Therefore, a display device with low power consumption can be achieved.

In the case where an oxide semiconductor is used for the semiconductor layer 208, an insulating layer containing oxygen is preferably used as an insulating layer in contact with the semiconductor layer 208. For the insulating layer in contact with the semiconductor layer 208, it is particularly preferable to use an insulating layer from which oxygen is released by heat treatment.

An insulating layer 210 is formed over the transistor 232 and the transistor 252, and an insulating layer 211 is formed over the insulating layer 210. The insulating layers 210 and 211 each function as a protective insulating layer and can prevent or reduce diffusion of impurity elements from a layer above the insulating layer 211 to the transistor 232 and the transistor 252. The insulating layers 210 and 211 each can be formed using a material and a method similar to those of the insulating layer 205.

An interlayer insulating layer 212 is formed over the insulating layer 211. The interlayer insulating layer 212 can absorb the unevenness caused by the transistor 232 and the transistor 252. Planarization treatment may be performed on a surface of the interlayer insulating layer 212. The planarization treatment may be, but not particularly limited to, polishing treatment (e.g., chemical mechanical polishing (CMP)) or dry etching treatment.

Forming the interlayer insulating layer 212 using an insulating material having a planarization function can omit polishing treatment. As the insulating material having a planarization function, for example, an organic material such as a polyimide resin or an acrylic resin can be used. Other than the above-described organic materials, it is also possible to use a low-dielectric constant material (low-k material) or the like. Note that the interlayer insulating layer 212 may be formed by stacking a plurality of insulating films formed of these materials.

Over the interlayer insulating layer 212, the light-emitting element 125 and the partition 114 for separating the adjacent light-emitting elements 125 are formed. The electrode 115 is also formed in the opening 132 so as to overlap with the electrode 116.

The substrate 121 is provided with the light-blocking layer 264, the coloring layer 266, and the overcoat layer 268. The display device 200 is what is called a top-emission light-emitting device, in which light emitted from the light-emitting element 125 is extracted from the substrate 121 side through the coloring layer 266.

The light-emitting element 125 is electrically connected to the transistor 232 through an opening formed in the interlayer insulating layer 212 and insulating layers 211 and 210.

With a micro optical resonator (also referred to as microcavity) structure which allows light emitted from the EL layer 117 to resonate, lights with different wavelengths and narrowed spectra can be extracted even when one EL layer 117 is used for different light-emitting elements 125.

FIGS. 19A and 19B are cross-sectional views of the display device 200 in which the light-emitting element 125 has a microcavity structure, for example. Note that FIG. 19A corresponds to a cross-sectional view taken along the vicinity of the dashed-dotted line A5-A6 in FIG. 18A. FIG. 19B is an enlarged view of a portion 280 in FIG. 19A.

In the case where the light-emitting element 125 has a microcavity structure, the electrode 118 is formed using a conductive material (a semi-transmissive material) which transmits and reflect a certain amount of light of the incident light, and the electrode 115 is formed using a stack of a conductive material having high reflectance (the reflectance of visible light is 50% or more and 100% or less, or preferably 70% or more and 100% or less) and a conductive material having high transmittance (the transmittance of visible light is 50% or more and 100% or less, or preferably 70% or more and 100% or less). Here, the electrode 115 is formed of a stack of an electrode 115a formed using a conductive material that reflects light and an electrode 115b formed using a conductive material that transmits light. The electrode 115b is provided between the EL layer 117 and the electrode 115a (see FIG. 19B). The electrode 115a functions as a reflective electrode, and the electrode 118 functions as a semi-reflective electrode.

For example, the electrode 118 may be formed using a conductive material containing silver (Ag) or a conductive material containing aluminum (Al) having a thickness of 1 nm to 30 nm, or preferably 1 nm to 15 nm. In this embodiment, as the electrode 118, a 10-nm-thick conductive material containing silver and magnesium is used.

The electrode 115a may be formed using a conductive material containing silver (Ag) or a conductive material containing aluminum (Al) having a thickness of 50 nm to 500 nm, or preferably 50 nm to 200 nm. In this embodiment, the electrode 115a is formed using a 100-nm-thick conductive material containing silver.

For the electrode 115b, a conductive oxide containing indium (In) or a conductive oxide containing zinc (Zn) having a thickness of 1 nm to 200 nm or preferably 5 nm to 100 nm may be used. In this embodiment, indium tin oxide is used for the electrode 115b. Furthermore, a conductive oxide may be provided under the electrode 115a.

By changing the thickness t of the electrode 115b, a distance d from the interface between the electrode 118 and the EL layer 117 to the interface between the electrode 115a and the electrode 115b can be set to an arbitral value. The light-emitting elements 125 having different emission spectra for respective pixels can be provided even when one EL layer 117 is used by changing the thickness t of the electrode 115b in each pixel. Thus, color purity of each emission color is improved and a display device having favorable color reproducibility can be achieved. It is not necessary to independently form the EL layer 117 in each pixel depending on the emission color; therefore, the number of manufacturing steps of the display device can be reduced and thus the productivity can be improved. Furthermore, a high-definition display device can be achieved easily.

Note that a method for adjusting the distance d is not limited to the above method. For example, the distance d may be adjusted by changing the film thickness of the EL layer 117.

FIG. 19A shows an example in which the pixel 130R, the pixel 130G, the pixel 130B, and the pixel 130Y that emit red light 151R, green light 151G, blue light 151B, and yellow light 151Y, respectively, are used as one pixel 140. Note that one embodiment of the present invention is not limited to this example. As the pixel 140, subpixels that emit lights of red, green, blue, yellow, cyan, magenta, and white may be combined as appropriate. For example, the pixel 140 may be formed of the following three subpixels: the pixel 130R, the pixel 130G, and the pixel 130B.

Figure 20:
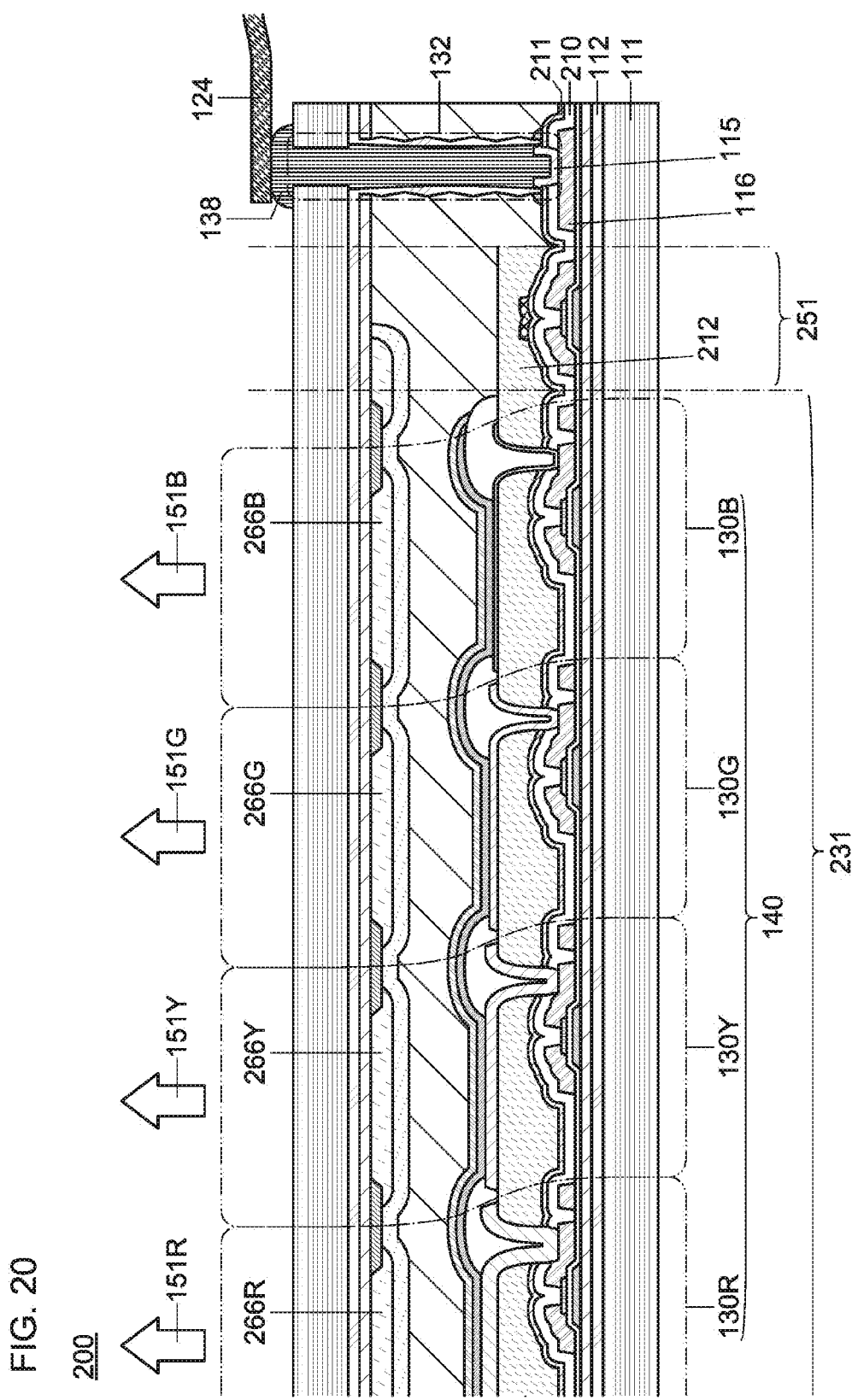
FIG. 20 is a cross-sectional view illustrating one embodiment of a display device.

The coloring layer 266 may be provided in a position overlapping with the light-emitting element 125 so that the light 151 is emitted outside through the coloring layer 266. FIG. 20 shows a structure example in the case where the coloring layer 266 is combined with the display device 200 illustrated in FIGS. 19A and 19B. In the display device 200 illustrated in FIG. 20, a coloring layer 266R, a coloring layer 266G, a coloring layer 266B, and a coloring layer 266Y that transmit light in a red wavelength band, light in a green wavelength band, light in a blue wavelength band, and light in a yellow wavelength band, respectively, are provided so as to overlap with the pixel 130R that emits the red light 151R, the pixel 130G that can emit the green light 151G, the pixel 130B that can emit the blue light 151B, and the pixel 130Y that can emit the yellow light 151Y, respectively.

By using the pixel 130Y in addition to the pixel 130R, the pixel 130G, and the pixel 130B, the color reproducibility of the display device can be increased. In the case where the pixel 140 is formed of only the pixel 130R, the pixel 130G, and the pixel 130B, all of the pixels 130R, 130G, and 130B need to emit light when white light is emitted from the pixel 140. When the pixel 130Y is provided in addition to the pixel 130R, the pixel 130G, and the pixel 130B, white light can be obtained by emitting light only from the pixel 130B and the pixel 130Y. Thus, since white light can be obtained even without light emission from the pixel 130R and the pixel 130G, power consumption of the display device can be reduced.

Moreover, the pixel 130W that can emit white light 151W may be used instead of the pixel 130Y. The use of the pixel 130W instead of the pixel 130Y allows emission of white light by emitting light only from the pixel 130W; therefore, power consumption of the display device can be further reduced.

Note that in the case of using the pixel 130W, a coloring layer is not necessarily provided in the pixel 130W. Without a coloring layer, the luminance of the display region is improved and a display device having favorable visibility can be achieved. Moreover, power consumption of the display device can be further reduced.

The pixel 130W may be provided with a coloring layer 266W that transmits light of substantially whole of the visible region, by which the color temperature of the white light 151W can be changed. Accordingly, a display device having a high display quality can be achieved.

The color purity of the light 151 can be further improved by using the light-emitting element 125 having a microcavity structure and the coloring layer 266 in combination. Therefore, the color reproducibility of the display device 200 can be improved. In addition, light that enters from the outside is mostly absorbed by the coloring layer 266; therefore, reflection of the light that enters from the outside on the display region 231 is suppressed and thus the visibility of the display device can be improved. Accordingly, a display device having a high display quality can be achieved.

Although an active matrix display device is described as an example of the display device in this embodiment, one embodiment of the present invention can also be applied to a passive matrix display device. Moreover, one embodiment of the present invention can also be applied to a display device having a bottom-emission structure or a dual-emission structure.

This embodiment can be implemented in an appropriate combination with any of the structures described in the other embodiments.

Embodiment 3

In this embodiment, a specific structure example of the display device 200 will be described with reference to FIGS. 21A to 21C and FIGS. 22A1 to 22B2.

<Example of Pixel Circuit Configuration>

Figure 21A:
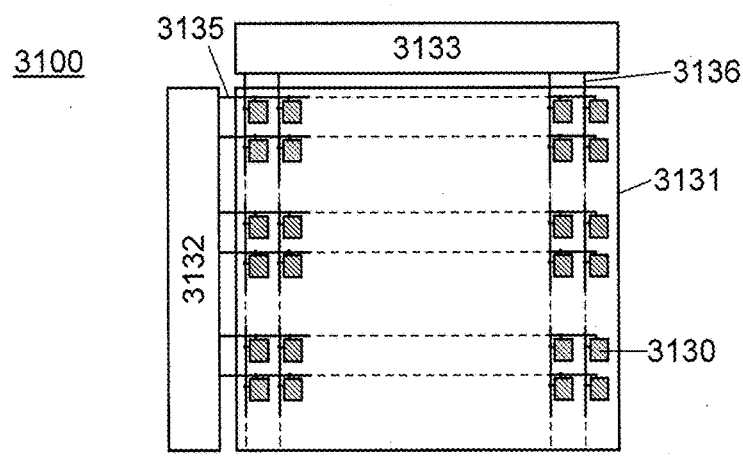
FIGS. 21A to 21C are block diagrams each illustrating an example of a display device.

FIG. 21A is a block diagram illustrating the structure of a display device 3100. The display device 3100 includes a display region 3131, a circuit 3132, and a circuit 3133. The circuit 3132 functions as a scan line driver circuit, for example. The circuit 3133 functions as a signal line driver circuit, for example.

The display device 3100 includes m scan lines 3135 which are arranged parallel or substantially parallel to each other and whose potentials are controlled by the circuit 3132, and n signal lines 3136 which are arranged parallel or substantially parallel to each other and whose potentials are controlled by the circuit 3133. The display region 3131 includes a plurality of pixels 3130 arranged in a matrix of m rows and n columns. Note that each of m and n is a natural number of 2 or more.

Each of the scan lines 3135 is electrically connected to the n pixels 3130 in the corresponding row among the pixels 3130 in the display region 3131. Each of the signal lines 3136 is electrically connected to the m pixels 3130 in the corresponding column among the pixels 3130.

Figure 21B:
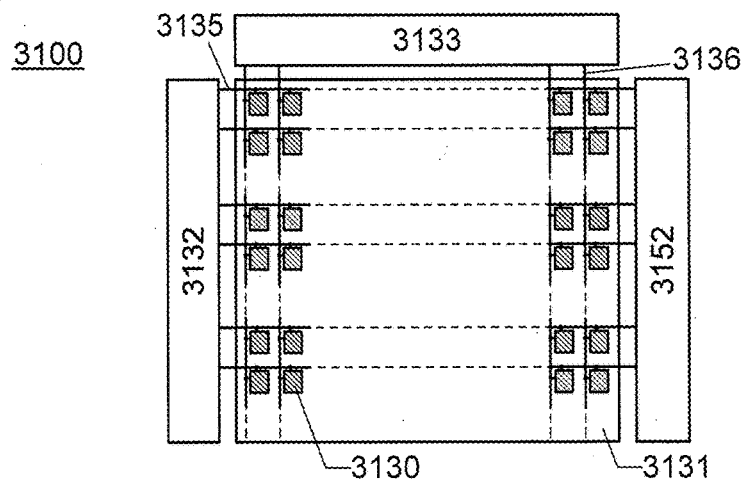
Figure 21C:
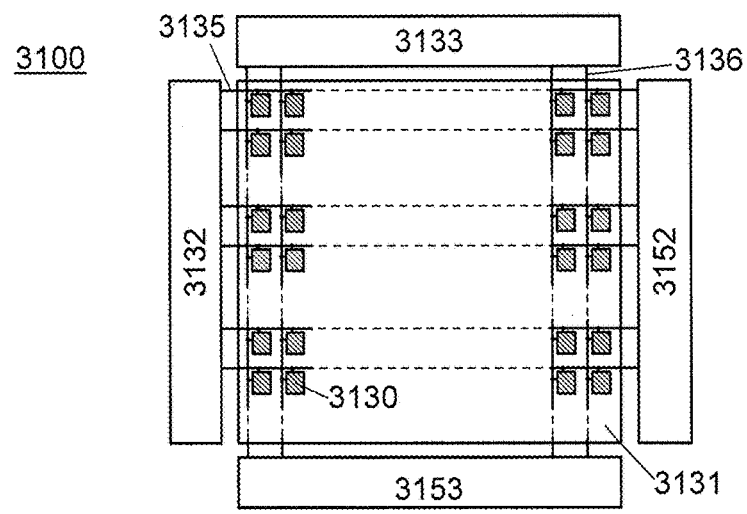

As illustrated in FIG. 21B, a circuit 3152 may be provided on the opposite side of the display region 3131 from the circuit 3132. Furthermore, as illustrated in FIG. 21C, a circuit 3153 may be provided on the opposite side of the display region 3131 from the circuit 3133. In each of FIGS. 21B and 21C, like the circuit 3132, the circuit 3152 is connected to the scan lines 3135. Note that the present invention is not limited to these configurations. For example, the scan lines 3135 may be connected alternately to the circuit 3132 and the circuit 3152 every several rows. In the example of FIG. 21C, like the circuit 3133, the circuit 3153 is connected to the signal lines 3136. Note that the present invention is not limited to this configuration. For example, the signal lines 3136 may be connected alternately to the circuit 3133 and the circuit 3153 every several rows. The circuits 3132, 3133, 3152, and 3153 may have a function other than the function of driving the pixels 3130.

In some cases, the circuits 3132, 3133, 3152, and 3153 may be collectively called a driver circuit portion. The pixel 3130 includes a pixel circuit 3137 and a display element. The pixel circuit 3137 is a circuit that drives the display element. A transistor included in the driver circuit portion and a transistor included in the pixel circuit 3137 can be formed at the same time. Part of the driver circuit portion or the entire driver circuit portion may be formed over another substrate and electrically connected to the display device 3100. For example, part of the driver circuit portion or the entire driver circuit portion may be formed using a single crystal substrate and electrically connected to the display device 3100.

FIGS. 22A1, 22A2, 22B1, and 22B2 illustrate circuit configurations that can be used for the pixels 3130 in the display device 3100.

<Example of Pixel Circuit for Light-Emitting Display Device>

FIGS. 22A1 and 22A2 illustrate examples of a pixel circuit that can be used for a light-emitting display device. The pixel circuit 3137 illustrated in FIGS. 22A1 and 22A2 includes a transistor 3431, a capacitor 3233, a transistor 3232, and a transistor 3434. In a circuit diagram of FIG. 22A2, the transistors 3431, 3232, and 3434 each include a back gate electrode. The pixel circuit 3137 is electrically connected to a light-emitting element 3125 that can function as a display element.

One of a source electrode and a drain electrode of the transistor 3431 is electrically connected to the signal line 3136 in the n-th column to which a data signal is supplied (hereinafter referred to as a signal line DL_n). A gate electrode of the transistor 3431 is electrically connected to the scan line 3135 in the m-th row to which a gate signal is supplied (hereinafter referred to as a scan line GL_m).

The transistor 3431 has a function of controlling whether to write a data signal to anode 3435.

One of a pair of electrodes of the capacitor 3233 is electrically connected to the node 3435, and the other of the pair of electrodes of the capacitor 3233 is electrically connected to a node 3437. The other of the source electrode and the drain electrode of the transistor 3431 is electrically connected to the node 3435.

The capacitor 3233 functions as a storage capacitor for storing data written to the node 3435.

One of a source electrode and a drain electrode of the transistor 3232 is electrically connected to a potential supply line VL_a, and the other of the source electrode and the drain electrode of the transistor 3232 is electrically connected to the node 3437. A gate electrode of the transistor 3232 is electrically connected to the node 3435.

One of a source electrode and a drain electrode of the transistor 3434 is electrically connected to a potential supply line VL_C, and the other of the source electrode and the drain electrode of the transistor 3434 is electrically connected to the node 3437. A gate electrode of the transistor 3434 is electrically connected to the scan line GL_m.

One of an anode and a cathode of the light-emitting element 3125 is electrically connected to a potential supply line VL_b, and the other of the anode and the cathode of the light-emitting element 3125 is electrically connected to the node 3437.

As the light-emitting element 3125, an organic electroluminescent element (also referred to as an organic EL element) can be used, for example. Note that the light-emitting element 3125 is not limited thereto and may be an inorganic EL element containing, for example, an inorganic material.

For example, the potential supply line VL_a has a function of supplying VDD. The potential supply line VL_b has a function of supplying VSS. The potential supply line VL_c has a function of supplying VSS.

An operation example of a display device including the pixel circuit 3137 illustrated in FIGS. 22A1 and 22A2 is described here. First, the circuit 3132 sequentially selects the pixel circuits 3137 row by row. In each of the pixel circuits 3137, the transistor 3431 is turned on so that a data signal (potential) is written into the node 3435. Next, the transistor 3434 is turned on, and the potential of the node 3437 is set to VSS.

Then, the transistor 3431 is turned off and the data signal written to the node 3435 is retained. Next, the transistor 3434 is turned off. The amount of current flowing between the source and the drain of the transistor 3232 is determined by the data signal written to the node 3435. Thus, the light-emitting element 3125 emits light with a luminance corresponding to the amount of flowing current. This operation is sequentially performed row by row; thus, an image can be displayed.

A plurality of pixels 3130 may each be used as a subpixel, and the subpixels may emit light in different wavelength ranges, so that a color image can be displayed. For example, the pixel 3130 that emits light in a red wavelength range, the pixel 3130 that emits light in a green wavelength range, and the pixel 3130 that emits light in a blue wavelength range are used as one pixel.

The combination of the wavelength ranges of light is not limited to red, green, and blue and may be cyan, yellow, and magenta. When subpixels that emit light in at least three different wavelength ranges are provided in one pixel, a full-color image can be displayed.

A subpixel that emits light in a yellow wavelength range may be used, in addition to red, green, and blue. A subpixel that emits light in a blue wavelength range may be used in addition to cyan, yellow, and magenta. When subpixels that emit light in four or more different wavelength ranges are provided in one pixel, the reproducibility of colors of a displayed image can be further increased.

The pixel number ratio (or the ratio of light-emitting area) of red to green and blue used for one pixel need not necessarily be 1:1:1. For example, the pixel number ratio (the ratio of light-emitting area) of red to green and blue may be 1:1:2. Alternatively, the pixel number ratio (the ratio of light-receiving area) of red to green and blue may be 1:2:3.

A subpixel that emits white light may be combined with red, green, and blue color filters or the like to enable full-color display. Alternatively, a subpixel that emits light in a red wavelength range, a subpixel that emits light in a green wavelength range, and a subpixel that emits light in a blue wavelength range may be combined with a color filter that transmits light in a red wavelength range, a color filter that transmits light in a green wavelength range, and a color filter that transmits light in a blue wavelength range, respectively.

<Example of Pixel Circuit for Liquid Crystal Display Device>

FIGS. 22B1 and 22B2 illustrate examples of a pixel circuit that can be used for a liquid crystal display device. The pixel circuit 3137 illustrated in FIGS. 22B1 and 22B2 includes a transistor 3431 and a capacitor 3233. In a circuit diagram of FIG. 22B2, the transistor 3431 includes a back gate electrode. The pixel circuit 3137 is electrically connected to a liquid crystal element 3432 that can function as a display element.

The potential of one of a pair of electrodes of the liquid crystal element 3432 is set in accordance with the specifications of the pixel circuit 3137 as appropriate. The alignment state of a liquid crystal in the liquid crystal element 3432 depends on data written to a node 3436. A common potential may be applied to one of the pair of electrodes of the liquid crystal element 3432 included in each of the plurality of pixel circuits 3137.

As examples of a mode of the liquid crystal element 3432, the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples include an electrically controlled birefringence (ECB) mode, a polymer dispersed liquid crystal (PDLC) mode, a polymer network liquid crystal (PNLC) mode, and a guest-host mode. Note that the present invention is not limited to these modes, and various modes can be used.

In the pixel circuit 3137 in the m-th row and the n-th column, one of the source electrode and the drain electrode of the transistor 3431 is electrically connected to a signal line DL_n, and the other is electrically connected to the node 3436. The gate electrode of the transistor 3431 is electrically connected to the scan line GL_m. The transistor 3431 has a function of controlling whether to write a data signal to the node 3436.

One of the pair of electrodes of the capacitor 3233 is electrically connected to a wiring to which a particular potential is supplied (hereinafter also referred to as a "capacitor line CL"), and the other is electrically connected to the node 3436. The other of the pair of electrodes of the liquid crystal element 3432 is electrically connected to the node 3436. The potential of the capacitor line CL is set in accordance with the specifications of the pixel circuit 3137 as appropriate. The capacitor 3233 functions as a storage capacitor for storing data written to the node 3436.

An operation example of a display device including the pixel circuit 3137 illustrated in FIG. 21C is described here.

First, the circuit 3132 sequentially selects the pixel circuits 3137 row by row. In each of the pixel circuits 3137, the transistor 3431 is turned on so that a data signal is written into the node 3436.

Then, the transistor 3431 is turned off and the data signal written to the node 3436 is stored. The amount of light transmitted through the liquid crystal element 3432 is determined in accordance with the data signal written to the node 3436. This operation is sequentially performed row by row; thus, an image can be displayed on the display region 3131.

<Display Element>

The display device of one embodiment of the present invention can employ various modes and can include various elements. The display element includes at least one of an electroluminescence (EL) element (e.g., an EL element including organic and inorganic materials, an organic EL element, or an inorganic EL element) including, an LED (e.g., a white LED, a red LED, a green LED, or a blue LED), a transistor (a transistor that emits light depending on current), an electron emitting element, a plasma display panel (PDP), a liquid crystal element, an electrophoretic element, a display element using micro electro mechanical systems (MEMS) such as a grating light valve (GLV), a digital micromirror device (DMD), a digital micro shutter (DMS) element, a MIRASOL (registered trademark) display, an interferometric modulator display (IMOD) element, and a piezoelectric ceramic display, an electrowetting element, and the like. Other than the above, the display device may contain a display medium whose contrast, luminance, reflectance, transmittance, or the like is changed by electrical or magnetic action. Alternatively, quantum dots may be used as the display element. Examples of display devices having EL elements include an EL display. Examples of a display device including an electron emitter include a field emission display (FED) and an SED-type flat panel display (SED: surface-conduction electron-emitter display). Examples of display devices including quantum dots include a quantum dot display. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of display devices having electrophoretic elements include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

This embodiment can be implemented in an appropriate combination with any of the structures described in the other embodiments.

Embodiment 4

In this embodiment, an example of a transistor which can be used instead of the transistor 232 described in the above embodiments will be described with reference to FIGS. 23A1 to 31B. A transistor disclosed in this specification and the like can be applied to the transistors 3431, 3434, and the like.

The display device 100 of one embodiment of the present invention can be fabricated by using a transistor with any of various structures, such as a bottom-gate transistor, a top-gate transistor, or the like. Therefore, a material for a semiconductor layer or the structure of a transistor can be easily changed depending on the existing production line.
[Bottom-Gate Transistor]

FIG. 23A1 is a cross-sectional view of a transistor 410 that is a channel-protective transistor, which is a type of bottom-gate transistor. In FIG. 23A1, the transistor 410 is formed over a substrate 271. The transistor 410 includes an electrode 246 over the substrate 271 with an insulating layer 272 provided therebetween. The transistor 410 includes a semiconductor layer 242 over the electrode 246 with an insulating layer 226 provided therebetween. The electrode 246 can function as a gate electrode. The insulating layer 226 can function as a gate insulating layer.

The transistor 410 includes an insulating layer 241 over a channel formation region in the semiconductor layer 242. The transistor 410 includes an electrode 244a and an electrode 244b which are partly in contact with the semiconductor layer 242 and over the insulating layer 226. The electrode 244a can function as one of a source electrode and a drain electrode. The electrode 244b can function as the other of the source electrode and the drain electrode. Part of the electrode 244a and part of the electrode 244b are formed over the insulating layer 241.

The insulating layer 241 can function as a channel protective layer. With the insulating layer 241 provided over the channel formation region, the semiconductor layer 242 can be prevented from being exposed at the time of forming the electrodes 244a and 244b. Thus, the channel formation region in the semiconductor layer 242 can be prevented from being etched at the time of forming the electrodes 244a and 244b. In accordance with one embodiment of the present invention, a transistor with favorable electrical characteristics can be provided.

The transistor 410 includes an insulating layer 228 over the electrode 244a, the electrode 244b, and the insulating layer 241 and further includes an insulating layer 229 over the insulating layer 228.

The insulating layer 272 can be formed using a material and a method similar to those of the insulating layers 222 and 205. Note that the insulating layer 272 may be formed of a stack of insulating layers. For example, the semiconductor layer 242 can be formed using a material and a method similar to those of the semiconductor layer 208. Note that the semiconductor layer 242 may be formed of a stack of semiconductor layers. For example, the electrode 246 can be formed using a material and a method similar to those of the electrode 206. Note that the electrode 246 may be formed of a stack of conductive layers. The insulating layer 226 can be formed using a material and a method that are similar to those of the insulating layer 207. Note that the insulating layer 226 may be formed of a stack of insulating layers. For example, the electrodes 244a and 244b can be formed using a material and a method similar to those of the electrode 214 or 215. Note that the electrodes 244a and 244b may be formed of a stack of conductive layers. The insulating layer 241 can be formed using a material and a method that are similar to those of the insulating layer 226. Note that the insulating layer 241 may be formed of a stack of insulating layers. The insulating layer 228 can be formed using a material and a method that are similar to those of the insulating layer 210. Note that the insulating layer 228 may be formed of a stack of insulating layers. The insulating layer 229 can be formed using a material and a method that are similar to those of the insulating layer 211. Note that the insulating layer 229 may be formed of a stack of insulating layers.

The electrode, the semiconductor layer, the insulating layer, and the like used in the transistor disclosed in this embodiment can be formed using a material and a method disclosed in any of the other embodiments.

In the case where an oxide semiconductor is used for the semiconductor layer 242, a material capable of removing oxygen from part of the semiconductor layer 242 to generate oxygen vacancies is preferably used for regions of the electrodes 224a and 224b that are in contact with at least the semiconductor layer 242. The carrier concentration in the regions of the semiconductor layer 242 where oxygen vacancies are generated is increased, so that the regions become n-type regions (n+ layers). Accordingly, the regions can function as a source region and a drain region. When an oxide semiconductor is used for the semiconductor layer 242, examples of the material capable of removing oxygen from the semiconductor layer 242 to generate oxygen vacancies include tungsten and titanium.

Formation of the source region and the drain region in the semiconductor layer 242 makes it possible to reduce contact resistance between the semiconductor layer 242 and each of the electrodes 224a and 224b. Accordingly, the electric characteristics of the transistor, such as the field-effect mobility and the threshold voltage, can be favorable.

In the case where a semiconductor such as silicon is used for the semiconductor layer 242, a layer that functions as an n-type semiconductor or a p-type semiconductor is preferably provided between the semiconductor layer 242 and the electrode 224a and between the semiconductor layer 242 and the electrode 224b. The layer that functions as an n-type semiconductor or a p-type semiconductor can function as the source region or the drain region in the transistor.

The insulating layer 229 is preferably formed using a material that can prevent or reduce diffusion of impurities into the transistor from the outside. The formation of the insulating layer 229 may also be omitted.

When an oxide semiconductor is used for the semiconductor layer 242, heat treatment may be performed before and/or after the insulating layer 229 is formed. The heat treatment can fill oxygen vacancies in the semiconductor layer 242 by diffusing oxygen contained in the insulating layer 229 or other insulating layers into the semiconductor layer 242. Alternatively, the insulating layer 229 may be formed while the heat treatment is performed, so that oxygen vacancies in the semiconductor layer 242 can be filled.

Note that a CVD method can be generally classified into a plasma enhanced CVD (PECVD) method using plasma, a thermal CVD (TCVD) method using heat, and the like. A CVD method can further be classified into a metal CVD (MCVD) method, a metal organic CVD (MOCVD) method, and the like according to a source gas to be used.

Furthermore, an evaporation method can be generally classified into a resistance heating evaporation method, an electron beam evaporation method, a molecular beam epitaxy (MBE) method, a pulsed laser deposition (PLD) method, an ion beam assisted deposition (IAD) method, an atomic layer deposition (ALD) method, and the like.

By using a PECVD method, a high-quality film can be formed at a relatively low temperature. By using a deposition method that does not use plasma for deposition, such as an MOCVD method or an evaporation method, a film with few defects can be formed because damage is not easily caused on a surface on which the film is deposited.

A sputtering method is generally classified into a DC sputtering method, a magnetron sputtering method, an RF sputtering method, an ion beam sputtering method, an electron cyclotron resonance (ECR) sputtering method, a facing-target sputtering method, and the like.

In a facing-target sputtering method, plasma is confined between targets; thus, plasma damage to a substrate can be reduced. Furthermore, step coverage can be improved because the incident angle of a sputtered particle to a substrate can be made smaller depending on the inclination of a target.

A transistor 411 illustrated in FIG. 23A2 is different from the transistor 410 in that an electrode 223 that can function as a back gate electrode is provided over the insulating layer 229. The electrode 223 can be formed using a material and a method similar to those of the electrode 246.

In general, a back gate electrode is formed using a conductive layer and positioned so that a channel formation region of a semiconductor layer is positioned between a gate electrode and the back gate electrode. Thus, the back gate electrode can function in a manner similar to that of the gate electrode. The potential of the back gate electrode may be the same as that of the gate electrode or may be a ground (GND) potential or a predetermined potential. By changing the potential of the back gate electrode independently of the potential of the gate electrode, the threshold voltage of the transistor can be changed.

The electrode 246 and the electrode 223 can each function as a gate electrode. Thus, the insulating layers 226, 228, and 229 can each function as a gate insulating layer. The electrode 223 may also be provided between the insulating layers 228 and 229.

In the case where one of the electrode 246 and the electrode 223 is simply referred to as a "gate electrode", the other can be referred to as a "back gate electrode". For example, in the transistor 411, in the case where the electrode 223 is referred to as a "gate electrode", the electrode 246 is referred to as a "back gate electrode". In the case where the electrode 223 is used as a "gate electrode", the transistor 411 is a kind of top-gate transistor. Alternatively, one of the electrode 246 and the electrode 223 may be referred to as a "first gate electrode", and the other may be referred to as a "second gate electrode".

By providing the electrode 246 and the electrode 223 with the semiconductor layer 242 provided therebetween and setting the potentials of the electrode 246 and the electrode 223 to be the same, a region of the semiconductor layer 242 through which carriers flow is enlarged in the film thickness direction; thus, the number of transferred carriers is increased. As a result, the on-state current and field-effect mobility of the transistor 411 are increased.

Therefore, the transistor 411 has a comparatively high on-state current for its area. That is, the area of the transistor 411 can be small for a required on-state current. In accordance with one embodiment of the present invention, the area of a transistor can be reduced. Therefore, in accordance with one embodiment of the present invention, a semiconductor device having a high degree of integration can be provided.

The gate electrode and the back gate electrode are formed using conductive layers and thus each have a function of preventing an electric field generated outside the transistor from influencing the semiconductor layer in which the channel is formed (in particular, an electric field blocking function against static electricity and the like). When the back gate electrode is formed larger than the semiconductor layer such that the semiconductor layer is covered with the back gate electrode, the electric field blocking function can be enhanced.

Since the electrode 246 and the electrode 223 each have a function of blocking an electric field generated outside, electric charge of charged particles and the like generated on the insulating layer 272 side or above the electrode 223 do not influence the channel formation region in the semiconductor layer 242. Thus, degradation by a stress test (e.g., a negative gate bias temperature (−GBT) stress test in which negative electric charge is applied to a gate) can be reduced. Furthermore, a change in gate voltage (rising voltage) at which on-state current starts flowing depending on drain voltage can be reduced. Note that this effect is obtained when the electrodes 246 and 223 have the same potential or different potentials.

The BT stress test is one kind of acceleration test and can evaluate, in a short time, a change by long-term use (i.e., a change over time) in characteristics of a transistor. In particular, the amount of change in threshold voltage of a transistor before and after the BT stress test is an important indicator when examining the reliability of the transistor. As the change in the threshold voltage is smaller, the transistor has higher reliability.

By providing the electrodes 246 and 223 and setting the potentials of the electrodes 246 and 223 to be the same, the amount of change in threshold voltage is reduced. Accordingly, variations in electrical characteristics among a plurality of transistors are also reduced.

A transistor including a back gate electrode has a smaller change in threshold voltage before and after a positive GBT stress test, in which positive electric charge is applied to a gate, than a transistor including no back gate electrode.

When the back gate electrode is formed using a light-blocking conductive film, light can be prevented from entering the semiconductor layer from the back gate electrode side. Therefore, photodegradation of the semiconductor layer can be prevented, and deterioration in electrical characteristics of the transistor, such as a shift of the threshold voltage, can be prevented.

In accordance with one embodiment of the present invention, a transistor with high reliability can be provided. Moreover, a semiconductor device with high reliability can be provided.

FIG. 23B1 is a cross-sectional view of a channel-protective transistor 420 that is a type of bottom-gate transistor. The transistor 420 has substantially the same structure as the transistor 410 but is different from the transistor 410 in that the insulating layer 229 covers the semiconductor layer 242. The semiconductor layer 242 is electrically connected to the electrode 244a through an opening formed by selectively removing part of the insulating layer 229 which overlaps with the semiconductor layer 242. The semiconductor layer 242 is electrically connected to the electrode 244b through another opening formed by selectively removing part of the insulating layer 229 which overlaps with the semiconductor layer 242. A region of the insulating layer 229 which overlaps with the channel formation region can function as a channel protective layer.

A transistor 421 illustrated in FIG. 23B2 is different from the transistor 420 in that the electrode 223 that can function as a back gate electrode is provided over the insulating layer 229.

With the insulating layer 229, the semiconductor layer 242 can be prevented from being exposed at the time of forming the electrodes 244a and 244b. Thus, the semiconductor layer 242 can be prevented from being reduced in thickness at the time of forming the electrodes 244a and 244b.

The length between the electrode 244a and the electrode 246 and the length between the electrode 244b and the electrode 246 in the transistors 420 and 421 are larger than those in the transistors 410 and 411. Thus, the parasitic capacitance generated between the electrode 244a and the electrode 246 can be reduced. Moreover, the parasitic capacitance generated between the electrode 244b and the electrode 246 can be reduced. In accordance with one embodiment of the present invention, a transistor with favorable electrical characteristics can be provided.

A transistor 425 illustrated in FIG. 23C1 is a channel-etched transistor that is a type of bottom-gate transistor. In the transistor 425, the electrodes 244a and 244b are formed without providing the insulating layer 229. Thus, part of the semiconductor layer 242 that is exposed at the time forming the electrodes 244a and 244b is etched in some cases. However, since the insulating layer 229 is not provided, the productivity of the transistor can be increased.

A transistor 420 illustrated in FIG. 23C2 is different from the transistor 425 in that the electrode 223 which can function as a back gate electrode is provided over the insulating layer 229.

[Top-Gate Transistor]

FIG. 24A1 is a cross-sectional view of a transistor 430 that is a type of top-gate transistor. The transistor 430 includes the semiconductor layer 242 over the insulating layer 272, the electrodes 244a and 244b that are over the semiconductor layer 242 and the insulating layer 272 and in contact with part of the semiconductor layer 242, the insulating layer 226 over the semiconductor layer 242 and the electrodes 244a and 244b, and the electrode 246 over the insulating layer 226.

Since the electrode 246 overlaps with neither the electrode 244a nor the electrode 244b in the transistor 430, the parasitic capacitance generated between the electrodes 246 and 244a and the parasitic capacitance generated between the electrodes 246 and 244b can be reduced. After the formation of the electrode 246, an impurity 255 is introduced into the semiconductor layer 242 using the electrode 246 as a mask, so that an impurity region can be formed in the semiconductor layer 242 in a self-aligned manner (see FIG. 24A3). In accordance with one embodiment of the present invention, a transistor with favorable electrical characteristics can be provided.

The introduction of the impurity 255 can be performed with an ion implantation apparatus, an ion doping apparatus, or a plasma treatment apparatus.

As the impurity 255, for example, at least one kind of element of Group 13 elements and Group 15 elements can be used. In the case where an oxide semiconductor is used for the semiconductor layer 242, it is possible to use at least one kind of element of a rare gas, hydrogen, and nitrogen as the impurity 255.

A transistor 431 illustrated in FIG. 24A2 is different from the transistor 430 in that the electrode 223 and the insulating layer 227 are included. The transistor 431 includes the electrode 223 formed over the insulating layer 272 and the insulating layer 227 formed over the electrode 223. The electrode 223 can function as a back gate electrode. Thus, the insulating layer 227 can function as a gate insulating layer. The insulating layer 227 can be formed using a material and a method similar to those of the insulating layer 226.

Like the transistor 411, the transistor 431 has a high on-state current for its area. That is, the area of the transistor 431 can be small for a required on-state current. In accordance with one embodiment of the present invention, the area of a transistor can be reduced. Therefore, in accordance with one embodiment of the present invention, a semiconductor device having a high degree of integration can be provided.

A transistor 440 illustrated in FIG. 24B1 is a type of top-gate transistor. The transistor 440 is different from the transistor 430 in that the semiconductor layer 242 is formed after the formation of the electrodes 244a and 244b. A transistor 441 illustrated in FIG. 24B2 is different from the transistor 440 in that the electrode 223 and the insulating layer 227 are included. In the transistors 440 and 441, part of the semiconductor layer 242 is formed over the electrode 244a and another part of the semiconductor layer 242 is formed over the electrode 244b.

Like the transistor 411, the transistor 441 has a high on-state current for its area. That is, the area of the transistor 441 can be small for a required on-state current. In accordance with one embodiment of the present invention, the area of a transistor can be reduced. Therefore, in accordance with one embodiment of the present invention, a semiconductor device having a high degree of integration can be provided.

A transistor 442 illustrated in FIG. 25A1 is a type of top-gate transistor. The transistor 442 is different from the transistor 430 or 440 in that the electrodes 244a and 244b are formed after the formation of the insulating layer 229. The electrodes 244a and 244b are electrically connected to the semiconductor layer 242 through openings formed in the insulating layers 228 and 229.

Part of the insulating layer 226 that does not overlap with the electrode 246 is removed, and the impurity 255 is introduced into the semiconductor layer 242 using the electrode 246 and the insulating layer 226 that is left as a mask, so that an impurity region can be formed in the semiconductor layer 242 in a self-aligned manner (see FIG. 25A3). The transistor 442 includes a region where the insulating layer 226 extends beyond an end portion of the electrode 246. The semiconductor layer 242 in a region into which the impurity 255 is introduced through the insulating layer 226 has a lower impurity concentration than the semiconductor layer 242 in a region into which the impurity 255 is introduced without through the insulating layer 226. Thus, a lightly doped drain (LDD) region is formed in a region adjacent to a region of the semiconductor layer 242 which overlaps with the electrode 246.

A transistor 443 illustrated in FIG. 25A2 is different from the transistor 442 in that the electrode 223 is included. The transistor 443 includes the electrode 223 that is formed over the substrate 271 and overlaps with the semiconductor layer 242 with the insulating layer 272 provided therebetween. The electrode 223 can function as a back gate electrode.

As in a transistor 444 illustrated in FIG. 25B1 and a transistor 445 illustrated in FIG. 25B2, the insulating layer 226 in a region that does not overlap with the electrode 246 may be completely removed. Alternatively, as in a transistor 446 illustrated in FIG. 25C1 and a transistor 447 illustrated in FIG. 25C2, the insulating layer 226 may be left.

In the transistors 442 to 447, after the formation of the electrode 246, the impurity 255 is introduced into the semiconductor layer 242 using the electrode 246 as a mask, so that an impurity region can be formed in the semiconductor layer 242 in a self-aligned manner. In accordance with one embodiment of the present invention, a transistor with favorable electrical characteristics can be provided. Furthermore, in accordance with one embodiment of the present invention, a semiconductor device having a high degree of integration can be provided.

[S-Channel Transistor]

FIGS. 26A to 26C illustrate an example of the structure of a transistor using an oxide semiconductor for the semiconductor layer 242. In a transistor 450 illustrated in FIGS. 26A to 26C, a semiconductor layer 242b is formed over a semiconductor layer 242a, and a semiconductor layer 242c covers a top surface and a side surface of the semiconductor layer 242b and a side surface of the semiconductor layer 242a. FIG. 26A is a top view of the transistor 450. FIG. 26B is a cross-sectional view (in the channel length direction) taken along the dashed-dotted line X1-X2 in FIG. 26A. FIG. 26C is a cross-sectional view (in the channel width direction) taken along the dashed-dotted line Y1-Y2 in FIG. 26A.

The transistor 450 includes the electrode 243 functioning as a gate electrode. The electrode 243 can be formed using a material and a method similar to those of the electrode 246. The electrode 243 is formed of two conductive layers in this embodiment.

Each of the semiconductor layer 242a, the semiconductor layer 242b, and the semiconductor layer 242c is formed using a material containing either In or Ga or both of them. Typical examples are an In—Ga oxide (an oxide containing In and Ga), an In—Zn oxide (an oxide containing In and Zn), and an In-M-Zn oxide (an oxide containing In, an element M, and Zn). The element M is one or more kinds of elements selected from Al, Ti, Ga, Y, Zr, La, Ce, Nd, and Hf and has a higher strength of bonding with oxygen than that of In.

The semiconductor layer 242a and the semiconductor layer 242c are preferably formed using a material containing one or more kinds of metal elements contained in the semiconductor layer 242b. With the use of such a material, interface states are less likely to be generated at the interface between the semiconductor layer 242a and the semiconductor layer 242b and at the interface between the semiconductor layer 242c and the semiconductor layer 242b. Accordingly, carriers are not likely to be scattered or captured at the interfaces, which results in an improvement in field-effect mobility of the transistor. Furthermore, variation in threshold voltage of the transistor can be reduced. Thus, a semiconductor device having favorable electrical characteristics can be obtained.

Each of the thicknesses of the semiconductor layers 242a and 242c is greater than or equal to 3 nm and less than or equal to 100 nm, preferably greater than or equal to 3 nm and less than or equal to 50 nm. The thickness of the semiconductor layer 242b is greater than or equal to 3 nm and less than or equal to 200 nm, preferably greater than or equal to 3 nm and less than or equal to 100 nm, more preferably greater than or equal to 3 nm and less than or equal to 50 nm.

In the case where the semiconductor layer 242b includes an In-M-Zn oxide and the semiconductor layers 242a and 242c each also include an In-M-Zn oxide, the semiconductor layers 242a and 242c each have the atomic ratio where In:M:Zn=$x_1$:$y_1$:$z_1$, and the semiconductor layer 242b has an atomic ratio where In:M:Zn=$x_2$:$y_2$:$z_2$, for example. In that case, the compositions of the semiconductor layers 242a, 242c, and 242b can be determined so that $y_1/x_1$ is larger than $y_2/x_2$. It is preferable that the compositions of the semiconductor layers 242a, 242c, and 242b be determined so that $y_1/x_1$ is 1.5 times or more as large as $y_2/x_2$. It is more preferable that the compositions of the semiconductor layers 242a, 242c, and 242b be determined so that $y_1/x_1$ is twice or more as large as $y_2/x_2$. It is more preferable that the compositions of the semiconductor layers 242a, 242c, and 242b be determined so that $y_1/x_1$ is three times or more as large as $y_2/x_2$. It is preferable that $y_1$ be greater than or equal to $x_1$ because the transistor can have stable electrical characteristics. However, when $y_1$ is three times or more as large as $x_1$, the field-effect mobility of the transistor is reduced; accordingly, $y_1$ is preferably smaller than three times $x_1$. When the semiconductor layer 242a and the semiconductor layer 242c have the above compositions, the semiconductor layer 242a and the semiconductor layer 242c can each be a layer in which oxygen vacancies are less likely to be generated than in the semiconductor layer 242b.

In the case where the semiconductor layer 242a and the semiconductor layer 242c each include an In-M-Zn oxide, the percentages of In and the element M when the summation of In and M is assumed to be 100 atomic % are preferably as follows: the percentage of In is lower than 50 atomic % and the percentage of the element M is higher than or equal to 50 atomic %. The percentages of In and the element M are more preferably as follows: the percentage of In is lower than 25 atomic % and the percentage of the element M is higher than or equal to 75 atomic %. In the case where the semiconductor layer 242b includes an In-M-Zn oxide, the percentages of In and the element M are preferably as follows: the percentage of In is higher than or equal to 25 atomic % and the percentage of the element M is lower than 75 atomic %. The percentages of In and the element M are more preferably as follows: the percentage of In is higher than or equal to 34 atomic % and the percentage of the element M is lower than 66 atomic %.

For example, an In—Ga—Zn oxide that is formed using a target having an atomic ratio of In:Ga:Zn=1:3:2, 1:3:4, 1:3:6, 1:6:4, or 1:9:6, an In—Ga oxide that is formed using a target having an atomic ratio of In:Ga=1:9, or gallium oxide can be used for each of the semiconductor layers 242a and 242c containing In or Ga. Furthermore, an In—Ga—Zn oxide that is formed using a target having an atomic ratio of In:Ga:Zn=3:1:2, 1:1:1, 5:5:6, or 4:2:4.1 can be used for the semiconductor layer 242b. Note that the atomic ratio of each of the semiconductor layers 242a, 242b, and 242c may vary within a range of ±20% of any of the above-described atomic ratios as an error.

To give stable electrical characteristics to the transistor including the semiconductor layer 242b, it is preferable that impurities and oxygen vacancies in the semiconductor layer 242b be reduced to obtain a highly purified oxide semiconductor layer and accordingly the semiconductor layer 242b can be regarded as an intrinsic or substantially intrinsic oxide semiconductor layer. Furthermore, it is preferable that at least the channel formation region of the semiconductor layer 242b be regarded as an intrinsic or substantially intrinsic oxide semiconductor layer.

Note that the substantially intrinsic oxide semiconductor layer refers to an oxide semiconductor layer in which the carrier density is higher than or equal to $1 \times 10^9/cm^3$ and lower than $8 \times 10^{11}/cm^3$, preferably lower than $1 \times 10^{11}/cm^3$, more preferably lower than $1 \times 10^{10}/cm^3$.

Figure 27C:
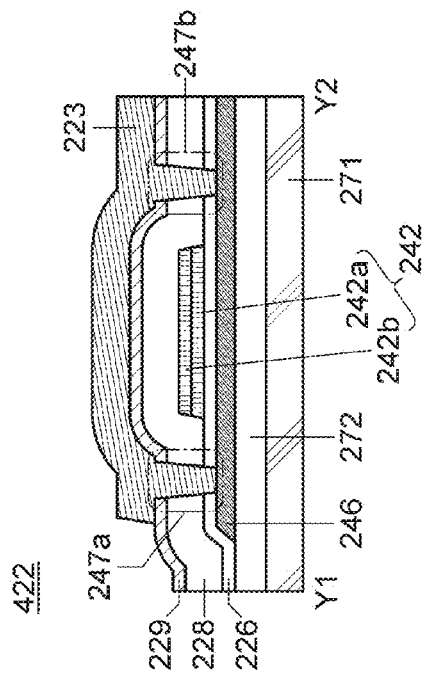
FIGS. 27A to 27C are a plan view and cross-sectional views illustrating one embodiment of a transistor.
Figure 27A:
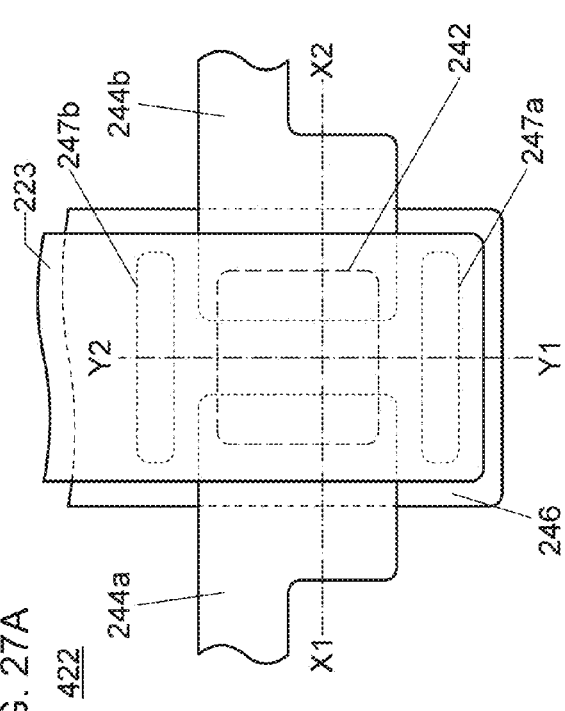
Figure 27B:
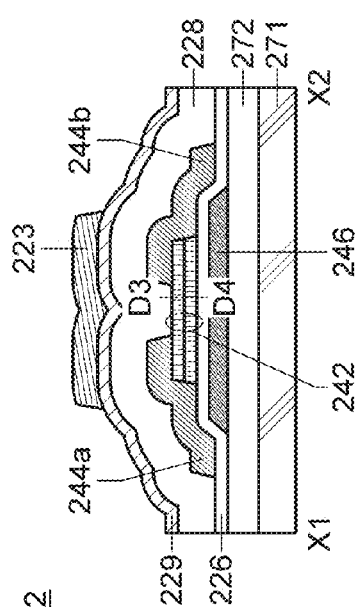

FIGS. 27A to 27C illustrate an example of the structure of a transistor using an oxide semiconductor for the semiconductor layer 242. In a transistor 422 illustrated in FIGS. 27A to 27C, the semiconductor layer 242b is formed over the semiconductor layer 242a. The transistor 422 is a kind of bottom-gate transistor including a back gate electrode. FIG. 27A is a top view of the transistor 422. FIG. 27B is a cross-sectional view (in the channel length direction) taken along the dashed-dotted line X1-X2 in FIG. 27A. FIG. 27C is a cross-sectional view (in the channel width direction) taken along the dashed-dotted line Y1-Y2 in FIG. 27A.

The electrode 223 provided over the insulating layer 229 is electrically connected to the electrode 246 through an opening 247a and an opening 247b provided in the insulating layers 226, 228, and 229. Thus, the same potential is supplied to the electrodes 223 and 246. Furthermore, either or both of the openings 247a and 247b may be omitted. In the case where both the openings 247a and 247b are omitted, different potentials can be supplied to the electrodes 223 and 246.

[Energy Band Structure of Oxide Semiconductor]

Figure 31A:
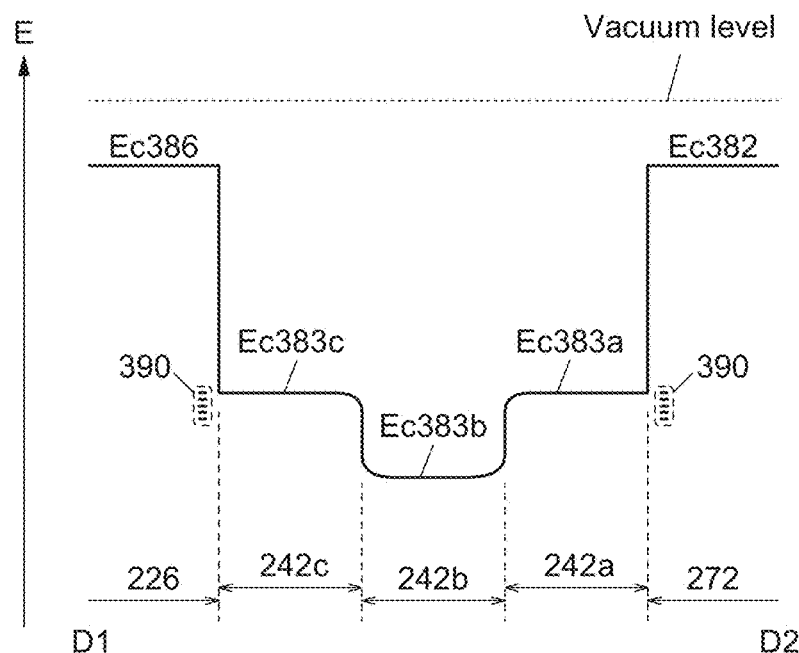
FIGS. 31A and 31B show energy band structures.
Figure 31B:
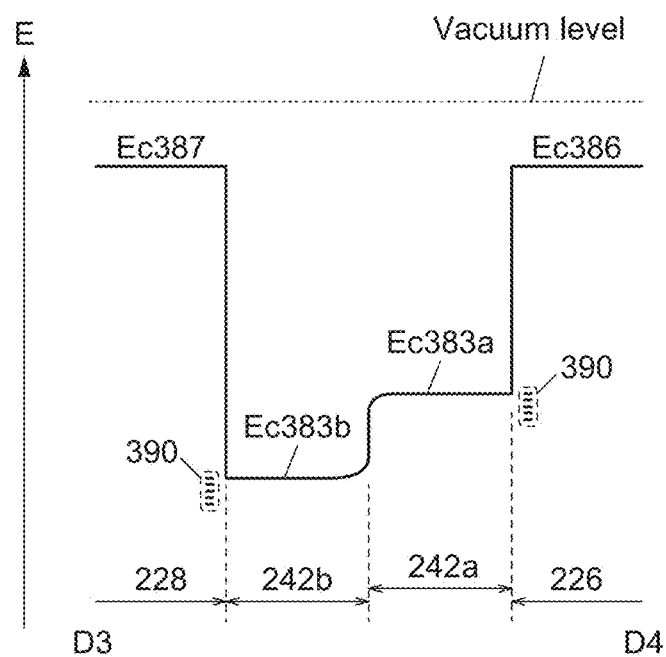

The function and effect of the semiconductor layer 242 that is a stacked layer including the semiconductor layers 242a, 242b, and 242c are described with an energy band structure diagram shown in FIGS. 31A and 31B. FIG. 31A is the energy band structure diagram showing a portion along the dashed-dotted line D1-D2 in FIG. 26B. FIG. 31A illustrates the energy band structure of a channel formation region of the transistor 450.

In FIG. 31A, Ec382, Ec383a, Ec383b, Ec383c, and Ec386 indicate the energy of the conduction band minimum of the insulating layer 272, the semiconductor layer 242a, the semiconductor layer 242b, the semiconductor layer 242c, and the insulating layer 226, respectively.

Here, a difference in energy between the vacuum level and the conduction band minimum (the difference is also referred to as "electron affinity") corresponds to a value obtained by subtracting an energy gap from a difference in energy between the vacuum level and the valence band maximum (the difference is also referred to as an ionization potential). Note that the energy gap can be measured with a spectroscopic ellipsometer (e.g., UT-300 by HORIBA JOBIN YVON S.A.S.). The energy difference between the vacuum level and the valence band maximum can be measured with an ultraviolet photoelectron spectroscopy (UPS) device (e.g., VersaProbe by ULVAC-PHI, Inc.).

Note that an In—Ga—Zn oxide which is formed using a target having an atomic ratio of In:Ga:Zn=1:3:2 has an energy gap of approximately 3.5 eV and an electron affinity of approximately 4.5 eV. An In—Ga—Zn oxide which is formed using a target having an atomic ratio of In:Ga:Zn=1:3:4 has an energy gap of approximately 3.4 eV and an electron affinity of approximately 4.5 eV. An In—Ga—Zn oxide which is formed using a target having an atomic ratio of In:Ga:Zn=1:3:6 has an energy gap of approximately 3.3 eV and an electron affinity of approximately 4.5 eV. An In—Ga—Zn oxide which is formed using a target having an atomic ratio of In:Ga:Zn=1:6:2 has an energy gap of approximately 3.9 eV and an electron affinity of approximately 4.3 eV. An In—Ga—Zn oxide which is formed using a target having an atomic ratio of In:Ga:Zn=1:6:8 has an energy gap of approximately 3.5 eV and an electron affinity of approximately 4.4 eV. An In—Ga—Zn oxide which is formed using a target having an atomic ratio of In:Ga:Zn=1:6:10 has an energy gap of approximately 3.5 eV and an electron affinity of approximately 4.5 eV. An In—Ga—Zn oxide which is formed using a target having an atomic ratio of In:Ga:Zn=1:1:1 has an energy gap of approximately 3.2 eV and an electron affinity of approximately 4.7 eV. An In—Ga—Zn oxide which is formed using a target having an atomic ratio of In:Ga:Zn=3:1:2 has an energy gap of approximately 2.8 eV and an electron affinity of approximately 5.0 eV.

Since the insulating layer 272 and the insulating layer 226 are insulators, Ec382 and Ec386 are closer to the vacuum level (have a smaller electron affinity) than Ec383a, Ec383b, and Ec383c.

Ec383a is closer to the vacuum level than Ec383b. Specifically, Ec383a is preferably closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

Ec383c is closer to the vacuum level than Ec383b. Specifically, Ec383c is preferably closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

In the vicinity of the interface between the semiconductor layer 242a and the semiconductor layer 242b and the vicinity of the interface between the semiconductor layer 242b and the semiconductor layer 242c, mixed regions are formed; thus, the energy of the conduction band minimum continuously changes. In other words, no state or few states exist at these interfaces.

Accordingly, electrons transfer mainly through the semiconductor layer 242b in the stacked-layer structure having the above energy band structure. Therefore, even when states exist at the interface between the semiconductor layer 242a and the insulating layer 272 or at the interface between the semiconductor layer 242c and the insulating layer 226, the states hardly influence the transfer of the electrons. In addition, the states do not exist or hardly exist at the interface between the semiconductor layer 242a and the semiconductor layer 242b and at the interface between the semiconductor layer 242c and the semiconductor layer 242b; thus, transfer of electrons is not prohibited in the regions. Consequently, high field-effect mobility can be obtained in the transistor having the stacked-layer structure of the above oxide semiconductors.

Note that although trap states 390 due to impurities or defects might be formed in the vicinity of the interface between the semiconductor layer 242a and the insulating layer 272 and in the vicinity of the interface between the semiconductor layer 242c and the insulating layer 226 as shown in FIG. 31A, the semiconductor layer 242b can be apart from the trap states owing to the existence of the semiconductor layer 242a and the semiconductor layer 242c.

In particular, in the transistor described in this embodiment, an upper surface and a side surface of the semiconductor layer 242b are in contact with the semiconductor layer 242c, and a lower surface of the semiconductor layer 242b is in contact with the semiconductor layer 242a. In this manner, the semiconductor layer 242b is covered by the semiconductor layers 242a and 242c, whereby the influence of the trap states can further be reduced.

Note that in the case where the energy difference between Ec383a and Ec383b or between Ec383c and Ec383b is small, electrons in the semiconductor layer 242b might reach the trap states by passing over the energy difference. The electrons are captured by the trap states, which generates negative fixed electric charge at the interface with the insulating layer, causing the threshold voltage of the transistor to be shifted in the positive direction.

Therefore, each of the energy differences between Ec383a and Ec383b and between Ec383c and Ec383b is set to be greater than or equal to 0.1 eV, preferably greater than or equal to 0.15 eV, in which case a variation in the threshold voltage of the transistor can be reduced and the transistor can have favorable electrical characteristics.

Each of the band gaps of the semiconductor layer 242a and the semiconductor layer 242c is preferably wider than that of the semiconductor layer 242b.

FIG. 31B is the energy band structure diagram showing a portion along the dashed-dotted line D3-D4 in FIG. 27B. FIG. 31B shows the energy band structure of a channel formation region of the transistor 422.

In FIG. 31B, Ec387 represents the energy of the conduction band minimum of the insulating layer 228. The semiconductor layer 242 is formed using two layers, the semiconductor layers 242a and 242b; thus, the transistor can be manufactured with improved productivity. Since the semiconductor layer 242c is not provided, the transistor including the two semiconductor layers is easily affected by the trap states 390 but can have higher field-effect mobility than a transistor including one semiconductor layer as the semiconductor layer 242.

In accordance with one embodiment of the present invention, a transistor with a small variation in electrical characteristics can be provided. Accordingly, a semiconductor device with a small variation in electrical characteristics can be provided. In accordance with one embodiment of the present invention, a transistor with high reliability can be provided. Accordingly, a semiconductor device with high reliability can be provided.

An oxide semiconductor has an energy gap as wide as 3.0 eV or more and a high visible-light transmissivity. In a transistor obtained by processing an oxide semiconductor under appropriate conditions, the off-state current at ambient temperature (e.g., 25° C.) can be lower than or equal to 100 zA ($1\times10^{-19}$ A), lower than or equal to 10 zA ($1\times10^{-20}$ A), and further lower than or equal to 1 zA ($1\times10^{-21}$ A). Therefore, a semiconductor device with low power consumption can be achieved.

In accordance with one embodiment of the present invention, a transistor with low power consumption can be provided. Accordingly, a display element or a semiconductor device such as a display device with low power consumption can be provided. Moreover, a display element or a semiconductor device such as a display device with high reliability can be provided.

The transistor 450 illustrated in FIGS. 26A to 26C is described again. When the semiconductor layer 242b is provided over the projection of the insulating layer 272, the side surface of the semiconductor layer 242b can also be covered with the electrode 243. Thus, the transistor 450 has a structure in which the semiconductor layer 242b can be electrically surrounded by an electric field of the electrode 243. Such a structure of a transistor in which a semiconductor layer in which a channel is formed is electrically surrounded by an electric field of a conductive film is called a surrounded channel (s-channel) structure. A transistor with an s-channel structure is referred to as an s-channel transistor.

In an s-channel structure, a channel can be formed in the whole (bulk) of the semiconductor layer 242b. In an s-channel structure, the drain current of the transistor can be increased, so that a larger amount of on-state current can be obtained. Furthermore, the entire channel formation region of the semiconductor layer 242b can be depleted by an electric field of the electrode 243. Accordingly, the off-state current of the transistor with an s-channel structure can further be reduced.

When the projection of the insulating layer 272 is increased in height and the channel width is shortened, the effects of an s-channel structure to increase the on-state current and reduce the off-state current can be enhanced. Part of the semiconductor layer 242a exposed at the time of forming the semiconductor layer 242b may be removed. In that case, the side surfaces of the semiconductor layer 242a and the semiconductor layer 242b may be aligned with each other.

Figure 28C:
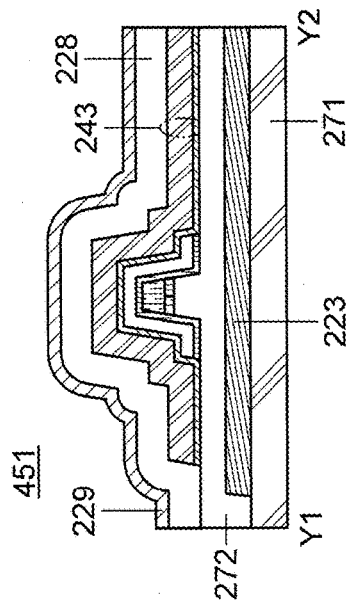
FIGS. 28A to 28C are a plan view and cross-sectional views illustrating one embodiment of a transistor.
Figure 28A:
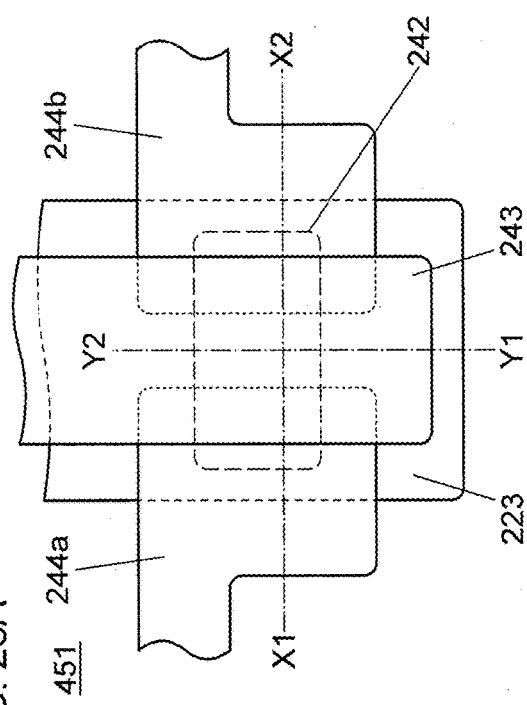
Figure 28B:
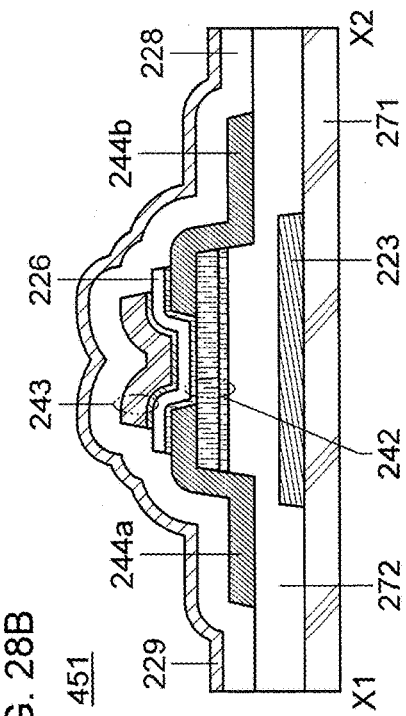

As in a transistor 451 illustrated in FIGS. 28A to 28C, the electrode 223 may be provided below the semiconductor layer 242 with an insulating layer provided therebetween. FIG. 28A is a top view of the transistor 451. FIG. 28B is a cross-sectional view taken along the dashed-dotted line X1-X2 in FIG. 28A. FIG. 28C is a cross-sectional view taken along the dashed-dotted line Y1-Y2 in FIG. 28A.

Figure 29A:
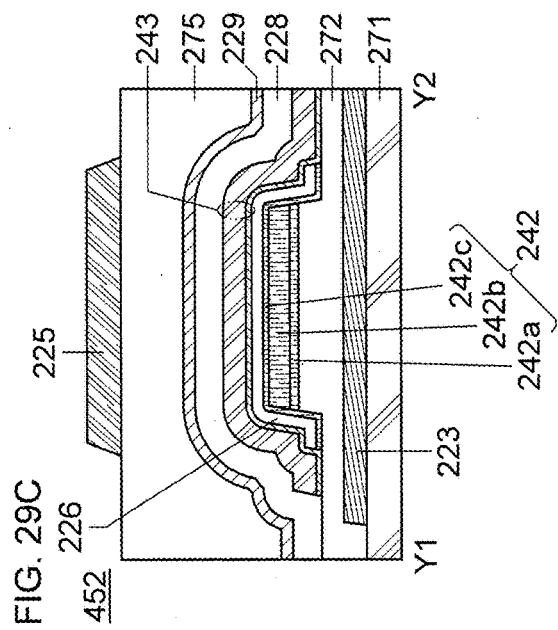
FIGS. 29A to 29C are a plan view and cross-sectional views illustrating one embodiment of a transistor.
Figure 29B:
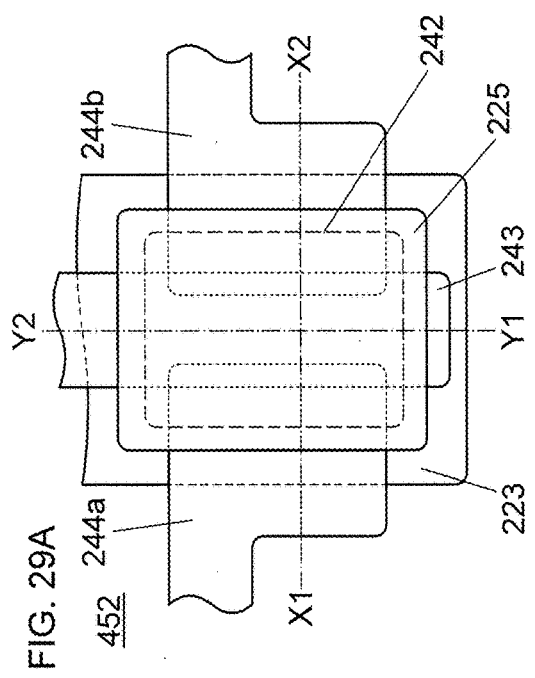
Figure 29C:
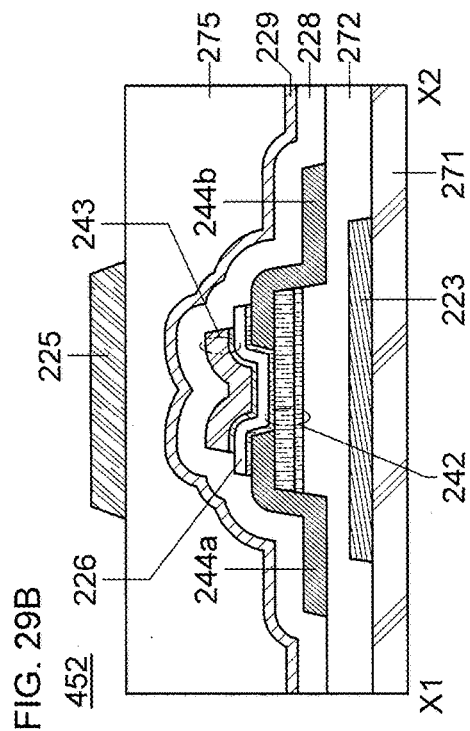

As in a transistor 452 illustrated in FIGS. 29A to 29C, an insulating layer 275 may be provided over the electrode 243, and a layer 225 may be provided over the insulating layer 275. FIG. 29A is a top view of the transistor 452. FIG. 29B is a cross-sectional view taken along the dashed-dotted line X1-X2 in FIG. 29A. FIG. 29C is a cross-sectional view taken along the dashed-dotted line Y1-Y2 in FIG. 29A.

Although the layer 225 is provided over the insulating layer 275 in FIGS. 29A to 29C, the layer 225 may be provided over the insulating layer 228 or 229. The layer 225 formed using a material with a light-blocking property can prevent a variation in characteristics, a decrease in reliability, or the like of the transistor caused by light irradiation. When the layer 225 is formed at least larger than the semiconductor layer 242b such that the semiconductor layer 242b is covered with the layer 225, the above effects can be improved. The layer 225 can be formed using an organic material, an inorganic material, or a metal material. In the case where the layer 225 is formed using a conductive material, voltage can be supplied to the layer 225 or the layer 225 may be brought into an electrically floating state.

Figure 30A:
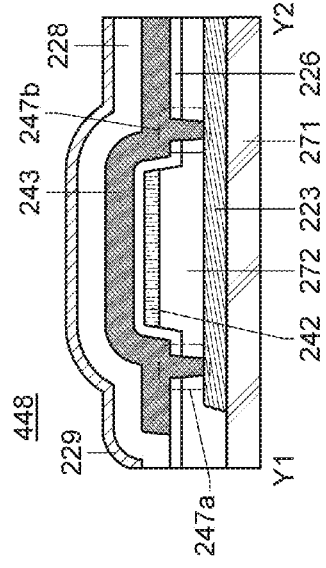
FIGS. 30A to 30C are a plan view and cross-sectional views illustrating one embodiment of a transistor.
Figure 30B:
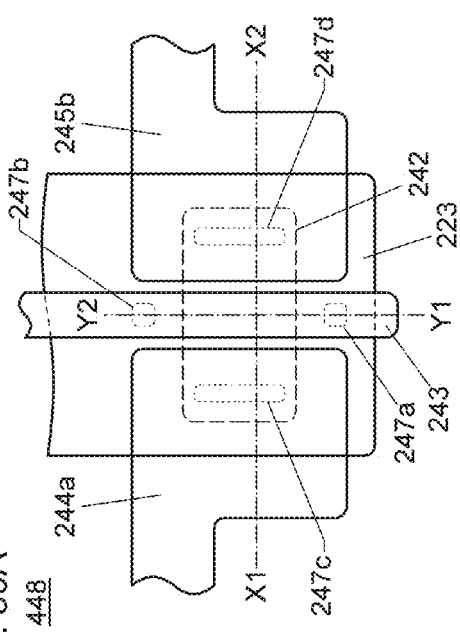
Figure 30C:
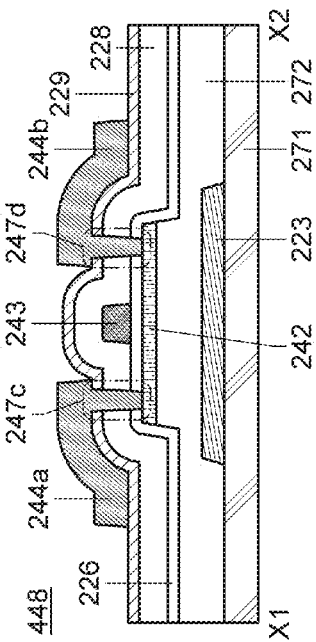

FIGS. 30A to 30C illustrate an example of a transistor with an s-channel structure. A transistor 448 illustrated in FIGS. 30A to 30C has almost the same structure as the transistor 447. In the transistor 448, the semiconductor layer 242 is formed over a projection of the insulating layer 272. The transistor 448 is a type of top-gate transistor including a back gate electrode. FIG. 30A is a top view of the transistor 448. FIG. 30B is a cross-sectional view taken along the dashed-dotted line X1-X2 in FIG. 30A. FIG. 30C is a cross-sectional view taken along the dashed-dotted line Y1-Y2 in FIG. 30A.

The electrode 244a provided over the insulating layer 229 is electrically connected to the semiconductor layer 242 through an opening 247c formed in the insulating layers 226, 228, and 229. The electrode 244b provided over the insulating layer 229 is electrically connected to the semiconductor layer 242 through an opening 247d formed in the insulating layers 226, 228, and 229.

The electrode 243 provided over the insulating layer 226 is electrically connected to the electrode 223 through an opening 247a and an opening 247b formed in the insulating layers 226 and 272. Accordingly, the same potential is supplied to the electrodes 246 and 223. Furthermore, either or both of the openings 247a and 247b may be omitted. In the case where both the openings 247a and 247b are omitted, different potentials can be supplied to the electrodes 223 and 246.

Note that the semiconductor layer in the transistor with an s-channel structure is not limited to include an oxide semiconductor.

This embodiment can be implemented in an appropriate combination with any of the structures described in the other embodiments.

Embodiment 5

<Composition of CAC-OS>

Described below is the composition of a cloud aligned complementary oxide semiconductor (CAC-OS) applicable to a transistor disclosed in one embodiment of the present invention.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS FET is a transistor including a metal oxide or an oxide semiconductor.

In this specification, a metal oxide in which regions functioning as a conductor and regions functioning as a dielectric are mixed and which functions as a semiconductor as a whole is defined as a CAC-OS or a CAC-metal oxide.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 0.5 nm and less than or equal to 3 nm, or a similar size. Note that in the following description of an oxide semiconductor, a state in which one or more elements are unevenly distributed and regions including the element(s) are mixed is referred to as a mosaic pattern or a patch-like pattern. The region has a size of greater than or equal to 0.5 nm and less than or equal to 10 nm, preferably greater than or equal to 0.5 nm and less than or equal to 3 nm, or a similar size.

The physical properties of a region including an unevenly distributed element are determined by the properties of the element. For example, a region including an unevenly distributed element which relatively tends to serve as an insulator among elements included in a metal oxide serves as a dielectric region. In contrast, a region including an unevenly distributed element which relatively tends to serve as a conductor among elements included in a metal oxide serves as a conductive region. A material in which conductive regions and dielectric regions are mixed to form a mosaic pattern serves as a semiconductor.

That is, a metal oxide in one embodiment of the present invention is a kind of matrix composite or metal matrix composite, in which materials having different physical properties are mixed.

Note that an oxide semiconductor preferably contains at least indium. In particular, indium and zinc are preferably contained. In addition, an element M (M is one or more of gallium, aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0), gallium zinc oxide ($Ga_{X4}Zn_{Y4}O_{Z4}$, where X4, Y4, and Z4 are real numbers greater than 0), or the like, and a mosaic pattern is formed. Then, $InO_{X1}$ and $In_{X2}Zn_{Y2}O_{Z2}$ forming the mosaic pattern are evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected element(s) as a main component(s) are observed in part of the CAC-OS and nanoparticle regions including In as a main component are observed in part thereof, and these nanoparticle regions are randomly dispersed to form a mosaic pattern in the CAC-OS.

<Analysis of CAC-OS>

Next, measurement results of an oxide semiconductor over a substrate by a variety of methods are described.

<<Structure of Samples and Formation Method Thereof>>

Nine samples of one embodiment of the present invention are described below. The samples are formed at different substrate temperatures and with different ratios of an oxygen gas flow rate in formation of the oxide semiconductor. Note that each sample includes a substrate and an oxide semiconductor over the substrate.

A method for forming the samples is described.

A glass substrate is used as the substrate. Over the glass substrate, a 100-nm-thick In—Ga—Zn oxide is formed as an oxide semiconductor with a sputtering apparatus. The formation conditions are as follows: the pressure in a chamber is 0.6 Pa, and an oxide target (with an atomic ratio of In:Ga:Zn=4:2:4.1) is used as a target. The oxide target provided in the sputtering apparatus is supplied with an AC power of 2500 W.

As for the conditions in the formation of the oxide of the nine samples, the substrate temperature is set to a temperature that is not increased by intentional heating (hereinafter such a temperature is also referred to as room temperature or R.T.), to 130° C., and to 170° C. The ratio of a flow rate of an oxygen gas to a flow rate of a mixed gas of Ar and oxygen (also referred to as an oxygen gas flow rate ratio) is set to 10%, 30%, and 100%.

<<Analysis by X-ray Diffraction>>

In this section, results of X-ray diffraction (XRD) measurement performed on the nine samples are described. As an XRD apparatus, D8 ADVANCE manufactured by Bruker AXS is used. The conditions are as follows: scanning is performed by an out-of-plane method at θ/2θ, the scanning range is 15 deg. to 50 deg., the step width is 0.02 deg., and the scanning speed is 3.0 deg./min.

Figure 38:
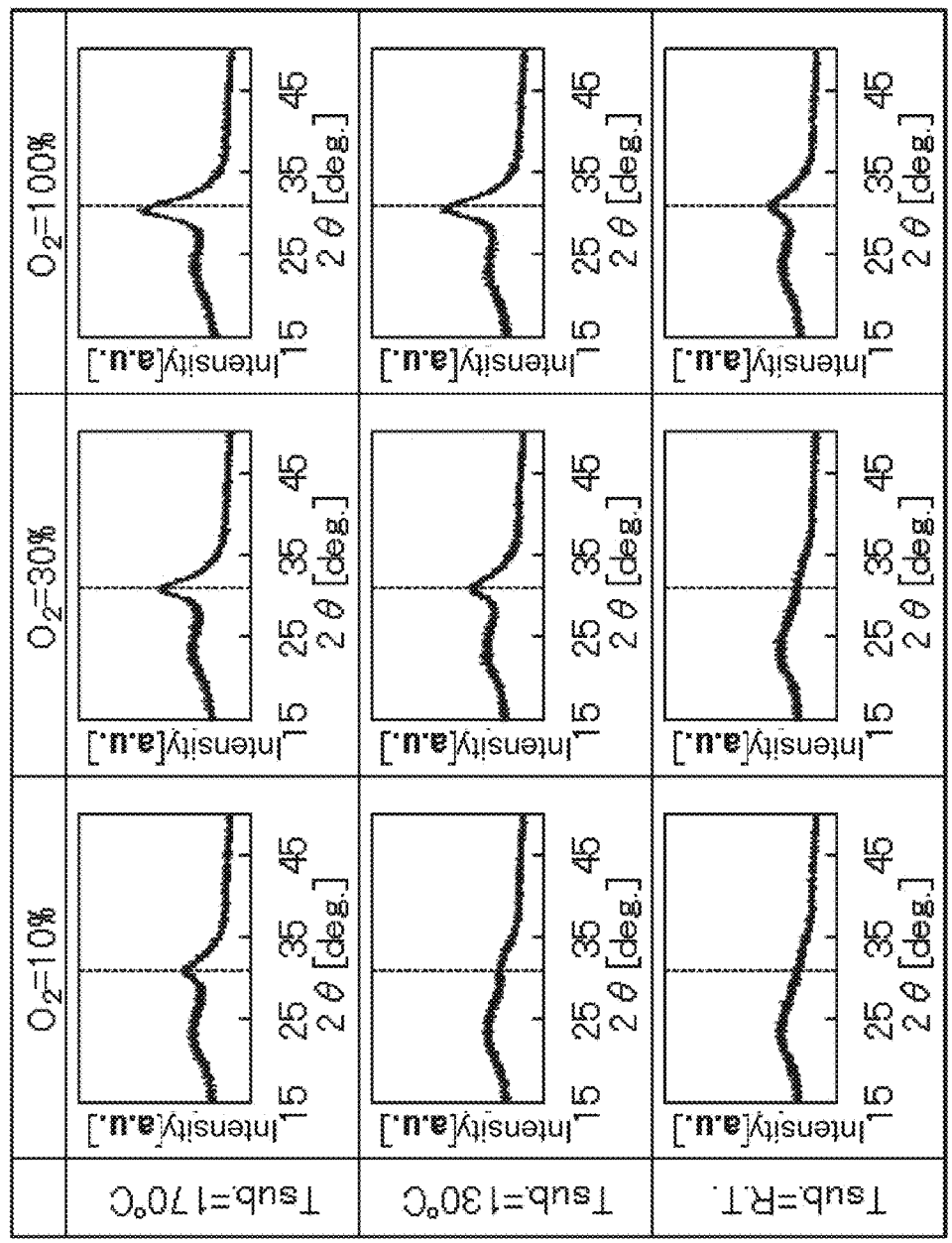
FIG. 38 shows measured XRD spectra of samples.

FIG. 38 shows XRD spectra measured by an out-of-plane method. In FIG. 38, the top row shows the measurement results of the samples formed at a substrate temperature of 170° C.; the middle row shows the measurement results of the samples formed at a substrate temperature of 130° C.; the bottom row shows the measurement results of the samples formed at a substrate temperature of R.T. The left column shows the measurement results of the samples formed with an oxygen gas flow rate ratio of 10%; the middle column shows the measurement results of the samples formed with an oxygen gas flow rate ratio of 30%; the right column shows the measurement results of the samples formed with an oxygen gas flow rate ratio of 100%.

In the XRD spectra shown in FIG. 38, the higher the substrate temperature at the time of formation is or the higher the oxygen gas flow rate ratio at the time of formation is, the higher the intensity of the peak at around 2θ=31° is. Note that it is found that the peak at around 2θ=31° is derived from a crystalline IGZO compound whose c-axes are aligned in a direction substantially perpendicular to a formation surface or a top surface of the crystalline IGZO compound (such a compound is also referred to as c-axis aligned crystalline (CAAC) IGZO).

As shown in the XRD spectra in FIG. 38, as the substrate temperature at the time of formation is lower or the oxygen gas flow rate ratio at the time of formation is lower, a peak becomes less clear. Accordingly, it is found that there are no alignment in the a-b plane direction and c-axis alignment in the measured areas of the samples that are formed at a lower substrate temperature or with a lower oxygen gas flow rate ratio.

<<Analysis with Electron Microscope>>

This section describes the observation and analysis results of the samples formed at a substrate temperature of R.T. and with an oxygen gas flow rate ratio of 10% with a high-angle annular dark-field scanning transmission electron microscope (HAADF-STEM). An image obtained with an HAADF-STEM is also referred to as a TEM image.

Described are the results of image analysis of plan-view images and cross-sectional images obtained with an HAADF-STEM (also referred to as plan-view TEM images and cross-sectional TEM images, respectively). The TEM images are observed with a spherical aberration corrector function. The HAADF-STEM images are obtained using an atomic resolution analytical electron microscope JEM-ARM200F manufactured by JEOL Ltd. under the following conditions: the acceleration voltage is 200 kV, and irradiation with an electron beam with a diameter of approximately 0.1 nm is performed.

FIG. 39A is a plan-view TEM image of the sample formed at a substrate temperature of R.T. and with an oxygen gas flow rate ratio of 10%. FIG. 39B is a cross-sectional TEM image of the sample formed at a substrate temperature of R.T. and with an oxygen gas flow rate ratio of 10%.

<<Analysis of Electron Diffraction Patterns>>

This section describes electron diffraction patterns obtained by irradiation of the sample formed at a substrate temperature of R.T. and an oxygen gas flow rate ratio of 10% with an electron beam with a probe diameter of 1 nm (also referred to as a nanobeam).

Electron diffraction patterns of points indicated by black dots a1, a2, a3, a4, and a5 in the plan-view TEM image in FIG. 39A of the sample formed at a substrate temperature of R.T. and an oxygen gas flow rate ratio of 10% are observed. Note that the electron diffraction patterns are observed while electron beam irradiation is performed at a constant rate for 35 seconds. FIGS. 39C, 39D, 39E, 39F, and 39G show the results of the points indicated by the black dots a1, a2, a3, a4, and a5, respectively.

In FIGS. 39C, 39D, 39E, 39F, and 39G, regions with high luminance in a circular (ring) pattern can be shown. Furthermore, a plurality of spots can be shown in a ring-like shape.

Electron diffraction patterns of points indicated by black dots b1, b2, b3, b4, and b5 in the cross-sectional TEM image in FIG. 39B of the sample formed at a substrate temperature of R.T. and an oxygen gas flow rate ratio of 10% are observed. FIGS. 39H, 39I, 39J, 39K, and 39L show the results of the points indicated by the black dots b1, b2, b3, b4, and b5, respectively.

In FIGS. 39H, 39I, 39J, 39K, and 39L, regions with high luminance in a ring pattern can be shown. Furthermore, a plurality of spots can be shown in a ring-like shape.

For example, when an electron beam with a probe diameter of 300 nm is incident on a CAAC-OS including an $InGaZnO_4$ crystal in a direction parallel to the sample surface, a diffraction pattern including a spot derived from the (009) plane of the $InGaZnO_4$ crystal is obtained. That is, the CAAC-OS has c-axis alignment and the c-axes are aligned in the direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. That is, it is found that the CAAC-OS has neither a-axis alignment nor b-axis alignment.

Furthermore, a diffraction pattern like a halo pattern is observed when an oxide semiconductor including a nanocrystal (a nanocrystalline oxide semiconductor (nc-OS)) is subjected to electron diffraction using an electron beam with a large probe diameter (e.g., 50 nm or larger). Meanwhile, bright spots are shown in a nanobeam electron diffraction pattern of the nc-OS obtained using an electron beam with a small probe diameter (e.g., smaller than 50 nm). Furthermore, in a nanobeam electron diffraction pattern of the nc-OS, regions with high luminance in a circular (ring) pattern are shown in some cases. Also in a nanobeam electron diffraction pattern of the nc-OS, a plurality of bright spots are shown in a ring-like shape in some cases.

The electron diffraction pattern of the sample formed at a substrate temperature of R.T. and with an oxygen gas flow rate ratio of 10% has regions with high luminance in a ring pattern and a plurality of bright spots appear in the ring-like pattern. Accordingly, the sample formed at a substrate temperature of R.T. and with an oxygen gas flow rate ratio of 10% exhibits an electron diffraction pattern similar to that of the nc-OS and does not show alignment in the plane direction and the cross-sectional direction.

According to what is described above, an oxide semiconductor formed at a low substrate temperature or with a low oxygen gas flow rate ratio is likely to have characteristics distinctly different from those of an oxide semiconductor film having an amorphous structure and an oxide semiconductor film having a single crystal structure.

<<Elementary Analysis>>

This section describes the analysis results of elements included in the sample formed at a substrate temperature of R.T. and with an oxygen gas flow rate ratio of 10%. For the analysis, by energy dispersive X-ray spectroscopy (EDX), EDX mapping images are obtained. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this embodiment, peaks of an EDX spectrum of the point are attributed to electron transition to the L shell in an In atom, electron transition to the K shell in a Ga atom, and electron transition to the K shell in a Zn atom and the K shell in an O atom, and the proportions of the atoms in the point are calculated. An EDX mapping image indicating distributions of proportions of atoms can be obtained through the process in an analysis target region of a sample.

Figure 40A:
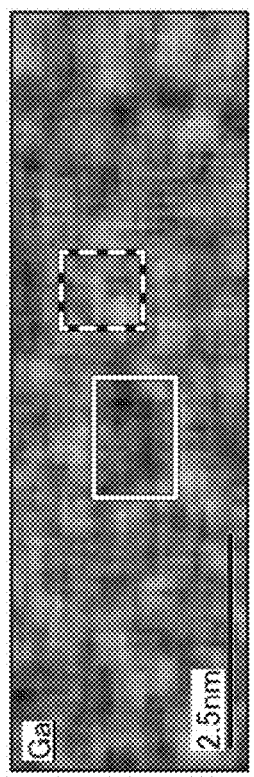
FIGS. 40A to 40C show EDX mapping images of a sample.
Figure 40B:
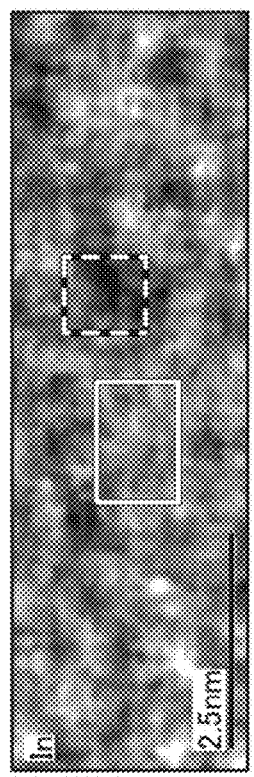
Figure 40C:
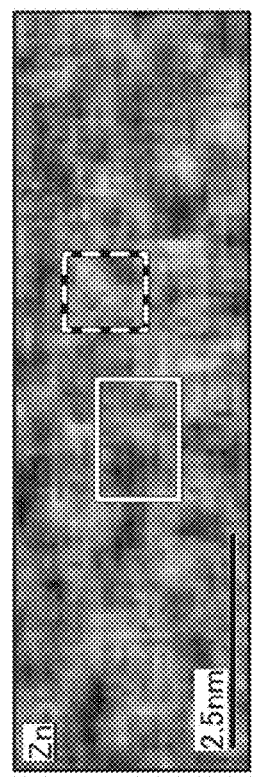

FIGS. 40A to 40C show EDX mapping images in a cross section of the sample formed at a substrate temperature of R.T. and with an oxygen gas flow rate ratio of 10%. FIG. 40A shows an EDX mapping image of Ga atoms. The proportion of the Ga atoms in all the atoms is 1.18 atomic % to 18.64 atomic %. FIG. 40B shows an EDX mapping image of In atoms. The proportion of the In atoms in all the atoms is 9.28 atomic % to 33.74 atomic %. FIG. 40C shows an EDX mapping image of Zn atoms. The proportion of the Zn atoms in all the atoms is 6.69 atomic % to 24.99 atomic %. FIGS. 40A to 40C show the same region in the cross section of the sample formed at a substrate temperature of R.T. and with an oxygen gas flow rate ratio of 10%. In the EDX mapping images, the proportion of an element is indicated by grayscale: the more measured atoms exist in a region, the brighter the region is; the less measured atoms exist in a region, the darker the region is. The magnification of the EDX mapping images in FIGS. 40A to 40C is 7200000 times.

The EDX mapping images in FIGS. 40A to 40C show relative distribution of brightness indicating that each element has a distribution in the sample formed at a substrate temperature of R.T. and with an oxygen gas flow rate ratio of 10%. Areas surrounded by solid lines and areas surrounded by dashed lines in FIGS. 40A to 40C are examined.

In FIG. 40A, a relatively dark region occupies a large area in the area surrounded by the solid line, while a relatively bright region occupies a large area in the area surrounded by the dashed line. In FIG. 40B, a relatively bright region occupies a large area in the area surrounded by the solid line, while a relatively dark region occupies a large area in the area surrounded by the dashed line.

That is, the areas surrounded by the solid lines are regions including a relatively large number of In atoms and the areas surrounded by the dashed lines are regions including a relatively small number of In atoms. In FIG. 40C, the right portion of the area surrounded by the solid line is relatively bright and the left portion thereof is relatively dark. Thus, the area surrounded by the solid line is a region including $In_{X2}Zn_{Y2}O_{Z2}$, $InO_{X1}$, and the like as main components.

The area surrounded by the solid line is a region including a relatively small number of Ga atoms and the area surrounded by the dashed line is a region including a relatively large number of Ga atoms. In FIG. 40C, the upper left portion of the area surrounded by the dashed line is relatively bright and the lower right portion thereof is relatively dark. Thus, the area surrounded by the dashed line is a region including $GaO_{X3}$, $Ga_{X4}Zn_{Y4}O_{Z4}$, and the like as main components.

Furthermore, as shown in FIGS. 40A to 40C, the In atoms are relatively more uniformly distributed than the Ga atoms, and regions including $InO_{X1}$ as a main component is seemingly joined to each other through a region including $In_{X2}Zn_{Y2}O_{Z2}$ as a main component. Thus, the regions including $In_{X2}Zn_{Y2}O_{Z2}$ and $InO_{X1}$ as main components extend like a cloud.

An In—Ga—Zn oxide having a composition in which the regions including $GaO_{X3}$ or the like as a main component and the regions including $In_{X2}Zn_{Y2}O_{Z2}$ or $InO_{X1}$ as a main component are unevenly distributed and mixed can be referred to as a CAC-OS.

The crystal structure of the CAC-OS includes an nc structure. In an electron diffraction pattern of the CAC-OS with the nc structure, several or more bright spots appear in addition to bright sports derived from IGZO including a single crystal, a polycrystal, or a CAAC. Alternatively, the crystal structure is defined as having high luminance regions appearing in a ring pattern in addition to the several or more bright spots.

As shown in FIGS. 40A to 40C, each of the regions including $GaO_{X3}$ or the like as a main component and the regions including $In_{X2}Zn_{Y2}O_{Z2}$ or $InO_{X1}$ as a main component has a size of greater than or equal to 0.5 nm and less than or equal to 10 nm, or greater than or equal to 1 nm and less than or equal to 3 nm. Note that it is preferable that a diameter of a region including each metal element as a main component be greater than or equal to 1 nm and less than or equal to 2 nm in the EDX mapping images.

As described above, the CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor exhibits. Accordingly, when regions including $In_{X2}Zn_{Y2}O_{Z2}$ or $InO_{X1}$ as a main component are distributed in an oxide semiconductor like a cloud, high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility ($\mu$) can be achieved.

A semiconductor element including a CAC-OS has high reliability. Thus, the CAC-OS is suitably used in a variety of semiconductor devices typified by a display.

Embodiment 6

In this embodiment, structure examples of a light-emitting element that can be used as the light-emitting element 125 will be described. Note that an EL layer 320 described in this embodiment corresponds to the EL layer 117 described in the other embodiments.

<Structure of Light-Emitting Element>

Figure 32A:
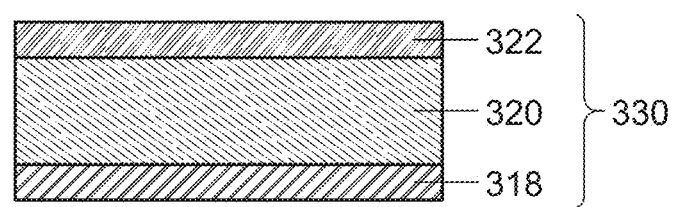
FIGS. 32A and 32B illustrate structure examples of light-emitting elements.

In a light-emitting element 330 illustrated in FIG. 32A, the EL layer 320 is sandwiched between a pair of electrodes (electrodes 318 and 322). The electrode 318, the electrode 322, and the EL layer 320 respectively correspond to the electrode 115, the electrode 118, and the EL layer 117 of the aforementioned Embodiments. Note that the electrode 318 is used as an anode and the electrode 322 is used as a cathode as an example in the following description of this embodiment.

The EL layer 320 includes at least a light-emitting layer and may have a stacked-layer structure including a functional layer other than the light-emitting layer. As the functional layer other than the light-emitting layer, a layer containing a substance having a high hole-injection property, a substance having a high hole-transport property, a substance having a high electron-transport property, a substance having a high electron-injection property, a bipolar substance (a substance having high electron and hole transport properties), or the like can be used. Specifically, functional layers such as a hole-injection layer, a hole-transport layer, an electron-transport layer, and an electron-injection layer can be used in appropriate combination.

The light-emitting element 330 illustrated in FIG. 32A emits light when current flows by applying a potential difference between the electrode 318 and the electrode 322 and holes and electrons are recombined in the EL layer 320. In other words, a light-emitting region is formed in the EL layer 320.

In one embodiment of the present invention, light emitted from the light-emitting element 330 is extracted to the outside from the electrode 318 side or the electrode 322 side. Thus, one of the electrodes 318 and 322 is formed using a light-transmitting substance.

Figure 32B:
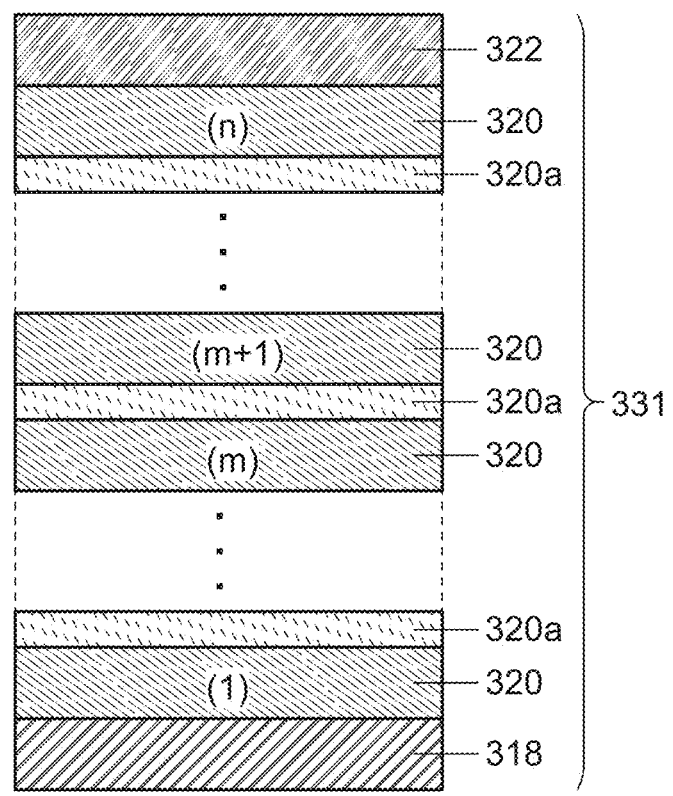

Note that a plurality of EL layers 320 may be stacked between the electrode 318 and the electrode 322 as in a light-emitting element 331 illustrated in FIG. 32B. In the case where n (n is a natural number of 2 or more) layers are stacked, an electric charge generation layer 320a is preferably provided between an m-th EL layer 320 and an (m+1)th EL layer 320. Note that m is a natural number greater than or equal to 1 and less than n. The components other than the electrode 318 and the electrode 322 correspond to the EL layer 117 of the aforementioned Embodiments.

The electric charge generation layer 320a can be formed using a composite material of an organic compound and a metal oxide. Examples of the metal oxide are vanadium oxide, molybdenum oxide, tungsten oxide, or the like. As the organic compound, a variety of compounds can be used; for example, an aromatic amine compound, a carbazole derivative, an aromatic hydrocarbon, and an oligomer, a dendrimer, and a polymer having a basic skeleton of these compounds can be used. Note that as the organic compound, it is preferable to use an organic compound that has a hole-transport property and has a hole mobility of $10^{-6}$ cm$^2$/Vs or higher. However, other substances may be used as long as their hole-transport properties are higher than their electron-transport properties. These materials used for the electric charge generation layer 320a have excellent carrier-injection properties and carrier-transport properties; thus, the light-emitting element 330 can be driven with low current and with low voltage. A material obtained by adding an alkali metal, an alkaline earth metal, a compound of the alkali metal, a compound of the alkaline earth metal, or the like to the composite material can be used in the electric charge generation layer 320a.

Note that the electric charge generation layer 320a may be formed by a combination of a composite material of an organic compound and a metal oxide with another material. For example, the electric charge generation layer 320a may be formed by a combination of a layer containing the composite material of an organic compound and a metal oxide with a layer containing one compound selected from electron-donating substances and a compound having a high electron-transport property. Furthermore, the electric charge generation layer 320a may be formed by a combination of a layer containing the composite material of an organic compound and a metal oxide with a transparent conductive film.

The light-emitting element 331 having such a structure is unlikely to result in energy transfer between the neighboring EL layer 320 and can easily realize high emission efficiency and a long lifetime. Furthermore, it is easy to obtain phosphorescence from one light-emitting layer and fluorescence from the other light-emitting layer.

The electric charge generation layer 320a has a function of injecting holes to one of the EL layers 320 that is in contact with the electric charge generation layer 320a and a function of injecting electrons to the other EL layer 320 that is in contact with the electric charge generation layer 320a, when voltage is applied to the electrodes 318 and 322.

The light-emitting element 331 illustrated in FIG. 32B can provide a variety of emission colors by changing the type of the light-emitting substance used for the EL layers 320. In addition, a plurality of light-emitting substances having different emission colors may be used as the light-emitting substances, so that light emission having a broad spectrum or white light emission can be obtained.

In the case of obtaining white light emission using the light-emitting element 331 in FIG. 32B, as for a combination of a plurality of EL layers, a structure for emitting white light including red light, blue light, and green light may be used. For example, the structure may include an EL layer containing a blue fluorescent substance as a light-emitting substance and an EL layer containing green and red phosphorescent substances as light-emitting substances. Alternatively, the structure may include an EL layer emitting red light, an EL layer emitting green light, and an EL layer emitting blue light. Further alternatively, with a structure including EL layers emitting light of complementary colors, white light emission can be obtained. In a stacked-layer element including two EL layers which emit lights with complementary colors, the combinations of colors are as follows: blue and yellow, blue-green and red, and the like.

Note that in the structure of the above stacked-layer element, by providing the electric charge generation layer between the stacked light-emitting layers, the element can give a high-luminance region at a low current density, and have a long lifetime.

This embodiment can be implemented in an appropriate combination with any of the structures described in the other embodiments.

At least part of this embodiment can be implemented in combination with any of the other embodiments described in this specification as appropriate.

Embodiment 7

In this embodiment, a display module using the display device of one embodiment of the present invention will be described with reference to FIG. 33.

Figure 33:
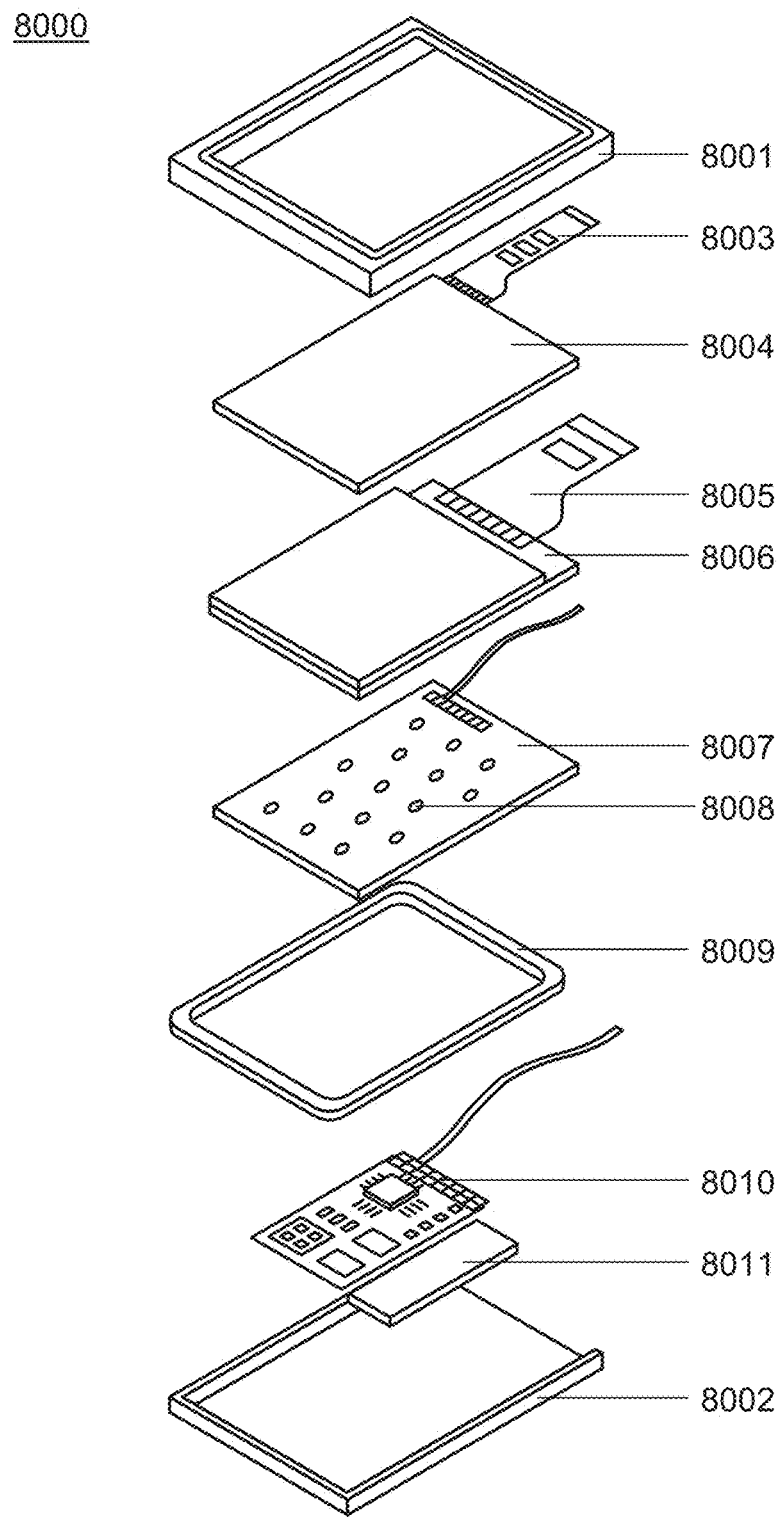
FIG. 33 illustrates a display module.

In a display module 8000 illustrated in FIG. 33, a touch sensor 8004 connected to an FPC 8003, a cell 8006 connected to an FPC 8005, a backlight unit 8007, a frame 8009, a printed board 8010, and a battery 8011 are provided between an upper cover 8001 and a lower cover 8002. At least one of the upper cover 8001, the lower cover 8002, the backlight unit 8007, the frame 8009, the printed board 8010, the battery 8011, the touch sensor 8004, and the like is not provided in some cases.

The display device of one embodiment of the present invention can be used for the cell 8006, for example.

The shapes and sizes of the upper cover 8001 and the lower cover 8002 can be changed as appropriate in accordance with the sizes of the touch sensor 8004 and the cell 8006.

The touch sensor 8004 can be a resistive touch sensor or a capacitive touch sensor and may be formed to overlap with the cell 8006. A counter substrate (sealing substrate) of the cell 8006 can have a touch sensor function. A photosensor may be provided in each pixel of the cell 8006 so that an optical touch sensor is obtained. An electrode for a touch sensor may be provided in each pixel of the cell 8006 so that a capacitive touch sensor is obtained.

The backlight unit 8007 includes a light source 8008. The light source 8008 may be provided at an end portion of the backlight unit 8007 and a light diffusing plate may be used. In the case where a display device including a light-emitting element and the like is used for the cell 8006, the backlight unit 8007 is not necessarily provided.

The frame 8009 may protect the cell 8006 and also function as an electromagnetic shield for blocking electromagnetic waves generated by the operation of the printed board 8010. The frame 8009 may function as a radiator plate.

The printed board 8010 has a power supply circuit and a signal processing circuit for outputting a video signal and a clock signal. As a power source for supplying power to the power supply circuit, an external power source or a power source using the battery 8011 provided separately may be used. The battery 8011 can be omitted in the case of using an external power source.

The display module 8000 can be additionally provided with a member such as a polarizing plate, a retardation plate, or a prism sheet.

This embodiment can be implemented in an appropriate combination with any of the structures described in the other embodiments.

Embodiment 8

In this embodiment, examples of an electronic device and a lighting device including the display device of one embodiment of the present invention will be described with reference to drawings.

Specific examples of the electronic device that uses the display device of one embodiment of the present invention are as follows: display devices of televisions, monitors, and the like, lighting devices, desktop and laptop personal computers, word processors, image reproduction devices which reproduce still images and moving images stored in recording media such as digital versatile discs (DVDs), portable CD players, radios, tape recorders, headphone stereos, stereos, table clocks, wall clocks, cordless phone handsets, transceivers, mobile phones, car phones, portable game machines, tablet terminals, large game machines such as pachinko machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as a chain saw, smoke detectors, and medical equipment such as dialyzers. Other examples are as follows: industrial equipment such as guide lights, traffic lights, conveyor belts, elevators, escalators, industrial robots, power storage systems, and power storage devices for leveling the amount of power supply and smart grid. In addition, moving objects and the like driven by electric motors using power from a power storage unit are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

In particular, as examples of electronic devices including a display device with flexibility, the following can be given: television devices (also referred to as televisions or television receivers), monitors of computers or the like, digital cameras, digital video cameras, digital photo frames, mobile phones (also referred to as cellular phones or mobile phone devices), portable game machines, portable information terminals, audio reproducing devices, large game machines such as pachinko machines, and the like.

In addition, a lighting device or a display device can be incorporated along a curved inside/outside wall surface of a house or a building or a curved interior/exterior surface of a car.

Figure 34A:
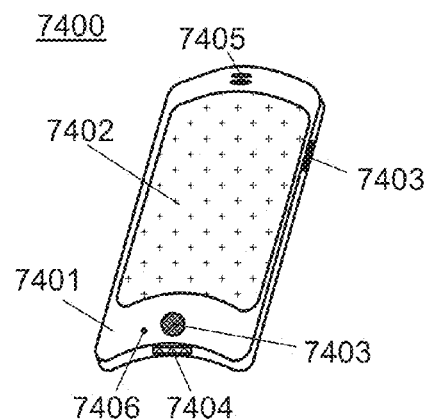
FIGS. 34A to 34E illustrate examples of electronic devices and lighting devices.

FIG. 34A is an example of a mobile phone. A mobile phone 7400 includes a display portion 7402 that is incorporated in a housing 7401. The mobile phone 7400 further includes operation buttons 7403, an external connection port 7404, a speaker 7405, a microphone 7406, and the like. The mobile phone 7400 is manufactured using the display device for the display portion 7402.

When the display portion 7402 is touched with a finger or the like, data can be input into the mobile phone 7400 in FIG. 34A. Furthermore, operations such as making a call and inputting a letter can be performed by touch on the display portion 7402 with a finger or the like.

With the operation buttons 7403, power ON/OFF can be switched. In addition, types of images displayed on the display portion 7402 can be switched; for example, switching images from a mail creation screen to a main menu screen.

Here, the display portion 7402 includes the display device of one embodiment of the present invention. Thus, the mobile phone can have a curved display portion and high reliability.

Figure 34B:
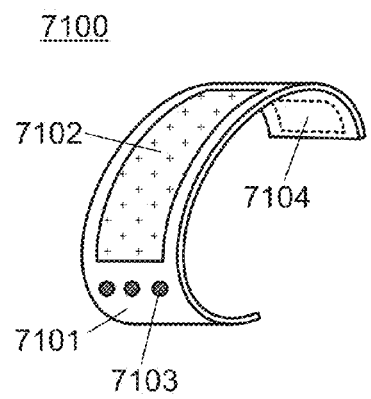

FIG. 34B is an example of a wristband-type display device. A portable display device 7100 includes a housing 7101, a display portion 7102, operation buttons 7103, and a transceiver 7104.

The portable display device 7100 can receive a video signal with the transceiver 7104 and can display the received video on the display portion 7102. In addition, with the transceiver 7104, the portable display device 7100 can send an audio signal to another receiving device.

With the operation button 7103, power ON/OFF, switching displayed videos, adjusting volume, and the like can be performed.

Here, the display portion 7102 includes the display device of one embodiment of the present invention. Thus, the portable display device can have a curved display portion and high reliability.

Figure 34C:
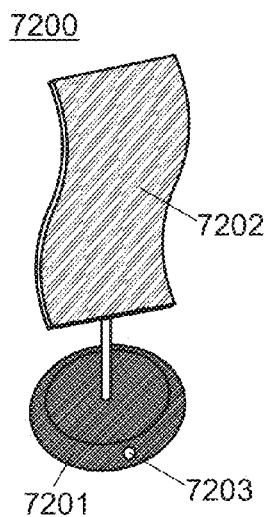
Figure 34D:
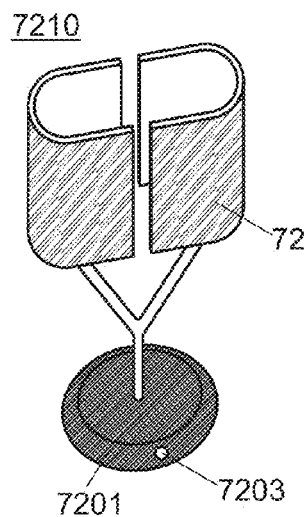
Figure 34E:
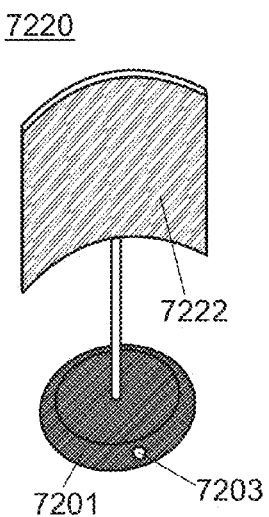

FIGS. 34C to 34E show examples of lighting devices. Lighting devices 7200, 7210, and 7220 each include a stage 7201 provided with an operation switch 7203 and a light-emitting portion supported by the stage 7201.

The lighting device 7200 illustrated in FIG. 34C includes a light-emitting portion 7202 with a wave-shaped light-emitting surface and thus is a good-design lighting device.

A light-emitting portion 7212 included in the lighting device 7210 illustrated in FIG. 34D has two convex-curved light-emitting portions symmetrically placed. Thus, light radiates from the lighting device 7210 in all directions.

The lighting device 7220 illustrated in FIG. 34E includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 is flexible; thus, the light-emitting portion can be fixed on a plastic member, a movable frame, or the like so that an emission surface of the light-emitting portion can be curved freely depending on the intended use.

The light-emitting portions included in the lighting devices 7200, 7210, and 7220 each include the display device of one embodiment of the present invention. Thus, the light-emitting portions can be curved or bent into any shape and the lighting devices can have high reliability.

Figure 35A:
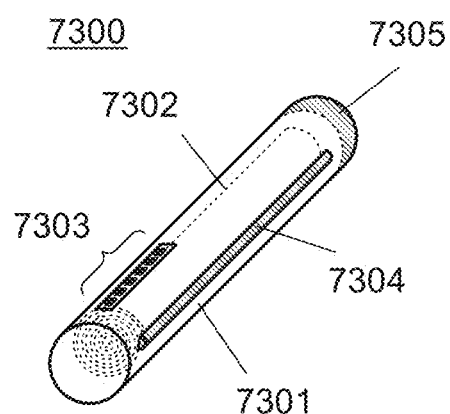
FIGS. 35A and 35B illustrate an example of an electronic device.

FIG. 35A shows an example of a portable display device. A display device 7300 includes a housing 7301, a display portion 7302, operation buttons 7303, a display portion pull 7304, and a control portion 7305.

The display device 7300 includes the rolled flexible display portion 7302 in the cylindrical housing 7301.

The display device 7300 can receive a video signal with the control portion 7305 and can display the received video on the display portion 7302. In addition, a power storage device is included in the control portion 7305. Moreover, a connector may be included in the control portion 7305 so that a video signal or power can be supplied directly.

With the operation buttons 7303, power ON/OFF, switching of displayed videos, and the like can be performed.

Figure 35B:
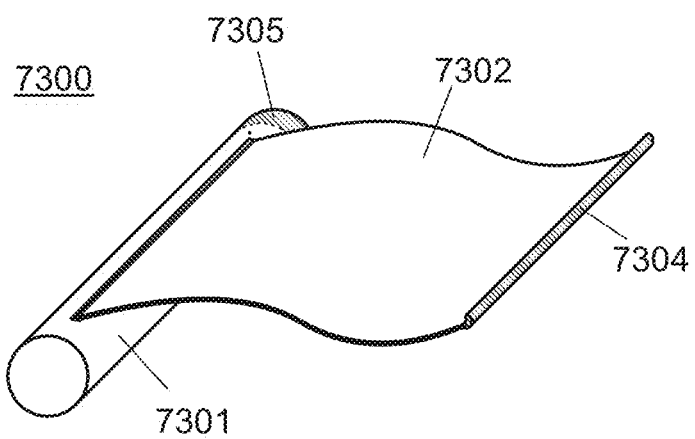

FIG. 35B illustrates a state where the display portion 7302 is pulled out with the display portion pull 7304. Videos can be displayed on the display portion 7302 in this state. Furthermore, the operation buttons 7303 on the surface of the housing 7301 allow one-handed operation.

Note that a reinforcement frame may be provided for an edge portion of the display portion 7302 in order to prevent the display portion 7302 from being curved when pulled out.

Note that in addition to this structure, a speaker may be provided for the housing so that sound is output with an audio signal received together with a video signal.

The display portion 7302 includes the display device of one embodiment of the present invention. Thus, the display portion 7302 is a display device which is flexible and highly reliable, which makes the display device 7300 lightweight and highly reliable.

Figure 36A:
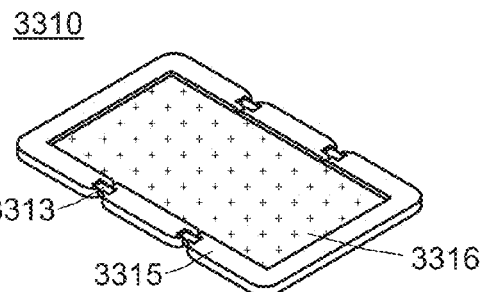
FIGS. 36A to 36I illustrate examples of electronic devices.
Figure 36B:
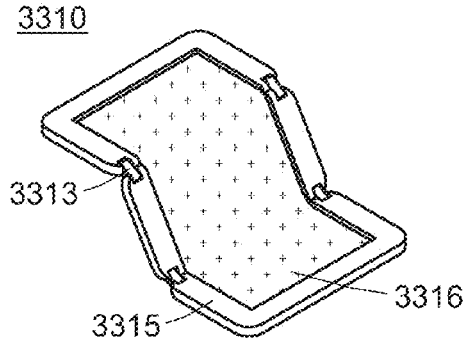
Figure 36C:
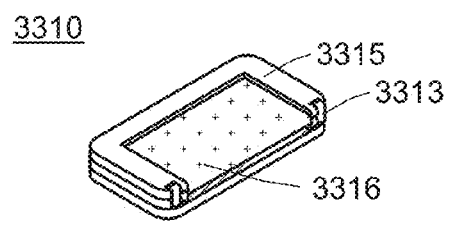

FIGS. 36A to 36C illustrate a foldable portable information terminal 3310. FIG. 36A illustrates the portable information terminal 3310 that is opened. FIG. 36B illustrates the portable information terminal 3310 that is being opened or being folded. FIG. 36C illustrates the portable information terminal 3310 that is folded. The portable information terminal 3310 is highly portable when folded. The portable information terminal 3310 is highly browsable when opened because of its seamless large display region.

A display panel 3316 is supported by three housings 3315 joined together by hinges 3313. By folding the portable information terminal 3310 at a connection portion between two housings 3315 with the hinges 3313, the portable information terminal 3310 can be reversibly changed in shape from an opened state to a folded state. A light-emitting device of one embodiment of the present invention can be used for the display panel 3316. For example, a light-emitting device that can be bent with a radius of curvature of greater than or equal to 1 mm and less than or equal to 150 mm can be used.

Figure 36D:
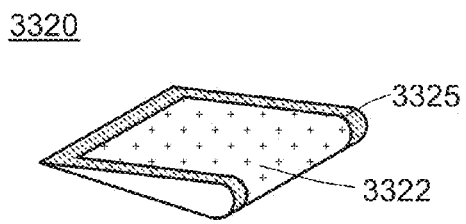
Figure 36E:
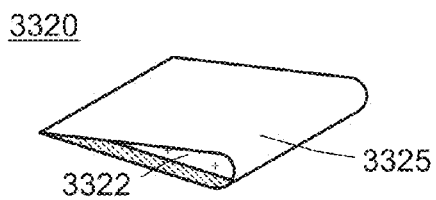

FIGS. 36D and 36E each illustrate a foldable portable information terminal 3320. FIG. 36D illustrates the portable information terminal 3320 that is folded so that a display portion 3322 is on the outside. FIG. 36E illustrates the portable information terminal 3320 that is folded so that the display portion 3322 is on the inside. When the portable information terminal 3320 is not used, the portable information terminal 3320 is folded so that a non-display portion 3325 faces the outside, whereby the display portion 3322 can be prevented from being contaminated or damaged. A light-emitting device of one embodiment of the present invention can be used for the display portion 3322.

Figure 36F:
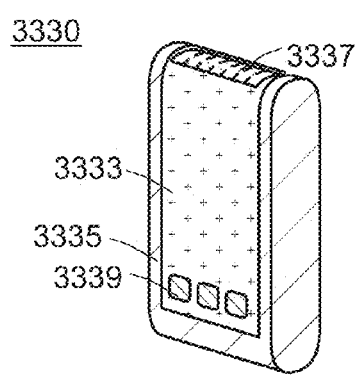
Figure 36G:
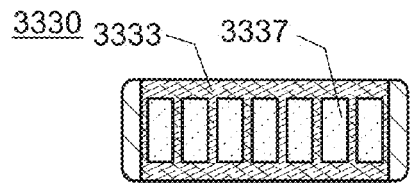
Figure 36H:
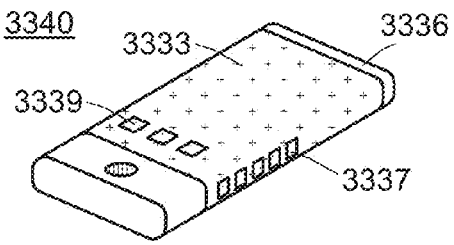

FIG. 36F is a perspective view illustrating an external shape of the portable information terminal 3330. FIG. 36G is a top view of the portable information terminal 3330. FIG. 36H is a perspective view illustrating an external shape of a portable information terminal 3340.

The portable information terminals 3330 and 3340 each function as, for example, one or more of a telephone set, a notebook, an information browsing system, and the like. Specifically, the portable information terminals 3330 and 3340 each can be used as a smartphone.

The portable information terminals 3330 and 3340 can display characters and image information on its plurality of surfaces. For example, three operation buttons 3339 can be displayed on one surface (FIGS. 36F and 36H). In addition, information 3337 indicated by dashed rectangles can be displayed on another surface (FIGS. 36G and 36H). Examples of the information 3337 include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation buttons 3339, an icon, or the like may be displayed in place of the information 3337. Although FIGS. 36F and 36G illustrate an example in which the information 3337 is displayed at the top, one embodiment of the present invention is not limited thereto.

For example, the information may be displayed on the side as in the portable information terminal 3340 in FIG. 36H.

For example, a user of the portable information terminal 3330 can see the display (here, the information 3337) with the portable information terminal 3330 put in a breast pocket of his/her clothes.

Specifically, a caller's phone number, name, or the like of an incoming call is displayed in a position that can be seen from above the portable information terminal 3330. Thus, the user can see the display without taking out the portable information terminal 3330 from the pocket and decide whether to answer the call.

A light-emitting device of one embodiment of the present invention can be used for a display portion 3333 mounted in each of a housing 3335 of the portable information terminal 3330 and a housing 3336 of the portable information terminal 3340. One embodiment of the present invention makes it possible to provide a highly reliable touch panel having a curved display portion.

Figure 36I:
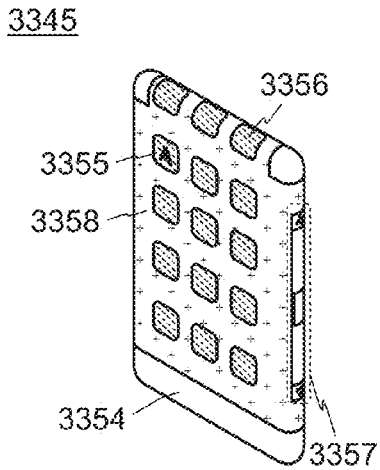

As in a portable information terminal 3345 illustrated in FIG. 36I, information may be displayed on three or more surfaces. Here, information 3355, information 3356, and information 3357 are displayed on different surfaces.

For a display portion 3358 included in a housing 3354 of the portable information terminal 3345, a light-emitting device of one embodiment of the present invention can be used. One embodiment of the present invention makes it possible to provide a highly reliable touch panel having a curved display portion.

Figure 37A:
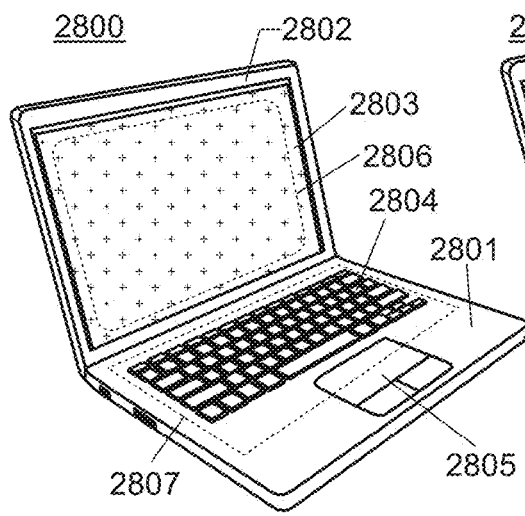
FIGS. 37A to 37E illustrate an example of an electronic device.
Figure 37B:
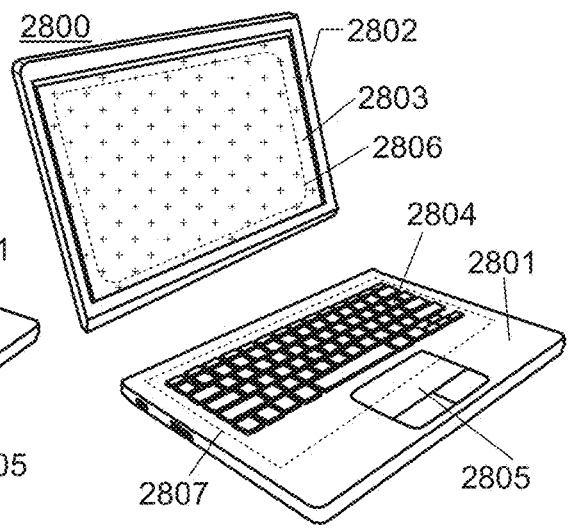

A personal computer 2800 illustrated in FIG. 37A includes a housing 2801, a housing 2802, a display portion 2803, a keyboard 2804, a pointing device 2805, and the like. A battery 2806 is provided inside the housing 2801 and a battery 2807 is provided inside the housing 2802. A touch panel is used for the display portion 2803. As illustrated in FIG. 37B, the housing 2801 and the housing 2802 of the personal computer 2800 can be separated and the housing 2802 can be used alone as a tablet terminal.

Figure 37C:
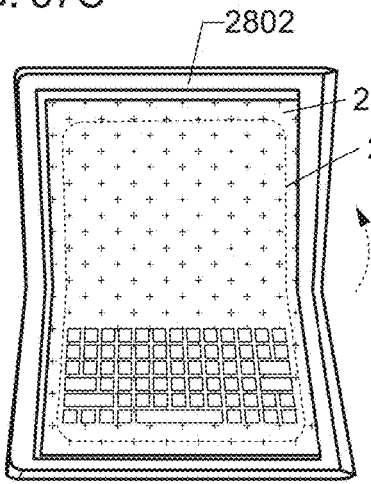

A flexible display is used for the display portion 2803 of the housing 2802. Furthermore, a battery that can be bent and stretched is used as the battery 2807. Thus, as illustrated in FIG. 37C, the personal computer 2800 can be used while the housing 2802 is being bent. In that case, part of the display portion 2803 can be used as a keyboard as illustrated in FIG. 37C.

Figure 37D:
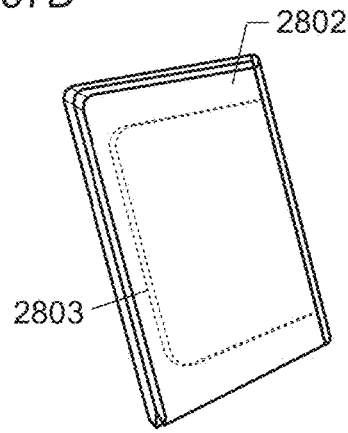
Figure 37E:
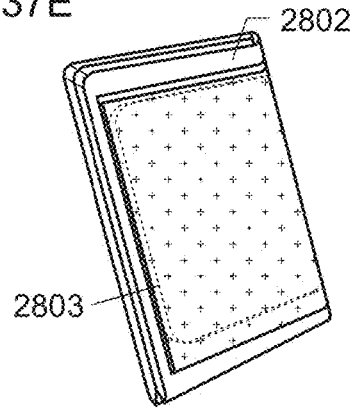

Furthermore, the housing 2802 can be folded such that the display portion 2803 is on the inside as illustrated in FIG. 37D and such that the display portion 2803 is on the outside as illustrated in FIG. 37E.

This embodiment can be implemented in an appropriate combination with any of the structures described in the other embodiments.

Note that content (or may be part of the content) described in one embodiment may be applied to, combined with, or replaced by different content (or may be part of the different content) described in the embodiment and/or content (or may be part of the content) described in one or more different embodiments.

Note that in each embodiment, content described in the embodiment is content described with reference to a variety of diagrams or content described with a text described in the specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in another embodiment or other embodiments, much more diagrams can be formed.

Note that in the case where at least one specific example is described in a diagram or a text described in one embodiment in this specification and the like, it is readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the present invention is clear.

Note that in this specification and the like, a content described in at least a diagram (which may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the present invention is clear.

This application is based on Japanese Patent Application serial No. 2015-149188 filed with Japan Patent Office on Jul. 29, 2015 and serial No. 2016-120176 filed with Japan Patent Office on Jun. 16, 2016, the entire contents of which are hereby incorporated by reference.

What is claimed is:

1. A method for manufacturing a display device comprising a display region, comprising first to seventh processes, wherein the first process comprises:
a step of providing a first layer over a first surface of a first substrate;
a step of providing a first insulating layer over the first layer;
a step of providing an electrode over the first insulating layer;
a step of providing a second insulating layer over the electrode;
a step of removing a part of the second insulating layer to provide a first opening; and
a step of providing a display element and a second layer over the second insulating layer,
wherein the second process comprises:
a step of providing a third layer over a second surface of a second substrate;
a step of providing a third insulating layer over the third layer; and
a step of removing a part of the third layer and a part of the third insulating layer to provide a second opening,
wherein the third process comprises a step of overlapping the first substrate and the second substrate with a bonding layer positioned therebetween such that the first surface and the second surface face each other and the first opening and the second opening have an overlap region,
wherein the fourth process comprises a step of separating the first substrate and the first layer from the first insulating layer,
wherein the fifth process comprises a step of providing a third substrate such that the first insulating layer and the third substrate overlap with each other, wherein the sixth process comprises a step of separating the second substrate and the third layer from the third insulating layer, wherein the seventh process comprises a step of providing a fourth substrate such that the third insulating layer and the fourth substrate overlap with each other, wherein in the first process, the electrode and the second layer are provided at least partly in contact with each other, wherein in the second process, a top surface shape of the second opening is a polygon having a first corner portion and a second corner portion, and an angle of each of the first corner portion and the second corner portion is larger than or equal to 30° and smaller than or equal to 150°, wherein in the third process, the bonding layer comprises a first region overlapping with the second opening, and the second layer comprises a second region overlapping with the second opening, wherein in the fourth process, at least a part of the first region of the bonding layer, at least a part of the second region of the second layer, and the second substrate are separated from the first substrate, wherein in the sixth process, separation of the second substrate proceeds in a same direction as separation of at least the part of the first region of the bonding layer and at least the part of the second region of the second layer which starts at an end portion of the first corner portion and terminates at an end portion of the second corner portion, and wherein in the sixth process, at least a part of the electrode is exposed.

2. The method for manufacturing a display device, according to claim 1, wherein in the second process, a top surface shape of the second opening is a parallelogram or hexagon having the first corner portion and the second corner portion, and wherein in the sixth process, separation of the second substrate proceeds in a direction substantially parallel to a long side of the top surface shape of the second opening.

3. The method for manufacturing a display device, according to claim 1, wherein the second layer is a stacked layer of an EL layer and a conductive layer.

4. The method for manufacturing a display device, according to claim 1, wherein each of the first substrate and the second substrate is a glass substrate, a quartz substrate, a sapphire substrate, a ceramic substrate, a metal substrate, a semiconductor substrate, or a plastic substrate.

5. The method for manufacturing a display device, according to claim 1, wherein the third substrate and the fourth substrate have flexibility.

6. The method for manufacturing a display device, according to claim 1, wherein each of the first layer and the third layer comprises tungsten, molybdenum, titanium, tantalum, niobium, nickel, cobalt, zirconium, ruthenium, rhodium, palladium, osmium, iridium, or silicon.

7. The method for manufacturing a display device, according to claim 1, wherein the display element is a light-emitting element.

8. A method for manufacturing an electronic device comprising a display device and a battery, a touch sensor, or a housing, wherein the display device is manufactured by the method according to claim 1.

* * * * *